United States Patent [19]

Kawakubo et al.

[11] Patent Number: 5,682,041
[45] Date of Patent: Oct. 28, 1997

[54] ELECTRONIC PART INCORPORATING ARTIFICIAL SUPER LATTICE

[75] Inventors: Takashi Kawakubo; Hideo Hirayama, both of Yokohama; Kenya Sano, Kawasaki; Michihiro Oose, Kawasaki; Junsei Tsutsumi, Yokohama, all of Japan

[73] Assignee: Kabushiki Kaisha Toshiba, Kanagawa-ken, Japan

[21] Appl. No.: 651,661

[22] Filed: May 21, 1996

Related U.S. Application Data

[63] Continuation of Ser. No. 119,679, Sep. 13, 1993, abandoned.

[30] Foreign Application Priority Data

Sep. 14, 1992 [JP] Japan ............................ 4-245120
Mar. 15, 1993 [JP] Japan ............................ 5-054017

[51] Int. Cl.⁶ ................... H01L 29/06; H01L 31/0328; H01L 31/0336
[52] U.S. Cl. ................... 257/38; 257/22; 257/23; 257/25
[58] Field of Search ................... 257/20, 22, 23, 257/24, 25, 28

[56] References Cited

U.S. PATENT DOCUMENTS

4,665,412  5/1987  Ohkawa et al. ............... 257/28
5,317,187  5/1994  Hindman et al. ............. 257/764

OTHER PUBLICATIONS

K. Iijima et al., "Formation and Structures of NiO–ZnO Artificial Super–Lattices," J. of Crystal Grown, vol. 95, No. 1–4, Feb. 1989, pp. 505–508.

J.E. Sundgren, "New Trends in Hard Coatings Grown from the Vapour Phase: Alloy Nitrides and Transition Metal Nitride Superlattices," CIP G87:6EME Collogue International Sur Les Plasmas Et La Pulverisation Cathodique Et 4EME Symposium International Sur La Gravure Seche Et Le Depot Plasma Et Microelectronique, No. 237, 1 Jun. 1987, Antibes, France, pp. 23–27.

K. Kubota et al., "Preparation and Properties of III–V Nitride Thin Films," Journal of Applied Physics, vol. 66, No. 7, Oct. 1, 1989, New York, USA, pp. 2984–2988, XP 72397.

"Negative differential resistance in AlAs/NiAl/AlAs heterostructures: Evidence for size quantization in metals", Tabatabaie et al., Appl. Phys. Lett., vol. 53, No. 25, pp. 2528–2530, Dec. 1988.

(List continued on next page.)

*Primary Examiner*—Ngân V. Ngô
*Attorney, Agent, or Firm*—Finnegan, Henderson, Farabow, Garrett & Dunner, L.L.P.

[57] ABSTRACT

An electronic part is disclosed which is furnished with an artificial super lattice obtained by alternately superposing a substance of good conductivity formed of a compound between one element selected from among the elements belonging to the transition elements of Groups 3A to 6A and the rare earth elements and an element selected from among boron, carbon, nitrogen, phosphorus, selenium, and tellurium or a compound between oxygen and a transition metal element selected from among the elements of Group 7A and Group 8 and an insulating substance formed of a compound between a simple metal element selected from among the elements belonging to Group 1A, Group 2A, and Groups 1B to 4B and an element selected from among carbon, nitrogen, oxygen, phosphorus, sulfur, selenium, tellurium, and halogen elements in thicknesses fit for obtaining a quantum size effect. The artificial super lattice possesses a barrier layer formed of an insulating substance and an electrode layer formed of a substance of good conductivity and disposed in contact with the barrier layers.

22 Claims, 44 Drawing Sheets

STRUCTURE

OTHER PUBLICATIONS

"Negative Differential Resistance in Metal($CoSi_2$)/Insulator($CaF_2$) Resonant Tunneling Diode", Watanabe et al., Lecture No. 28a-T-5, 38th spring meeting of The Japanese Society of applied physics, p. 1107, 1991.

"Epitaxial Growth of Metal ($CoSi_2$)/Insulator ($CaF_2$) Nanometer-Thick Layered Structure on Si(111)", Watanabe et al., Jpn. J. Appl. Phys., vol. 31, Part 2, No. 2A, pp. L116-L118, Feb. 1992.

"Transistor Action of Metal ($CoSi_2$)/Insulator ($CaF_2$) Hot Electron Transistor Structure", Muratake et al., Electronics Letters, vol. 28, No. 11, pp. 1002-1004, May 1992.

"Growth of epitaxial aluminum nitride and aluminum nitride/zirconium nitride superlattices on Si(111)", Meng et al., J. Vac. Sci. Technol. A, vol. 10, No. 4, pp. 1610-1617, Jul./Aug. 1992.

FIG. 3

FIG. 23(a)    FIG. 23(b)    FIG. 23(c)
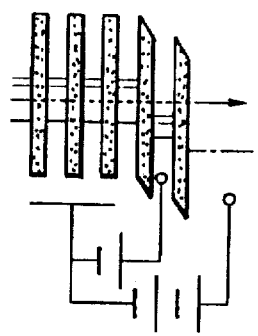 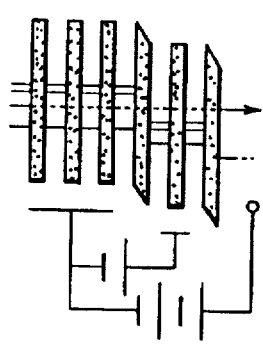 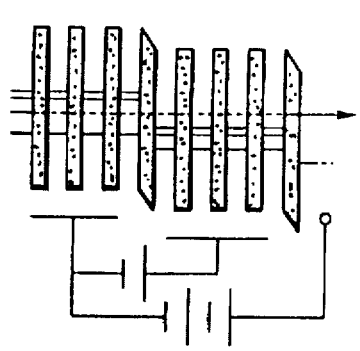
FIG. 24(a)    FIG. 24(b)    FIG. 24(c)
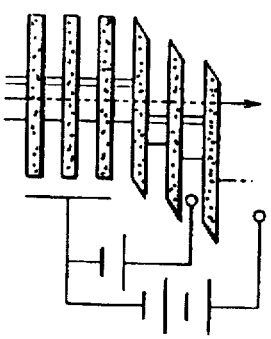 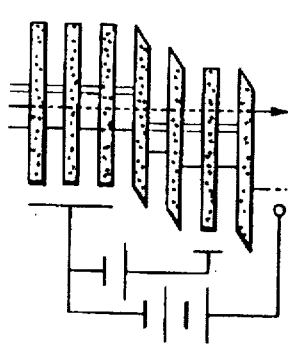 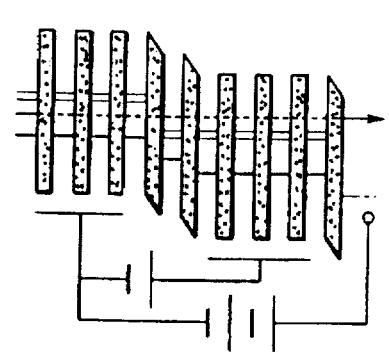

STRUCTURE

POTENSIAL STERUCTURE (CURRENT-VOLTAGE CHARACTERISTICS OF VACUUM EMITTER ELEMENT)

ELECTRONIC PART INCORPORATING ARTIFICIAL SUPER LATTICE

This application is a continuation of application Ser. No. 08/119,679, filed Sep. 13, 1993, now abandoned.

BACKGROUND OF THE INVENTION

1. Field of the Invention

This invention relates to an electronic part using an artificial super lattice adapted to manifest two-dimensional conductivity for electrons.

2. Description of the Related Art

According to the quantum theory, the hetero-superlattice structure obtained by causing substances differing in energy band structure to be superposed on the order not exceeding the de Broglie wavelength ($\lambda_d$) manifests various quantum-mechanical effects. FIG. 61 is a diagram illustrating with a model a quantum effect which is manifested when semiconductors differing in energy barrier height are joined by heterojunction. A tunnel effect manifests itself when the width of a substance of a large barrier height decreases below about $\lambda_d$. A quantum well level is formed when the width of a substance of a small barrier height decreases below about $\lambda_d$. A miniband is formed when the widths of the two substances mentioned above both decrease. Use of the miniband brings about various advantages inclusive of a resonant tunnelling effect. Various studies are now under way in search of methods for harnessing these beneficial effects.

As materials fit for the purpose of realizing these hetero-superlattice structures, sets of semiconductors and particularly sets of compound semiconductors have been copiously employed. The popular use of these sets of semiconductors is ascribed not only to such physical features as great de Broglie wavelength of electrons in compound semiconductors and great scattering length but also to the crystallographic feature that the use of alloy semiconductors provides a combination of semiconductors identical in crystal system and lattice constant and different in barrier height. It is equally ascribable to the fact that as film deposition processes, such techniques as the molecular beam epitaxy method (MBE), the chemical vapor deposition method (MOCVD) using an organometallic compound, and the gas source MBE method have been fully developed and put to use.

Even the metal/semiconductor and metal/insulator combinations in addition to the aforementioned sets of semiconductors and the semiconductor/insulator combinations involving use of a semiconductor of a large band gap are expected to be basically as effective as the sets of semiconductors illustrated in FIG. 61. When a metal is used as a source of conduction electrons, however, the advantage that a large volume of current can be passed at a high speed is derived from the fact that the number of carriers is large and the resistance is small and, meanwhile, the necessity for effecting superposition of layers at a very minute cycle on the order of 1 nanometer arises from the fact that the de Broglie wavelength is small. Further, the largeness of the number of carriers entails the disadvantage that the product of superposition forms a two-dimensional electron system only with difficulty. The most difficult problem resides in the development of a film deposition process which enables a metal and a semiconductor or an insulator to be alternately superposed on the order of nanometer. The metal and the semiconductor or the insulator are different in crystal system, lattice constant, surface energy, etc. More often than not, the combination exhibits inferior wettability. Thus, the combination permits alternate stratified growth of the components only with great difficulty. Owing further to the thermodynamic instability, it has been impracticable to form a film of the combination at an elevated temperature for the sake of improving the quality of film.

In spite of these persistent difficulties, researches have been pursued on such combinations of metals and semiconductors as promise fair affinity mainly from the standpoint of coincidence of lattice constant. For example, N. Tabatabaie et al. of Belcore formed a GaAs/AlAs (2 nm)/NiAl (3.3 nm)/AlAs (2 nm)/GaAs structure by the MBE method, manufactured a hot electron diode with the structure, and tested this diode for electrical properties to obtain evidence showing the unprecedented formation of a miniband due to the quantum effect in the NiAl film which is one kind of intermetallic compound [Appl. Phys. Lett. 53, 2528 (1988)].

The metal/insulator combinations are allowed to utilize high barriers inherent in insulators and enjoy an expansion of the range of combinations. The film deposition technique for these combinations, however, is appreciably difficult as compared with that for the metal/semiconductor combinations. Asada et al. of Tokyo Institute of Technology manufactured a superlattice structure with the combination of $CaF_2$ (10 nm)/$CoSi_2$ (1.9 nm)/$CaF_2$ (0.9 nm)/$CoSi_2$ (2.5 nm)/$CaF_2$ (0.9 nm)/n-Si (111) and observed the unprecedented quantum effect with a metal/insulator superlattice (Lecture No. 28 a-T-5 presented at the 38 th spring meeting The Japan Society of applied physics and related society in 1991). Since the set of $CoSi_2$ and $CaF_2$ suffers from inferior wettability, the component $CoSi_2$ coheres and fails to grow flatly at a substrate temperature of not lower than 500° C. which is necessary for crystallization and growth of the other component $CaF_2$. Thus, they managed to attain the film formation by repeating a procedure comprising the steps of superposing two layers of Si on $CaF_2$ at 500° C., then superposing one layer of Cl thereon at normal room temperature, and converting the superposed layer by solid-phase growth into $CoSi_2$. The metal-insulator superlattice mentioned above is at a serious disadvantage in necessitating a highly complicate process for the production.

The metal/insulator combinations are at an advantage in allowing a large volume of electric current to flow at a high speed, utilizing a high barrier of insulator, and promising an expansion of the range of combinations as described above. Since a metal and a semiconductor or an insulator are different in crystal system, lattice constant, and surface energy, however, it has been unusually difficult to attain alternate stratified growth of these components on the order of nanometer. Even the combinations which have been heretofore realized have a problem of inevitable adoption of an exceptionally complicate process for the production.

SUMMARY OF THE INVENTION

This invention, therefore, has an object of providing an electronic part which enables a stable artificial super lattice structure indispensable for the realization of a quantized element making full use of the physical properties owned by a two-dimensional electronic system to be manufactured easily with high repeatability from a metal/insulator combination. It also has an object of providing easily and with high repeatability various electronic parts such as diodes, transistors, and vacuum emitter elements which use such artificial super lattices.

The present inventors, for the purpose of fulfilling the objects described above, have explored the principle governing the conditions for stable growth of a metal/insulator artificial super lattice and consequently constructed a theory for the design of a hetero system artificial super lattice. FIG. 1 depicts with a model the conditions for stratified heteroepitaxial growth which is indispensable for the realization of an artificial super lattice structure of an ordinary fine cycle.

In FIG. 1, the vertical axis of the graph forms the scale for the conditions of lattice matching between the crystal of a substrate layer and the crystal of a superposed layer in the plane of hetero growth which constitute the general criterion of judgment. The heteroepitaxial growth entails the requirement "that the lattice shapes in the plane of hetero growth should coincide at a low order and the lattice intervals should also approximately coincide (small amount of misfit strain) (Condition 1)."

The horizontal axis of the graph, on the other hand, forms the scale for the ratio between the bonding force within the crystal and the bonding force acting between the adjacent atoms in the interface. If the bonding force ($\epsilon_0$) within the superposed film is unduly larger than the bonding force ($\epsilon_{SO}$) in the interface (to the right in the graph of FIG. 1), the wettability of the superposed layers is degraded and the superposed film is suffered to grow in the form of islands. If the bonding force ($\epsilon_{SO}$) in the interface is unduly larger than the cohesive force ($\epsilon_0$) within the superposed film and the bonding force ($\epsilon_S$) within the substrate film (to the left in the diagram of FIG. 1), the superposed film and the substrate film react to give rise to an order structure compound and a solid solution. For the purpose of attaining stratified growth of an insulating layer on a metal layer and a metal layer on the insulating layer, therefore, the following condition should be satisfied.

$$\epsilon_M \sim \epsilon_I \sim \epsilon_{MI}$$ (Condition 2)

wherein $\epsilon_M$ is the bonding force within the metal layer, $\epsilon_I$ is the bonding force within the insulating layer, and $\epsilon_{MI}$ is the bonding force in the interface between the metal layer and the insulating layer.

For the purpose of attaining alternate stratified heteroepitaxial growth (generally referred to as "F-M type growth") of metal layers and insulating layers, therefore, the relevant factors should fall in the pertinent area indicated in the diagram of FIG. 1 which satisfy the two conditions indicated above. The present inventors have been first ascertained that the use of a metal/insulator combination satisfying both the "Condition 1" and "Condition 2" suffices for the manufacture of an artificial super lattice by stratified heteroepitaxial growth.

The adaptability of a lattice plane of the "Condition 1" mentioned above admits use of the existing data on crystal system and lattice constant. The bonding force between the atoms of the metal and insulating substance involved in the "Condition 2" can be calculated from the magnitudes of cohesive energy of these solid substances. The magnitudes of the bonding forces may be estimated approximately on the basis of melting points of crystals, for example. What matters here the magnitude of the bonding force in the interface between the metal and the insulating substance among other factors of the "Condition 2" (the interfacial energy for the sake of experimental measurement). Though this magnitude has a decisive influence on the stratified epitaxial growth, it is inevitably affected as by the ambience. Thus, virtually no reliable data are available.

The present inventors studied the bonding force acting in the interface to determine the cause therefor from the quantum mechanical point of view and consequently acquired a knowledge that the magnitude of the bonding force acting between the solid substances and excepting the very weak interaction (called "Van der Waals force") relies on the similarity of the mode of cohesion of the relevant substances. FIG. 2 is a model phase diagram of three qualitatively different types of solids, i.e. a metallic solid, a covalent solid, and an ionic solid ("Solid electronic structure and properties of solids," p. 44, written by W. A. Harrison, and published by W. H. Freeman and company, 1980). To be specific, the solids of a same kind and the solids of the metal bond/covalent bond and the covalent bond/ionic bond adjoin each other in the diagram and, therefore, have room for generating a bond energy. In contrast, a pure metal or an alloy and an ionic insulating compound lack similarity of mode of bonding and, as a natural consequence, produce a small bonding force. In these combinations, an artificial super lattice of metal/insulator cannot exist stably.

These results of the study support a conclusion that the metal/insulator combinations differ in the degree of metallicity represented by the vertical axis of the graph of FIG. 2 and this difference is inevitable in the light of the object of an artificial super lattice and that the use of a combination having close degrees of polarity indicated by the horizontal axis allows an increase in the bonding force in the interface and enables an artificial super lattice to be stably formed. To be more specific, (1) the combination between a pure metal or an intermetallic compound and an insulator selected from among covalent compounds of a small degree of polarity and (2) the combination between a compound metal (conductive compound) possessing an ionic bonding and an insulator selected from among ionic compounds and covalent compounds having a large degree of polarity answer the description given above.

In the combinations of the category (1) shown above, the covalent bond type solids include diamond, and cubic or hexagonal crystals BN, which are exceptional examples of insulator. These exceptional insulators are known to possess large bonding force and small lattice constant. No existing metals exhibit as large bonding force and as small lattice constant as those of the exceptional insulators. After all, these exceptional insulators cannot form an artificial super lattice. The practicability is promised by the above combination (2) between a compound metal possessing an ionic bonding and a compound insulator, namely the combination between an electroconductive ceramic substance and an insulating ceramic substance.

Basically, the ionic bonding mentioned above may well be regarded as varying proportionately with the difference in electronegativity between the component elements of the compound. From this point of view, the present inventors rounded up those compounds formed between a metal and a negative element having a Pauling's electronegativity of not less than 2.0 and enabled to produce a compound of a strong ionic bonding and listed up from among these compounds those of good conductivity as determined with an electron conducting mechanism. Table 1 shows those compounds having electric resistance (specific resistance) of not more than 100 µΩcm. Further, the present inventors made a deliberate study of such metals as would produce a good conductor (highly conductive compound) with the negative element mentioned above. As a result, they have acquired the following knowledge. First, the metals which form good conductors in the form of oxides are the transition metals belonging to Group 7A and Group 8. The metals which form good conductors in the form of nitrides, carbides, chalcogenides, and borides are exclusively the transition metals belonging to Groups 3A through 6A including rare earth elements of the lanthanide series and the actinide series.

TABLE 1

| | Compound | Crystal System | Specific Resistance (μ Ωcm) |
|---|---|---|---|
| 7A–6B | $ReO_3$ | Perov. | 10 |
| 8–6B | $RuO_2$ | $TiO_2$ | 40 |
| | $OsO_2$ | $TiO_2$ | 60 |
| | $RhO_2$ | $TiO_2$ | <100 |
| | $IrO_2$ | $TiO_2$ | 50 |
| La–6B | LaS | NaCl | 30 |
| | PrS | NaCl | 50 |
| | LaSe | NaCl | 50 |
| | PrSe | NaCl | 50 |
| | LaTe | NaCl | 50 |
| | PrTe | NaCl | 50 |
| 4A–5B | TiN | NaCl | 17 |
| 5A–5B | VN | NaCl | 40 |
| | NbN | ZnO | 78 |
| 4A–4B | TiC | NaCl | 60 |
| | ZrC | NaCl | 42–67 |
| | HfC | NaCl | 37–65 |
| 5A–4B | NbC | NaCl | 35–74 |
| | TaC | NaCl | 30–41 |
| 6A–4B | WC | WC | 19.2 |
| 3A–3B | $ScB_2$ | $AlB_2$ | 7–15 |
| | $YB_4$ | tetr. | 29 |
| | $YB_6$ | $CaB_6$ | 41 |
| La–3B | $LaB_6$ | $CaB_6$ | 15 |
| | $LaB_4$ | tetr. | 24 |
| | $CeB_6$ | $CaB_6$ | 29 |
| | $PrB_6$ | $CaB_6$ | 20 |
| | $NdB_6$ | $CaB_6$ | 20 |
| | $EuB_6$ | $CaB_6$ | 85 |
| | $GdB_6$ | $CaB_6$ | 45 |
| | $ThB_6$ | $CaB_6$ | 37 |
| | $YbB_6$ | $CaB_6$ | 47 |
| Ac–3B | $ThB_6$ | $CaB_6$ | 15 |
| 4A–3B | $TiB_2$ | $AlB_2$ | 14 |
| | ZrB | NaCl | 30 |
| | $ZrB_2$ | $AlB_2$ | 17 |
| | $ZrB_{12}$ | cubic. | 60 |
| | $HfB_2$ | $AlB_2$ | 9 |
| 5A–3B | VB | ortho. | 4 |
| | $VB_2$ | $AlB_2$ | 3.5 |
| | $V_3B_2$ | tetr. | 19 |
| | NbB | ortho. | 65 |
| | $TaB_2$ | $AlB_2$ | 37 |
| 6A–3B | $CrB_2$ | ortho. | 69 |
| | $Mo_2B_5$ | rhomb. | 18 |
| | $W_2B_5$ | $W_2B_5$ | 43 |

Similarly, the present inventors rounded up those compounds formed between a metal and a negative element and possessed of an energy gap (Eg), a yardstick for insulator, of not less than 3.0 eV and listed up from among these compounds those excluding the compounds capable of forming the so-called valency-controlling semiconductors. The compounds so picked up are shown in Table 2. They examined the metallic elements of the compounds shown in Table 2 to find that the metals which form insulators are invariably simple metals (inclusive of semimetals) belonging to Group 1A, Group 2A, and Groups 1B through 4B.

TABLE 2

| | Compound | Crystal System | Eg(eV) |
|---|---|---|---|
| 1A–7B | LiF | NaCl | 13.6 |
| | NaF | NaCl | 11.6 |
| | KF | NaCl | 10.7 |
| | RbF | NaCl | 10.3 |
| | CsF | NaCl | 9.9 |

TABLE 2-continued

| | Compound | Crystal System | Eg(eV) |
|---|---|---|---|
| | LiCl | NaCl | 9.4 |
| | NaCl | NaCl | 8.5 |
| | KCl | NaCl | 8.4 |
| | RbCl | NaCl | 8.2 |
| | CsCl | CsCl | 8.3 |
| | LiBr | NaCl | 7.6 |
| | NaBr | NaCl | 7.5 |
| | KBr | NaCl | 7.4 |
| | RbBr | NaCl | 7.4 |
| | CsBr | CsCl | 7.3 |
| | KI | NaCl | 6.0 |
| | RbI | NaCl | 6.1 |
| | CsI | CsCl | 6.2 |
| 1B–7B | CuBr | ZnS | 5.0 |
| | AgCl | NaCl | 3.2 |
| 2A–7B | $MgF_2$ | $SnO_2$ | 11.0 |
| | $CaF_2$ | $CaF_2$ | 10.0 |
| | $BaF_2$ | $CaF_2$ | 9.0 |
| 2B–7B | $CdF_2$ | $CaF_2$ | 6.0 |
| 2A–6B | MgO | NaCl | >7.8 |
| | BaO | NaCl | 4.2 |
| 2B–6B | ZnS | ZnS | 3.6 |
| 3B–6B | $Al_2O_3$ | $Al_2O_3$ | 8.3 |
| 4B–6B | $SiO_2$ | $SiO_2$ | 8.8 |
| 3B–5B | cBN | ZnS | 4.6 |
| | hBN | Graphite | 5.8 |
| | AlN | ZnO | 6.2 |
| | GaN | ZnO | 3.3 |
| | AlP | ZnS | 3 |
| 4B–4B | $Si_3N_4$ | $Si_3N_4$ | 5 |
| 4B–4B | SiC | ZnS | 3.0 |

The combinations of good conductive compounds with ionic bonding and insulating compounds are collectively shown in the periodic table of FIG. 3. A review of the electronic structures of these atoms reveals that the metals which form good conductive compounds are limited to the transition metals and rare earth metals and have structures which are partially filled with d electrons and f electrons. In contrast, the metals which form insulating compounds are invariably simple metals and have electron structures with filled d orbital and f orbital. Thus, these simple metals may well be regarded as elements which on being combined with a negative element allow s electrons and p electrons thereof to form closed-shell structures. An artificial super lattice having layers of a metal and layers of an insulator alternately superposed can be realized by selecting the above combinations of compounds having good conductivity and insulating compounds, preferably a combination of a small difference of ionic bonding degree, or a combination meets the "Condition 1" and "Condition 2" mentioned above.

The electronic part of this invention is characterized by possessing a substance of good conductivity formed of either a compound between at least one element selected from among the transition metal elements belonging to Groups 3A through 6A in the Periodic Table and the rare earth elements and at least one element selected from among boron, carbon, nitrogen, phosphorus, sulfur, selenium, and tellurium or a compound between at least one element selected from among the transition metal elements belonging to Group 7A and Group 8 and oxygen and an insulating substance formed of a compound between at least one element selected from among the simple metal elements belonging to Group 1A, Group 2A, and Groups 1B through 4B and at least one element selected from among carbon, nitrogen, oxygen, phosphorus, sulfur, selenium, tellurium, and halogen elements and incorporating therein an artificial super lattice formed by alternately superposing layers of the substance of good conductivity and layers of the insulating substance in thicknesses fit for producing a quantum size effect, the artificial super lattice being provided with a single or multiple barrier layers formed of the insulating substance and an electrode layer formed of the substance of good conductivity and disposed in contact with the barrier layers.

Table 1 shows only the compounds whose magnitudes of electric resistance are not more than 100 µΩcm. For applications which make use of electronic conductivity, those compounds whose magnitudes of electric resistance are not less than 100 µΩcm and not more than about 1,000 µΩcm may be utilized. Table 2 shows only the compounds whose magnitudes of energy gap are not less than 3 eV. The compounds whose magnitudes of energy gap are not less than 1 eV may be utilized as a barrier against electronic conduction which allows manifestation of two-dimensionality.

The artificial super lattice in the electronic part of this invention is produced by alternately superposing layers of the compound of good conductivity (compound metal) and layers of the insulating compound on the order of nanometer, which order allows quantum size effect. The compound of good conductivity and insulating compound mentioned above are used as a crystalline film or an amorphous film.

Basically, the combination of a compound of good conductivity and an insulating compound in the artificial super lattice is only required to be such that these two compounds in the combination are respectively included in the set of compounds of good conductivity and the set of insulating compounds both mentioned above. Firstly, it is desirable to use a combination of a compound of good conductivity and an insulating compound whose difference in the ionicity is small. When the difference in the ionicity is large, the bonding energy in the interface is so small as to render difficult the alternate superposition of the layers of the compound of good conductivity and the layers of the insulating compound. To be specific, it is desirable to use a compound of good conductivity and an insulating compound whose difference in the ionicity of Philips definition is not more than about 0.3.

Secondly, it is desirable to use a combination of a compound of good conductivity and an insulating compound such that the bonding force in the interface between the compound of good conductivity and the insulating compound, the bonding force within the compound of good conductivity, and the bonding force within the insulating compound closely approximate one another. When the bonding force in the interface is unduly large, it becomes difficult to form an ideal artificial super lattice because the compound of good conductivity and the insulating compound react each other and give rise to solid solution. Conversely, when the bonding force in the interface is unduly small, it becomes difficult to attain alternate superposition of the layers of the compound of good conductivity and the layers of the insulating compound as pointed out above.

This condition is particularly important when the artificial super lattice is formed of crystalline substances. When the artificial super lattice is formed of amorphous substances, an extreme deviation from this condition entails the possibility that the superposed layers will assume the state of islands.

When the artificial super lattice is formed of crystalline substances, it is desirable to use a combination of crystal films of a compound of good conductivity and crystal films of an insulating compound such that the shapes of lattice in the plane of hereto growth conform at such low orders as primary, secondary, and tertiary orders and, at the same time, the intervals of lattice substantially conform. To be concrete, the intervals of lattice are desired to be such that the amount of misfit strain is within 5%. When crystalline substances deviate from the condition mentioned above, the heteroepitaxial growth thereof is attained only with difficulty. Thus, an ideal artificial super lattice of crystalline substances can be obtained by alternately superposing layers of crystals of good conductivity and layers of insulating crystals both satisfying the condition mentioned above with the orientations thereof aligned. Depending on the conditions of use of the artificial super lattice, a deviation from the condition may be tolerated.

With due respect to such factors as ease of the formation of film besides the condition that such adverse phenomena as reaction, solid solution, and diffusion should not occur between the layers of a compound of good conductivity and the layers of an insulating compound, it is advantageous to use in the combination a compound of good conductivity and an insulating compound both of similar negative elements such as, for example, a set of oxides or a set of nitrides.

As concrete examples of the advantageous combination of a compound of good conductivity and an insulating compound, the nitride type combinations using TiN and VN as compounds of good conductivity and AlN and GaN as insulating compounds may be cited. The (111) surface of the halite type crystals of TiN and VN and the (100) surface of the rock salt type crystals of AlN and GaN have an equal lattice shape and involve such a small amount of mismatch strain as within 3%. Further, the magnitudes of electronegativity of Ti, V, Al, and Ga are respectively 1.5, 1.6, 1.5, and 1.6, indicating very close approximation. Then, as concrete examples of the advantageous oxide type combination, the combinations using the (111) surface of $ReO_3$ as a compound of good conductivity and the (001) surface of BeO or the (001m) surface of $Al_2O_3$ as insulating compounds may be cited. As concrete examples of the advantageous carbide type combination, the combinations using the (111) surface of TiC, NbC, HfC, and NbC as compounds of good conductivity and the (111) surface of SiC as an insulating compound may be cited.

Incidentally, when the electronic device of this invention which utilizes the two-dimensional conductivity of electrons is superposed on a Si substrate, it may be put to use as combined with silicon device. When the lattice constant of Si and the lattice constant of the metal/insulator artificial super lattice formed on the Si substrate are at variance, it is desirable to interpose therebetween a crystalline or amorphous buffer layer which can serve the purpose of alleviating the lattice strain existing between the two layers. As the material for the aforementioned substrate, MgO, Ge, $CaF_2$, GaAs, sapphire, and similars are available besides Si.

The artificial super lattice in the electronic part of the present invention allows the layers of a good conductive compound and the layer of an insulating compound to be severally used in the form of amorphous films. The use of such amorphous films obviates the necessity for paying attention to the inconformity in lattice shape and lattice interval which forms a problem for crystal systems. This fact promises an expansion of the range of combinations of good conductive compounds and insulating compounds. The heteroepitaxial growth is no longer required because layers of a metal having high conductivity and layers of an insulating substance having a high barrier are superposed as amorphous films at a temperature lower than the crystallization temperature. The layers are not suffered to grow in the form of islands because the amorphous films are formed by quenching solidification. Thus, the component layers of the artificial super lattice can be easily produced in a flat shape.

Even when the artificial super lattice is manufactured with metal/insulator layers having an amorphous texture as described above, the metal/insulator combination which is used herein is desired to be included in the combinations indicated in the Periodic Table of FIG. 3.

When the artificial super lattice in this invention is constructed of crystalline substances, there are times when the relevant films are not formed with satisfactory crystallinity at a temperature below 1,000° C. by the ordinary MBE method or MOCVD method because the various compounds mentioned above copiously contain substances having high melting points. When the ordinary method fails, it is desirable to employ either of the following film deposition methods which are adapted to excite at least one of the relevant metals or negative elements.

(A) The film deposition methods such as reactive ion beam method and ionized cluster beam method which make use of ion beams.

(B) The film deposition methods which make use of atomic beams and radical beams.

(C) The film deposition methods which comprise irradiating films in process of formation with light and effecting epitaxial growth of the films at a low temperature by virtue of the light energy.

The film deposition methods of (A) to (C) cited above will be described more specifically below.

First, in the film deposition methods of (A), the reactive ion beam method comprises first causing a high-melting metal set in place inside a crucible to be fused and vaporized with an electron beam deflected in an electromagnetic field by means of an electron beam heating and vaporizing source installed on the bottom part inside a vacuum chamber, allowing the vaporized high-melting metal to be deposited on a substrate disposed directly above the electron beam heating and vaporizing source, simultaneously extracting a beam from a plasma with an extracting electrode set in place directly behind a plasma filament type ion source, picking out only a desired species of beam with a sector magnet type mass separator, and decelerating the beam just in front of the substrate. As a result, a thin film of the metal is formed on the substrate.

The excited state of electrons owned by the ion is useful for the activated energy which participates in the reaction for the formation of the compound and the kinetic energy in process of translational motion controlled appropriately controlled by an electric field is useful for epitaxial growth. The activated energy of the reaction is variable with the kind of a substance to be manufactured. In the reaction of Ti with N, for example, this activated energy is not more than 1 eV. In contrast, the ionizing energy possessed by $N^+$ is about 20 eV and that possessed by $N_2^+$ is 7 to 8 eV. Even when the temperature of the substrate is in the neighborhood of normal room temperature, the Ti molecule and the N ion readily react. Specifically, the magnitude of an optimum kinetic energy, though variable with the kind of a substance to be manufactured, is larger than the magnitude of the activated energy for the sake of epitaxial growth and smaller than that of the bond energy of crystals. The upper limit is necessary for the purpose of preventing the crystals in process of growth from breakage. In many cases, the magnitude is in the range of several eV to some hundreds of eV.

Further, in the reactive ionized cluster beam method, the vapor of a substance to be vacuum deposited is spouted inside a vacuum chamber, for example, to give rise to a cluster (a mass of atomic groups) having numerous atoms of the vapor loosely bound. This cluster is showered with electrons to ionize about 1% of the cluster and form an ionized cluster. Thereafter, the ionized cluster is accelerated and caused to collide against the substrate. At the same time, a reactive gas is supplied to the neighborhood of the substrate and allowed to react with a cluster of the substance subjected to vacuum deposition on the substrate. As a result, a thin film of the compound is formed on the substrate.

The lid of the crucible which is used by the ionized cluster beam method is perforated to form holes such that the ratio of diameter to length thereof is 1. The crucible is heated by the thermoelectron bombardment generated from a filament which is wound round the crucible. When the internal pressure of the crucible increases past 0.1 Torr, the substance for vacuum deposition discharged from within the crucible, while being spouted through a nozzle, undergoes adiabatic expansion with a decrease of temperature and, owing to the ensuant phenomenon of cohesion, forms a cluster composed of some tens to some hundreds of particles. Although the number of particles of which the cluster is composed depends on the internal pressure of the crucible and the shape of the nozzle, virtually all the kinds of substances form the largest cluster under the conditions mentioned above. Further when this cluster is exposed to a shower of electrons to induce ionization of about 1% of the cluster, it is turned into an ionized cluster which can be easily handled with an electric field. Since about 1% of the cluster of about 100 particles has been ionized, the energy per particle is some tens of eV even when the cluster is accelerated with an electric field of several kV. The particles of such very low energy as this is fit for the manufacture of a flawless membrane of good quality.

The film deposition method of (B) mentioned above is directed to conferring upon such a negative element as nitrogen, carbon, or oxygen the activating energy for the reaction required for the production of a compound by converting the negative element into an atomic beam or a radical beam flowing at a supersonic rate. For example, the energy possessed by a nitrogen radical is as large as about 5 eV, whereas the activating energy necessary for the production of TiN is about 0.8 eV. Even when the substrate is at a low temperature, therefore, the reaction of the nitrogen radical with titanium proceeds easily on the substrate. Further, since the beam originates from the nozzle, the pressure of the ambient gas can be retained at a high degree of vacuum during the progress of the production of the compound.

For the formation of the atomic beam or radical beam, any of various methods such as, for example, microwave discharge, RF discharge, and DC discharge can be used. For the purpose of obtaining a beam of good directional property and high density at a high rate, it is desirable to use an atomic or radical beam in combination with a neutral high-speed beam produced by forcing a given beam through a nozzle thereby imparting a translational motion, a rotation, and a vibration to the particles of the nozzle, and cooling the nozzle beam. As a result, a film of the compound can be produced at a stated site on the substrate while the other portions are kept under a high degree of vacuum. When the back pressure near the tip of the nozzle is high, a shock front is produced around the spouted gas and, consequently, the cooled molecules are reheated in situ because of mutual collision thereof. A skimmer disposed on the inside of a Mach disc suffices to avoid the preheating. Further, when the gas to be supplied is mixed with a gas lighter than the feed gas, a kinetic energy of gain can be obtained proportionately to the mass ratio of the two gases.

In the film deposition methods of (A) and (B) mentioned above, it is desirable to convert at least one of the component elements of the compound into an excited beam such as ion beam or radical beam and simultaneously converting the other component element into a molecular beam (inclusive of the case of converting all the component elements of the compound into an excited beam), and alternately irradiating the components and inducing growth of one atomic layer after another. These conditions are best realized in the method for formation of a film by using the ion beam of a negative element with an extreme low energy and the molecular beam of a metal.

The (111) plain of TiN and VN which are halide type crystals and the (001) plain of AlN and GaN which are ZnO type crystals, for example, both have nitrogen atom surfaces and metal atom surfaces alternately arranged. When the metal surfaces are exposed to a nitrogen ion beam of low energy, the beam reacts with the metal at a probability of nearly 100% and forms a nitrogen surface so long as any of the metal surfaces remains open to the beam. After all the surfaces are thus turned into nitrogen surfaces, the nitrogen ions exclusively engage in exchanging electric charges on the surfaces, avoid the reaction, and depart in the form of nitrogen gas from the surfaces. As a result, the nitrogen layer can be grown flatly in the unit of monoatomic thickness on the level of atom. When the nitrogen atom surfaces are then exposed to the molecular beam of metal, the metal atoms deposited on the nitrogen atom surfaces are made to form nitrides. The metal atoms deposited further on the metal atom surfaces are expected to migrate on the metal atom surfaces and turn stably into nitrides on the nitrogen atom surfaces after all. When the molecular beam of a metal is used for irradiation, therefore, it fails to manifest the self-stopping property of the kind obtained with the ionic beam of nitrogen, i.e. the phenomenon of automatical cessation of the irradiation after all the surfaces have been turned into nitrogen surfaces. When the beam is supplied in an amount for one layer as controlled with a film thickness monitor, the metal layer can be flatly grown roughly in a monoatomic thickness similarly on the atom level. An artificial super lattice having several layers of a good conductive compound and as many layers of an insulating compound alternately superposed flatly can be easily produced by subjecting a good conductive compound and an insulating compound to the alternate irradiation described above thereby allowing these two compounds to be alternately superposed.

The film deposition method of (C) using a light energy consists in irradiating a given raw material gas with a light of pertinent energy thereby photodecomposing the raw material and depositing the product of decomposition. By this method, a compound of a high-melting point can be made to form a film at a low temperature. The method of this nature further confers selectivity upon the excitation because the wavelength of light varies the manner in which the gas molecules are excited and, as a result, likewise varies the product of decomposition to be consequently obtained. In the interaction between the light and the molecules, the state of excitation is divided into electronic excitation, vibratory excitation, and rotary excitation. By inducing the vibratory excitation and rotary excitation, the surface migration of the raw material gas molecules on the surface of the substrate can be promoted. The promoted migration realizes the impartation of flatness to the produced film.

A film of still higher flatness can be formed at a low temperature by sequentially using for irradiation the light of a wavelength equivalent to an energy not higher than the bond energy of the raw material gas molecules and the light of a wavelength equivalent to the bond energy thereby effecting the formation of a film. The light of a wavelength equivalent to an energy lower than the bond energy of the raw material gas molecules is effective in promoting the surface migration of the raw material gas molecules as described above. At this point, the molecules are not decomposed by the light but are deposited on the surface. Thereafter, by using for irradiation the light of an energy equivalent to the bond energy thereby inducing the molecules to undergo decomposition, the film of the compound can be produced with a flat surface at a low temperature. Then, by introducing the raw material gas to be subsequently deposited and repeating the procedure alternately for the two compounds, the artificial super lattice can be formed with a flat surface on the monoatomic layer level.

The decomposition can be carried out selectively because the excitation of a specific bond can be exclusively excited by using the light of an energy equivalent to a specific bond of the raw material gas molecules. As a result, the site at which the reaction and deposition occur in the initial stage of the process of film formation can be controlled and the component steps of the process of film formation can be likewise controlled. Moreover, since the decomposition is initiated only after the raw material gas molecules have been deposited flatly, the otherwise possible secondary reaction of the deposited molecules with the product of decomposition or with the excited radicals can be repressed and the component steps can be controlled very easily. Then, by using a light as the source of the energy for the decomposition and surface migration of the raw material gas which are generally effected by heating the substrate, the necessity for heating the substrate is obviated and the diffusion in the interfaces between the adjacent superposed layers is repressed and the production of a membrane enjoying ideal sharpness of boundaries is consequently ensured.

The electronic part of this invention makes use of such quantum size effects as a tunnel effect and a resonant tunnelling effect which occur in the artificial super lattice described above and is provided with a single or multiple barrier layers formed of the aforementioned insulating compound and electrode layers formed of the aforementioned compound of good conductivity (metallic compound) and disposed in contact with the barrier layers. Conventionally, the artificial super lattice which manifests two-dimensional electric conductivity has been produced by superposing a plurality of semiconductors. The present invention is based on finding the above proper combinations of metals and insulating compounds. According to the present invention, the artificial super lattice can be produced such that a good conductive compound possessing high conductivity and an insulating compound possessing a high barrier are alternately superposed. Since an artificial semiconductor can be obtained by harnessing the two-dimensional conductivity which is manifested by an artificial super lattice composed of a metal (good conductive compound) and an insulator, the electronic part of this invention can be applied for various quantum effect device which make use of such quantum size effects as a tunnel effect and a resonant tunnelling effect.

As concrete examples of the electronic part of the present invention, (resonant) tunnelling diodes and resonant tunnelling transistors provided with two terminals, three terminals, or more terminals and constructed by combining a single barrier layer or multiple barrier layers formed of an insulating compound, electrode layers formed of a compound of good conductivity and disposed in contact with the multiple barrier layers, and quantum well (electrode) layers formed of a compound of good conductivity and incorporated within the multiple barrier layers formed of an insulating compound may be cited. In the case where an artificial super lattice is formed on a conductive or semiconductive substrate, the substrate can serve as one electrode. The resonant tunnelling elements mentioned above can operate to generate nonlinear resistance, rectify currents, detect waves, amplify power, and switch circuits, for example. The electronic part of this invention can be applied to an electronic part which uses a combination of a plurality of resonant tunnelling elements.

Further, the electronic part of this invention can be applied to a vacuum emitter element which is possessed of two or more terminals and constructed by combining at least one each of the same electrode layers and quantum well (electrode) layers as mentioned above and to a vacuum electronic part using the vacuum emitter element. As concrete examples of the vacuum electronic part just mentioned, power elements, substitutes for vacuum tubes adapted for large current and high frequency, and image-forming devices making use of a multiplicity of vacuum emitter elements may be cited.

The barrier layers and the quantum well electrode layers in such a resonant tunnelling element as described above are required to be formed in thicknesses capable of producing a quantum size effect. These thicknesses are to be set in compliance with the properties of compounds used and the characteristic properties of an electronic part aimed at. To feasibilize the resonant tunnelling phenomenon, for example, the resonant tunnelling element must be so constructed that the component films each have an amply small thickness and the scattering of an electron wave in the interface has no effect on the propagation of waves. It is well known that the electron wave which is generated when amply deep box potential wells are arranged behaves as free particles called as a two-dimensional electron gas in the direction of thickness of films and that the magnitude of energy possessed by electrons is represented as the sum of the energy accompanying the two-dimensional free motion and the energy of quantum level relative to the stationary wave. The tunnel probability reaches its maximum when the electron wavelength, $\lambda_e$, $(=h/(2\ m^*E^{1/2})$ which corresponds to the latter energy equals a multiple of the width, $L_W$, of the quantum well [J. Appl. Phys., Vol. 34, No. 4 (Part 1), April, 1963, p. 864]. It is desirable to set the thickness of barrier layers or quantum well electrode layers, for example, in accordance with the relation mentioned above. Concretely, the thickness of barrier layers and that of quantum well electrode layers are roughly not more than about 10 nm. Such thickness allows quantum size effect. The layers may be formed in at least one atom layer. Further, the thickness of an electrode layer placed in contact with a single or multiple barrier layer is not limited. However, in view of high integration, the thickness of the electrode layer is preferably similar to that of quantum well electrode layer.

The artificial super lattice can be adapted to serve as a wiring material offering low resistance at a very high amperage by harnessing the conductive properties which are manifested in the direction within the interfaces of superposed layers of the artificial super lattice. It is theoretically applicable to optical devices. Further, since a thin film of a metal and a thin film of an insulator can be ideally bonded, it can be also applied to such capacitor elements as are obtained by superposing layers of metal/insulator/metal.

Now, concrete examples of the construction of the electronic part of this invention will be described below.

First, examples of the construction embodying this invention in (resonant) tunnelling diodes will be described with reference to FIGS. 4 to 8(a), 8(b) and 8(c) The diagrams depict potential structures.

A tunnelling diode using a single barrier as illustrated in FIG. 4 represents one embodiment of this invention. This tunnelling diode is provided with a single barrier layer formed of such an insulating compound as described above and two electrode layers formed of such a compound of good conductivity as described above and disposed one each in contact with the opposite sides of the barrier layer.

As examples of the resonant tunnelling barrier forming a component of the tunnel diode, a double barrier (FIG. 5-a), a triple barrier (FIG. 5(-b), and a multiple barrier (FIG. 5-c) illustrated in FIGS. 5(a) to 5(c) may be cited. As examples of the resonant tunnelling diode, resonant tunnelling diodes which use such resonance barriers as mentioned above may be cited. The resonant tunnelling diodes using resonant tunnelling barriers are provided with resonance well layers formed of the aforementioned compound of good conductivity and nipped between the barrier layers in addition to the electrode layers mentioned above. In the resonant tunnelling diodes using at least a triple barrier, the barrier layers and the resonance well layers which are nipped between the barrier layers are allowed to have an equal thickness. Desirably, the resonant tunnelling diodes are so designed that specific resonance levels (subband) agree when a specific voltage is applied between two terminals. Further, such resonant tunnelling diodes as have a plurality of double barriers arranged in series as illustrated in FIGS. 6(a) and (b) and a plurality of multiple resonance barriers arranged as illustrated in FIG. 7 may be cited as other examples.

As concrete examples of the resonant tunnelling diode using an emitter itself as a multiple barrier, a combination of a multiple barrier emitter with a single barrier (FIG. 8a), a combination of a multiple barrier emitter with a double barrier (FIG. 8-b), and a combination of a multiple barrier emitter with a triple (multiple) barrier (FIG. 8-c) as illustrated in FIGS. 8(a) to 8(c) may be cited.

A review of the metal/insulator junction as to the energy structure of metal reveals that the junction is filled with electrons from the lower end of the allowed energy band through the Fermi level. Basically, therefore, the junction requires at least a triple barrier for the purpose of obtaining negative resistance as a diode characteristic.

Now, concrete examples of the construction embodying this invention in resonant tunnelling transistors will be described below with reference to FIG. 9 to FIGS. 28(a), 28(b) and 28(c) FIG. 9 depicts a hot electron transistor having two single barriers arranged in series. This transistor is provided with two barrier layers formed of the aforementioned insulating compound and electrode layers formed of the aforementioned compound of good conductivity and disposed in contact with the barrier layers.

As concrete examples of the hot electron transistor which is provided between a base and a collector with a single barrier and adapted to be operated with hot electrons, such hot electron transistors as are provided with resonance barriers of a double barrier (FIG. 10-a), a triple barrier (FIG. 10-b), and a multiple barrier (FIG. 20-c) which are adapted to function as an emitter barrier between an emitter and a base as illustrated in FIGS. 10(a) to 10(c) may be cited.

In the hot electron transistors using at least a triple barrier, the barrier layers and the resonance well layers nipped between the barrier layers are allowed to have an equal thickness. Desirably, these hot electron transistors are designed so that specific resonance levels agree when a specific voltage is applied between two terminals. As other examples of the resonant tunnelling transistor, those resonant tunnelling transistors which have a plurality of double barriers arranged in series and adapted to function as emitter barriers as illustrated in FIGS. 11(a) and (b) and those resonant tunnelling transistors which have a plurality of multiple resonance barriers arranged and adapted to function as emitter barriers as illustrated in FIG. 12 may be cited.

As concrete examples of the resonant tunnelling transistor which is so constructed as to establish interconnection between an emitter and a base and between the base and a collector by means of a resonant tunnelling effect, the resonant tunnelling transistors using as bases thereof a double barrier (FIG. 13-a), a triple barrier (FIG. 13-b), and a multiple barrier (FIG. 13-c) as illustrated in FIGS. 13(a) to 13(c), those using a double emitter barrier in combination with a double to multiple resonance barrier base as illustrated in FIGS. 14(a) to (c), those using a triple emitter barrier in combination with a double to multiple resonance barrier base as illustrated in FIGS. 15(a) to (c), and those using a multiple emitter barrier in combination with a multiple resonance barrier base as illustrated in FIG. 16 may be cited.

As concrete examples of the resonant tunnelling transistor which uses a plurality of resonance barriers between an emitter and a base, the resonant tunnelling transistors using two series of a double emitter barrier or a multiplicity of series of a double emitter barrier in combination with a double resonance barrier base as illustrated in FIGS. 17(a) and (b), those using two series of a double emitter barrier or a multiplicity of series of a double emitter barrier in combination with a triple resonance barrier base as illustrated in FIGS. 18(a) and (b), those using two series of a double emitter barrier or a multiplicity of series of a double emitter barrier in combination with a multiple resonance barrier base as illustrated in FIGS. 19(a) and (b), those using a multiplicity of series of a multiple emitter barrier in combination with a double resonance barrier base as illustrated in FIG. 20, those using a multiplicity of series of a multiple emitter barrier in combination with a triple resonance barrier base as illustrated in FIG. 21, and those using a multiplicity of series of a multiple emitter barrier in combination with a multiple resonance barrier base as illustrated in FIG. 22 may be cited.

As concrete examples of the resonant tunnelling transistor which has an emitter of its own used as a multiple barrier, the resonant tunnelling transistors using a multiple barrier emitter in combination with a single emitter barrier and a double to multiple resonance barrier base as illustrated in FIGS. 23(a) to (c), those using a multiple barrier emitter in combination with a double emitter barrier and a double to multiple resonance barrier base as illustrated in FIGS. 24(a) to (c), those using a multiple barrier emitter in combination with a triple emitter barrier and a double to multiple resonance barrier base as illustrated. in FIGS. 25(a) to (c), and those using a multiple barrier emitter in combination with a multiple emitter barrier and a multiple resonance barrier base as illustrated in FIG. 26 may be cited.

As concrete examples of the multiple-input resonant tunnelling transistor, those multiple-input resonant tunnelling transistors which use a multiple quantum well in its unmodified form as a multiple base as illustrated in FIG. 27(a) may be cited. Those multiple-input resonant tunnelling transistors which use a double emitter barrier in combination with a multiple base as illustrated in FIG. 27(b) and those using a multiple emitter barrier in combination with a multiple base as illustrated in FIG. 27(c) may be cited as other examples. Further, those using a multiple barrier emitter in combination with a single to multiple emitter barrier and a multiple base as illustrated in FIGS. 28(a) to (c) may be cited as other examples. These multiple-input resonant tunnelling transistors allow simultaneous processing of a multiplicity of inputs.

The use of the artificial super lattice according with the present permits provision of such resonant tunnelling elements as resonant tunnelling diodes and resonant tunnelling transistors which feature a large transfer ratio of electric current and a high speed of response.

Now, examples of the construction embodying this invention in (resonance) tunnel vacuum emitter elements will be described below with reference to FIGS. 29 to 36. FIG. 29 depicts a vacuum emitter element using a single barrier. As concrete examples of the resonant tunnelling barrier which takes part in the construction of a vacuum emitter element, a double barrier (FIG. 30-a), a triple barrier (FIG. 30-b), and a multiple barrier (FIG. 30-c) which are constructed as illustrated in FIGS. 30(a) to 30(c) may be cited. In the triple and higher barriers, the barrier layers and the resonance well layers which are interposed between the barrier layers may be equal in thickness. Desirably, the vacuum emitter elements are designed so that specific resonance levels agree when a specific voltage is applied between two terminals. In addition, constructions using a plurality of double barriers arranged in series as illustrated in FIGS. 31(a) and (b) and constructions using a plurality of multiple resonance barriers set in place orderly as illustrated in FIG. 32 may be cited.

As concrete examples of the vacuum emitter element which has an emitter of its own adapted to serve as a multiple barrier, the vacuum emitter elements which use a multiple barrier emitter in combination with a single, double, or multiple emitter barrier as illustrated in FIGS. 33(a) to (c) may be cited.

As concrete examples of the multiple-input resonant tunnelling vacuum emitter element, the multiple-input resonant tunnelling vacuum emitter elements which are provided with a multiple base input formed of a multiple quantum well and a control electrode adapted to decide basic discharge characteristics as illustrated in FIG. 34(a) may be cited. Further, the resonant tunnelling vacuum emitter elements which use a double barrier interposed between an emitter and a base as illustrated in FIG. 34(b) and those using a multiple barrier interposed between an emitter and a base as illustrated in FIG. 34(c) may be cited as other examples. As concrete examples of the multiple-input vacuum emitter element which has an emitter of its own formed of a multiple barrier, the multiple-input vacuum emitter elements which use a multiple barrier emitter in combination with a multiple base input as illustrated in FIG. 35(a), those using a multiple barrier emitter in combination with a double emitter base barrier and a multiple base input as illustrated in FIG. 35(b), and those using a multiple barrier emitter in combination with a multiple emitter base barrier and a multiple base input as illustrated in FIG. 36 may be cited.

The use of the artificial super lattice according with the present invention, as described above, allows provision of resonant tunnelling vacuum emitter elements which feature a large discharge ratio of electric current and a high speed of response. Further, the use of the multiple-input base formed of a multiple quantum well permits provision of vacuum emitter elements which effect simultaneous processing of a multiplicity of inputs and, based on the results of the relevant computation, afford a large discharge ratio of electric current and a high speed of response.

BRIEF DESCRIPTION OF THE DRAWINGS

Figure 3:
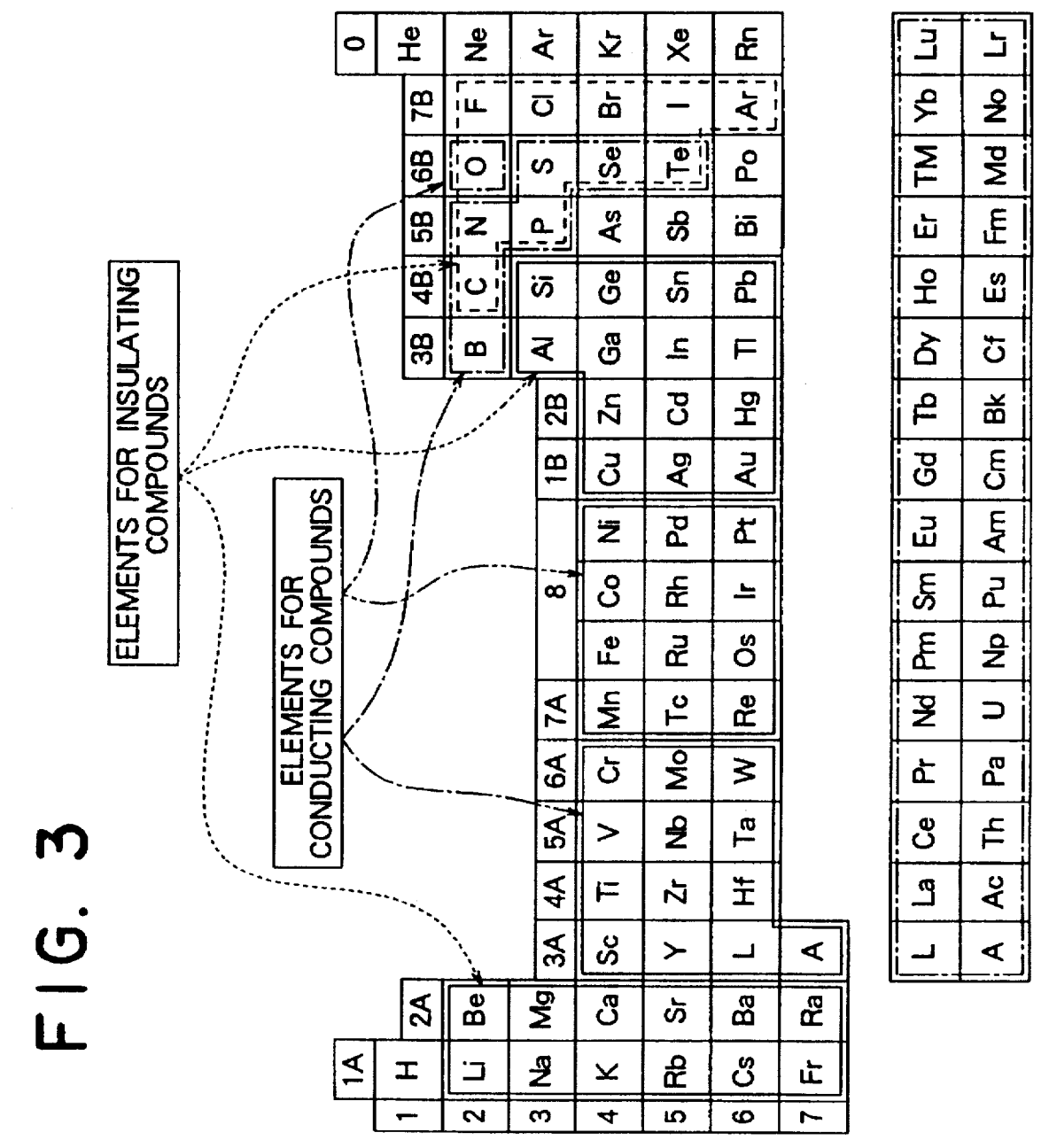

FIG. 3 is diagram illustrating combinations of component elements of compounds of good conductivity and insulating compounds for use in the artificial super lattice of this invention with the aid of a periodic table.

FIGS. 14(a), 14(b), 14(c), 15(a), 15(b, 15(c) and 16 are diagrams illustrating in a potential structure examples of the construction of resonant tunnelling transistors using a multiple emitter barrier and a multiple barrier base and embodying the present invention.

FIGS. 23(a), 23(b) and 23(c) are diagrams illustrating in a potential structure an example of the construction of a resonant tunnelling transistor using a multiple barrier emitter and a multiple barrier base and embodying the present invention.

FIGS. 24(a), 24(b), 24(c), 25(a), 25(b), 25(c) and 26 are diagrams illustrating in a potential structure examples of the construction of a resonant tunnelling transistor using a multiple barrier emitter, a multiplicity of series of an emitter barrier, and a multiple barrier base and embodying the present invention.

DESCRIPTION OF THE PREFERRED EMBODIMENTS

Now, the present invention will be described more specifically below with reference to working examples thereof.

EXAMPLE 1

Figure 1:
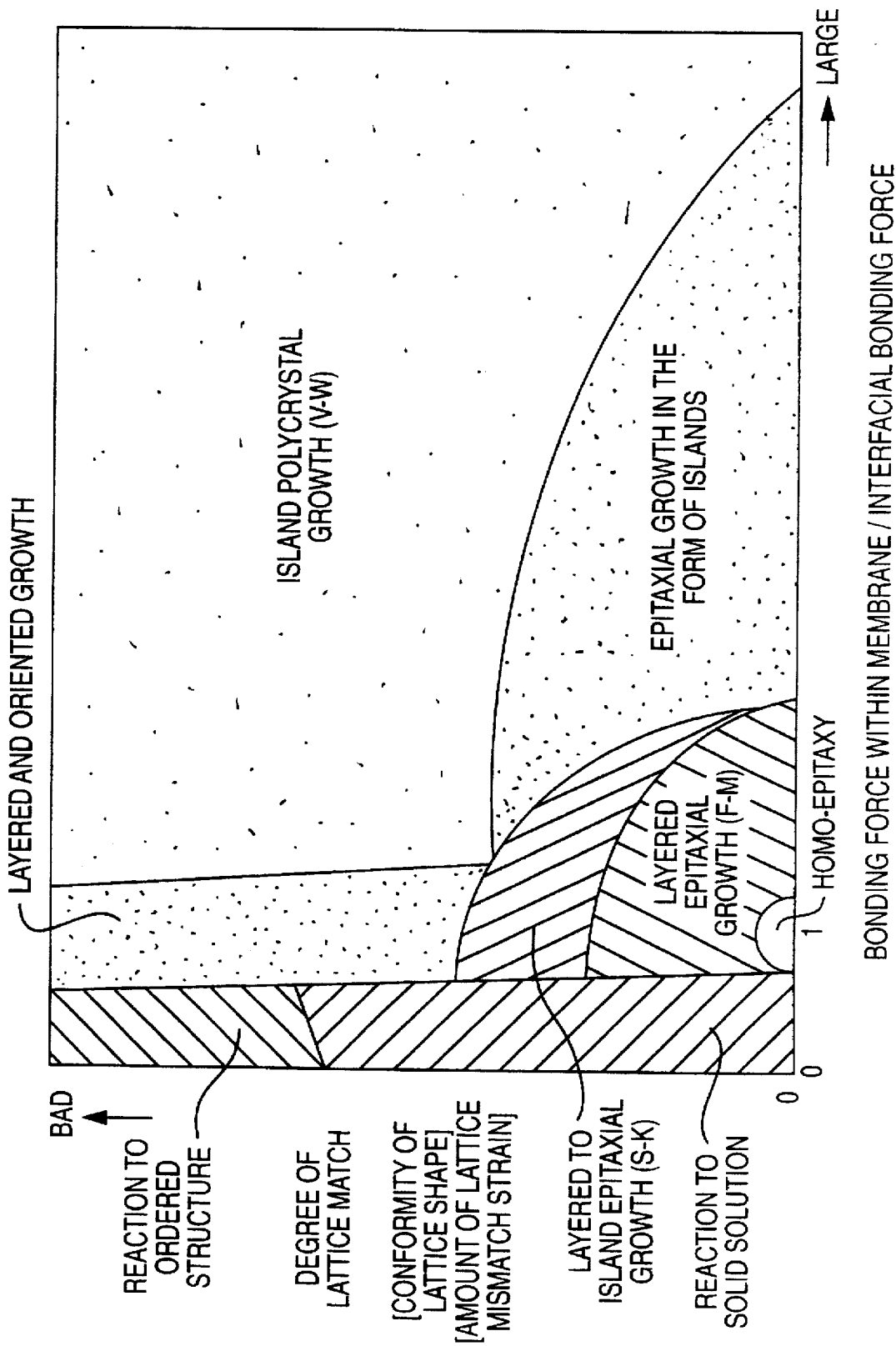
FIG. 1 is model diagram depicting the conditions for layered heteroepitaxial growth.
Figure 2:
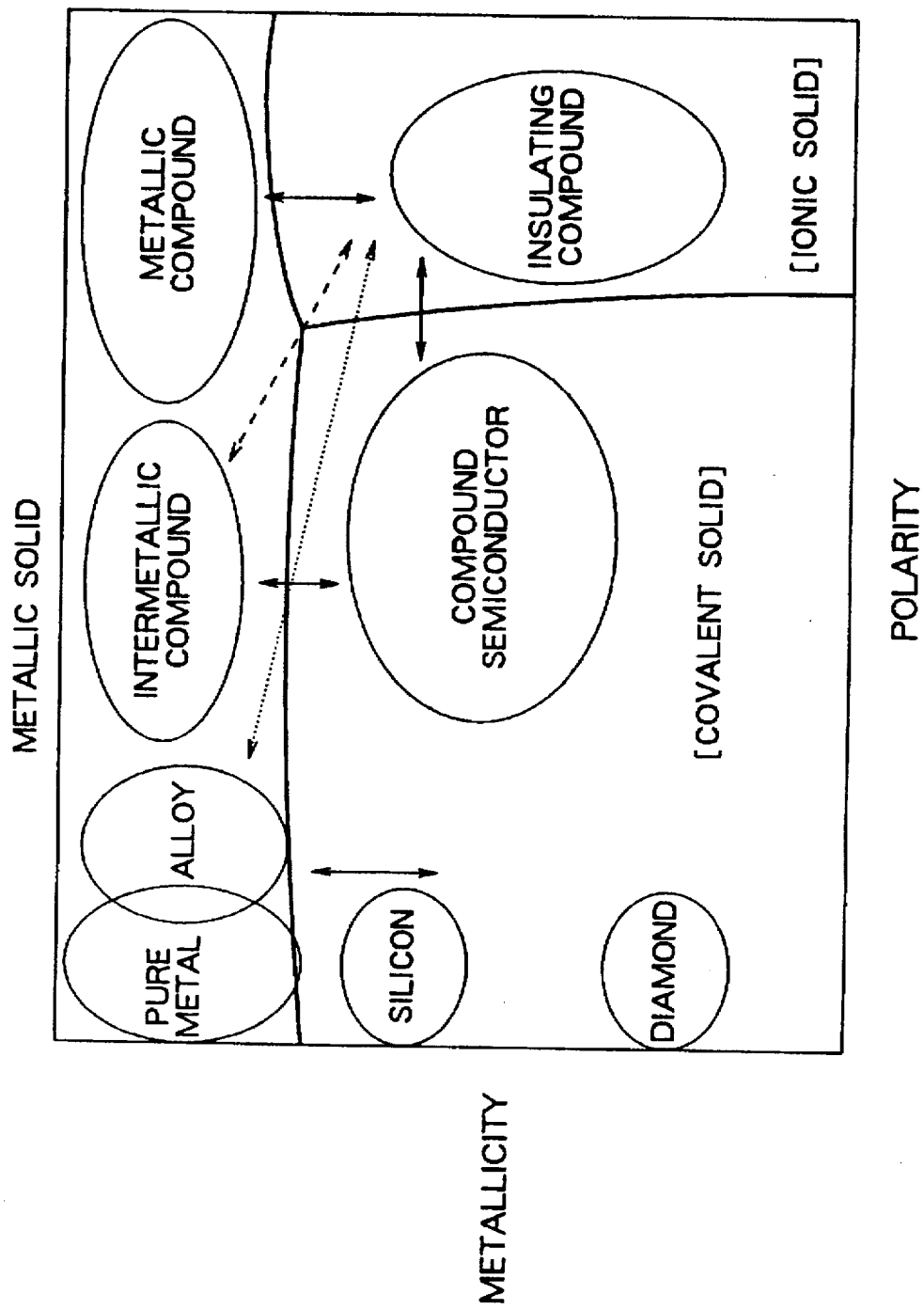
FIG. 2 is model phase diagram illustrating three qualitatively different types of solids.
Figure 4:
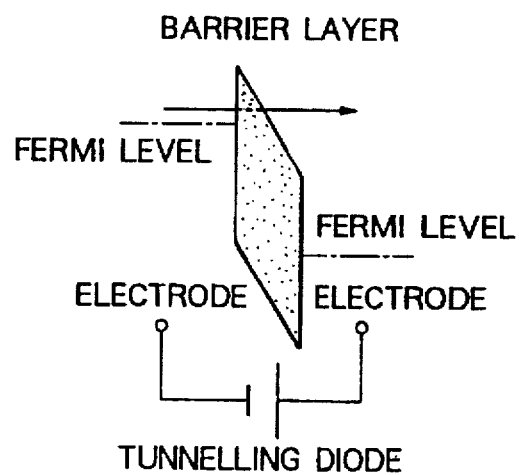
FIG. 4 is a diagram illustrating in a potential structure one example of the construction of a tunnel diode using a single barrier and embodying the present invention.
Figures 5A, 5B, 5C:
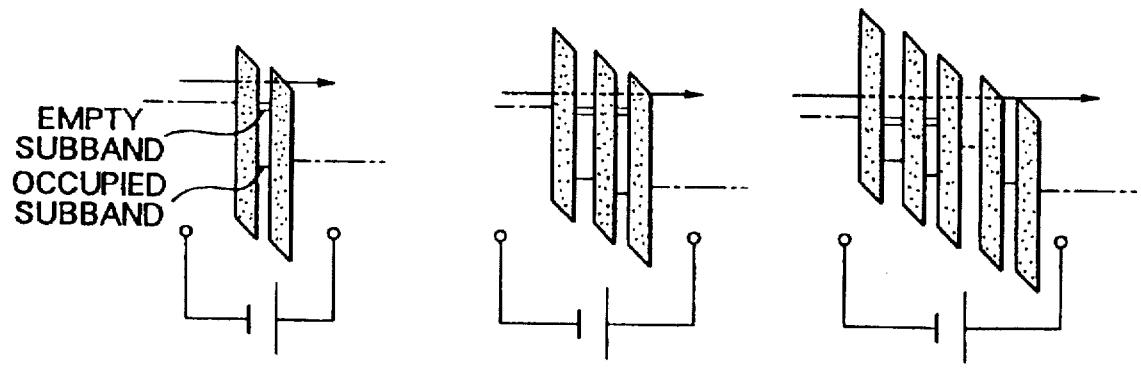
FIGS. 5(a), 5(b), 5(c), 6(a), 6(b), and 7 are diagrams illustrating in a potential structure examples of the construction of resonant tunnelling diode using a multiple barrier and embodying the present invention.
Figure 6A:
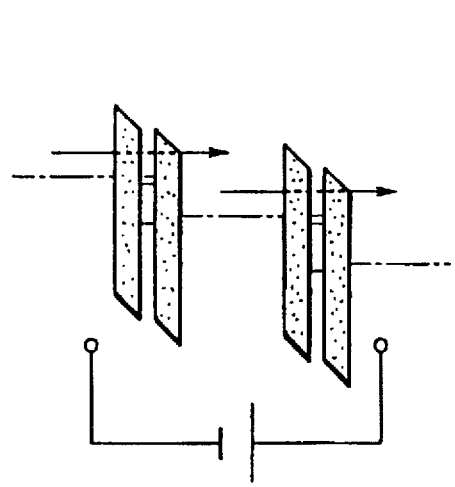
Figure 6B:
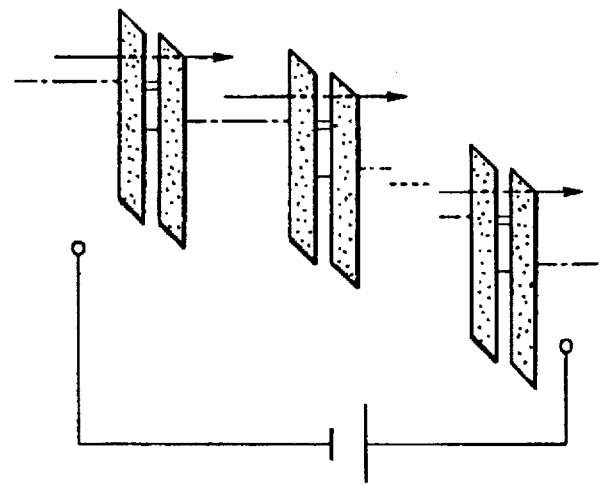
Figure 7:
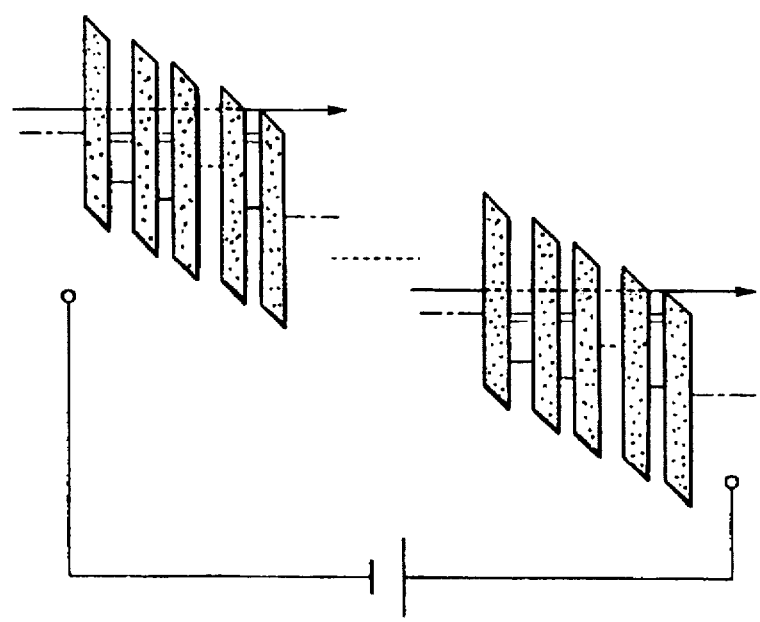
Figures 8A, 8B, 8C:
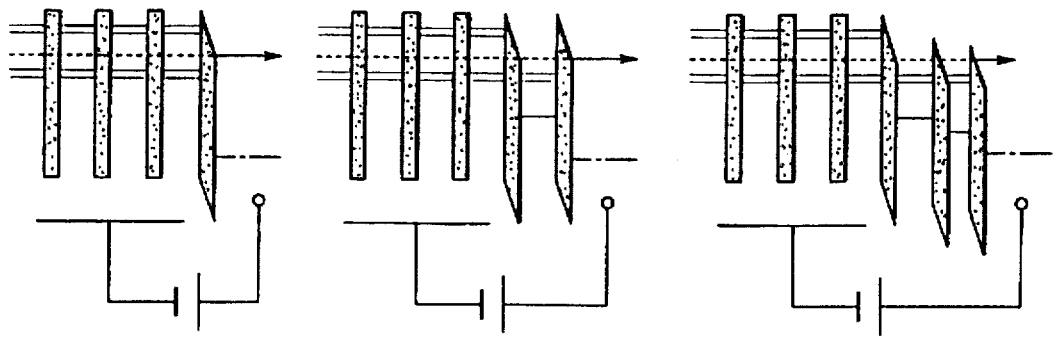
FIGS. 8(a), 8(b) and 8(c) are diagrams illustrating in a potential structure an example of the construction of a resonant tunnelling diode using a multiple barrier emitter and embodying the present invention.
Figure 9:
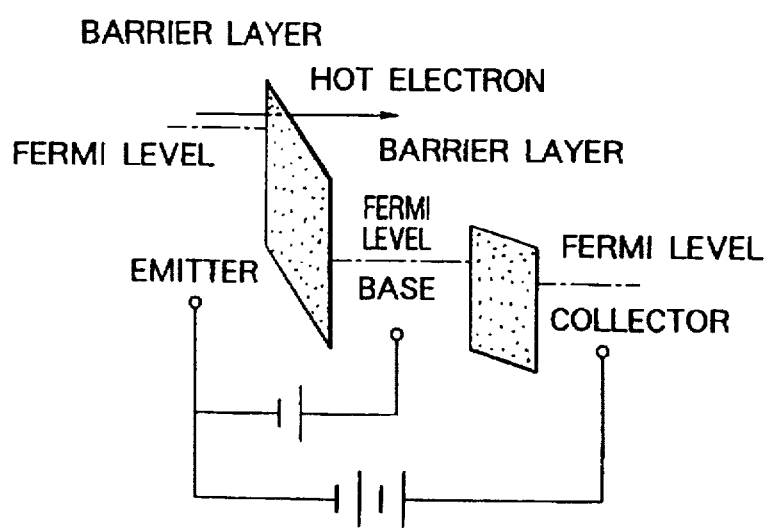
FIG. 9 is a diagram illustrating in a potential structure an example of the construction of a resonant tunnelling transistor using a single emitter barrier and embodying the present invention.
Figures 10A, 10B, 10C:
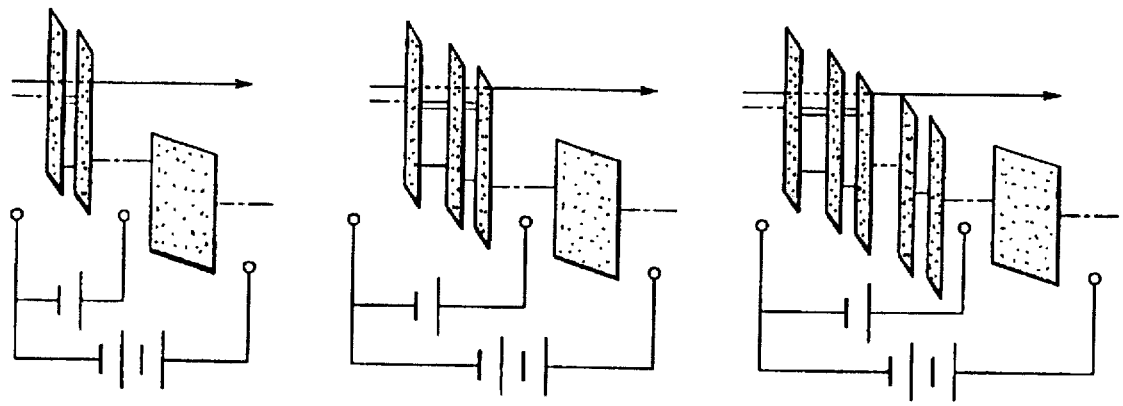
FIGS. 10(a), 10(b), 10(c), 11(a), 11(b), and 12 are diagrams illustrating in a potential structure examples of the construction of resonant tunnelling transistors using a multiple/emitter barrier and/embodying the present invention.
Figures 11A, 11B:
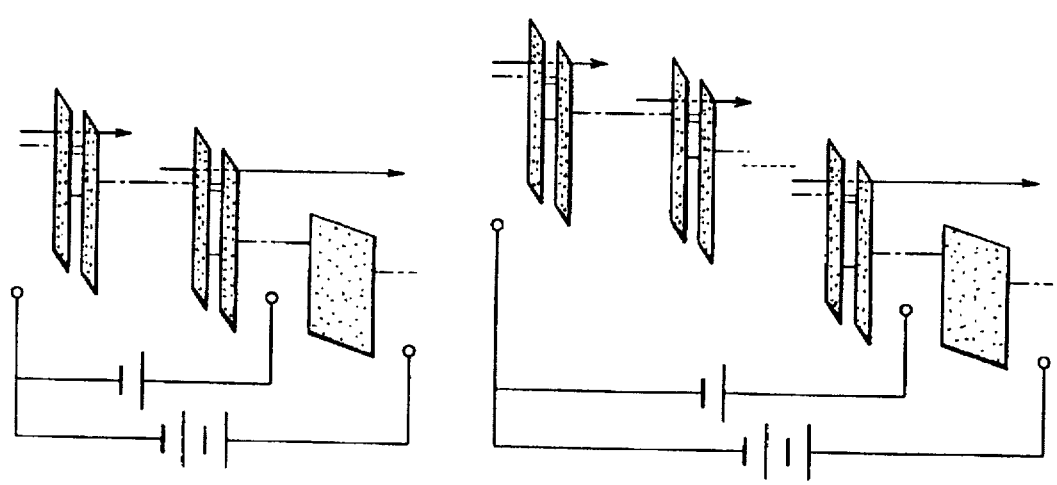
Figure 12:
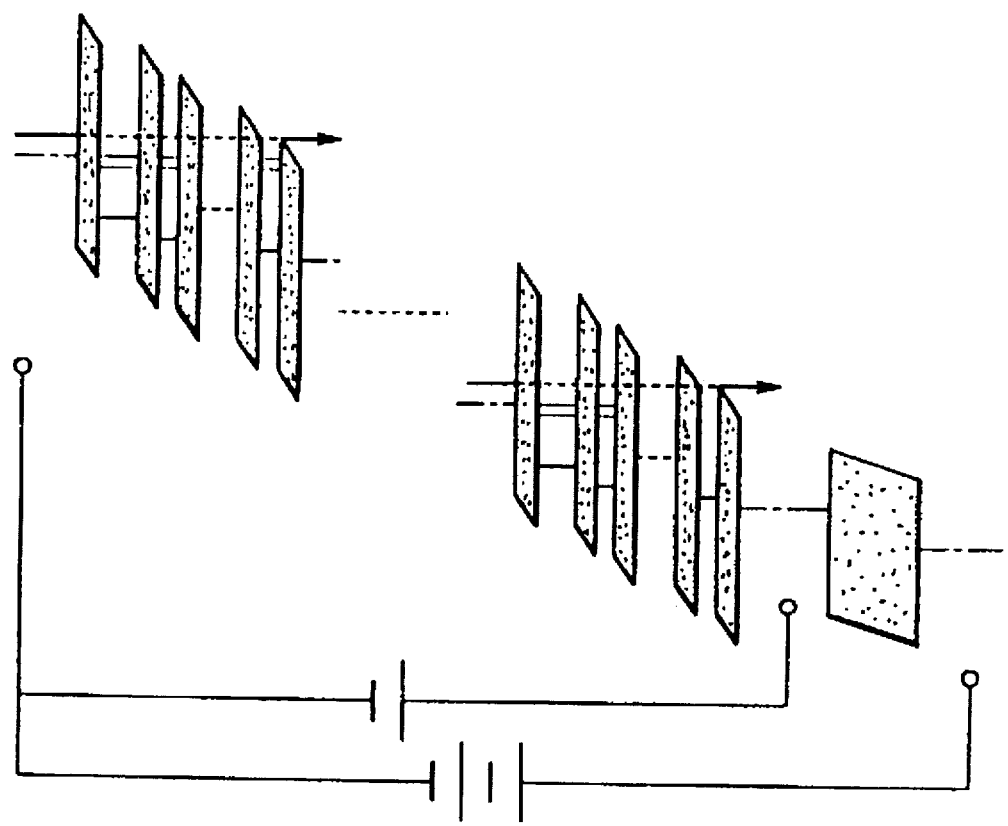
Figures 13A, 13B, 13C:
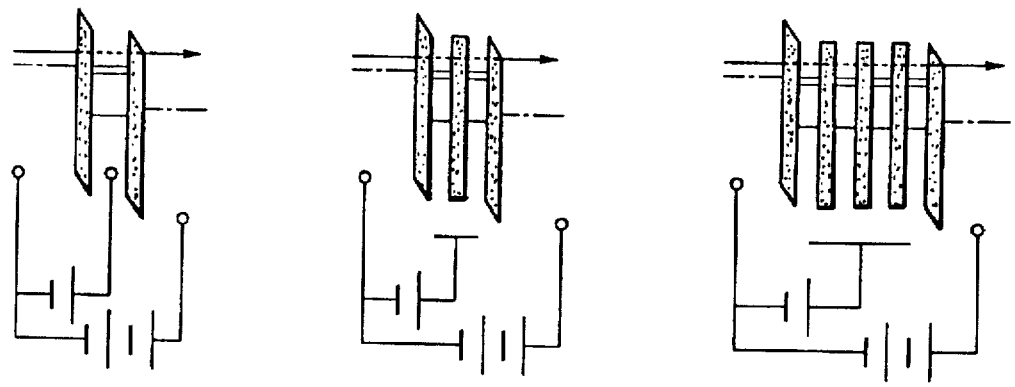
FIGS. 13(a), 13(b) and 13(c) are diagrams illustrating in a potential structure an example of the construction of a resonant tunnelling transistor using a single emitter barrier and a multiple barrier base and embodying the present invention.
Figures 14A, 14B, 14C:
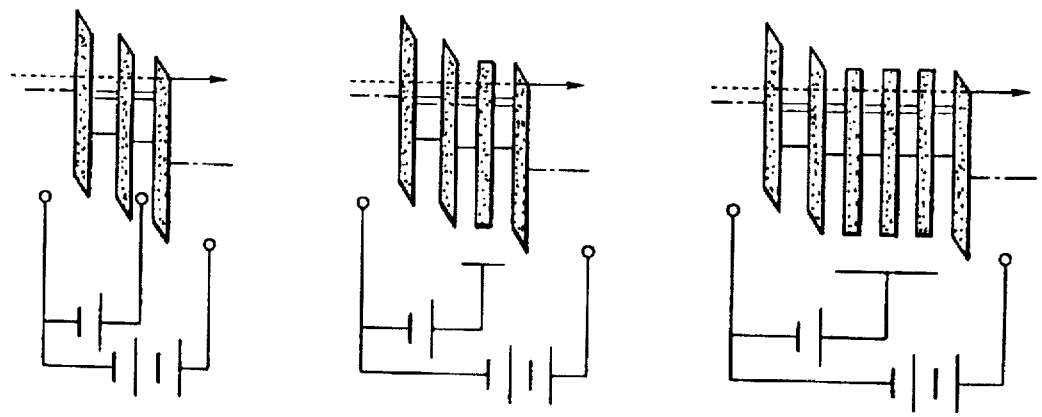
Figures 15A, 15B, 15C:
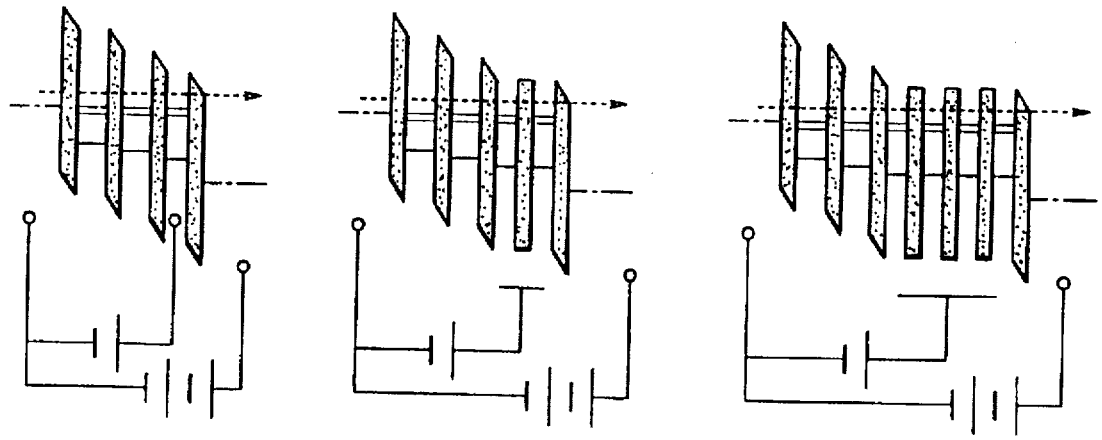
Figure 16:
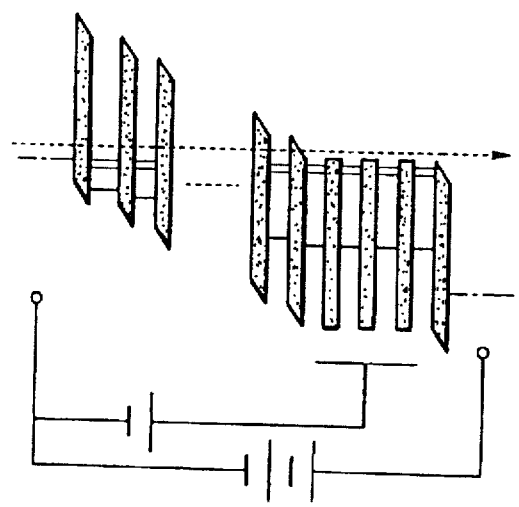
Figure 17A:
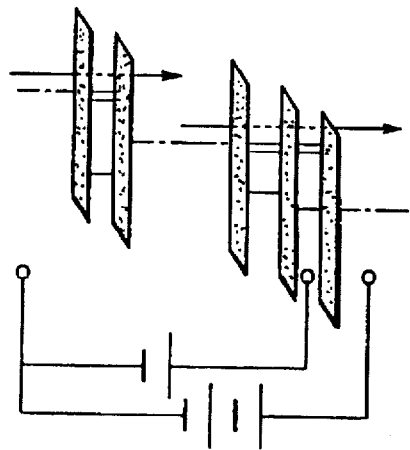
FIGS. 17(a), 17(b), 18(a), 18(b), 19(a), 19(b), 20, 21 and 22 are diagrams illustrating in a potential structure examples of the construction of resonant tunnelling transistors using a multiplicity of series of a multiple emitter and a multiple barrier base and embodying the present invention.
Figure 17B:
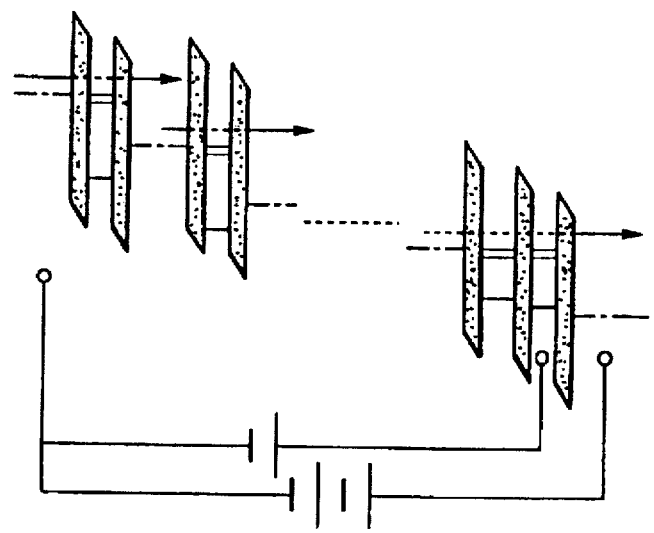
Figure 18A:
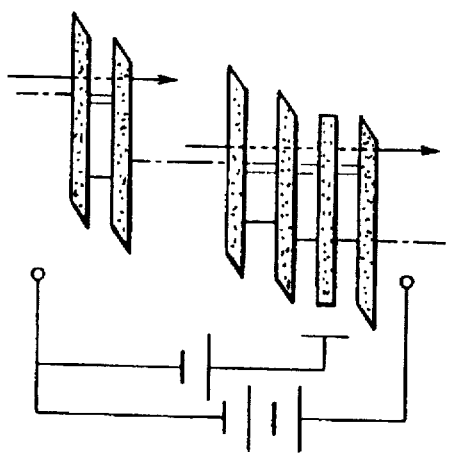
Figure 18B:
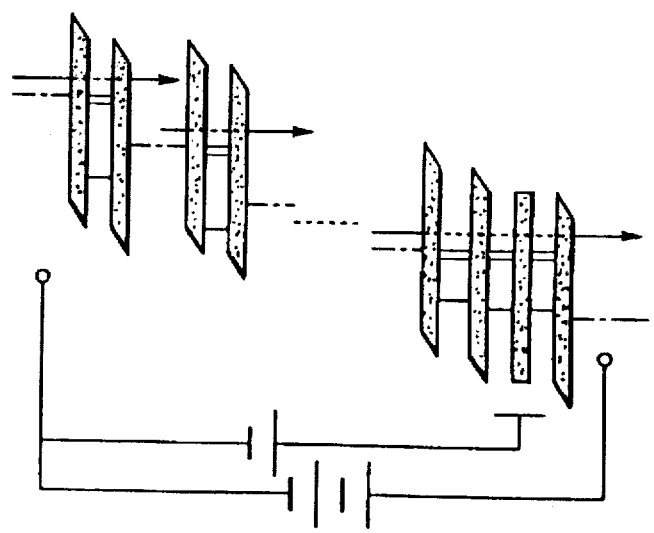
Figure 19A:
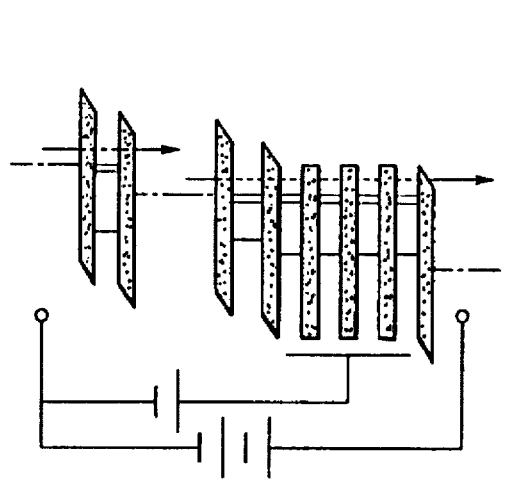
Figure 19B:
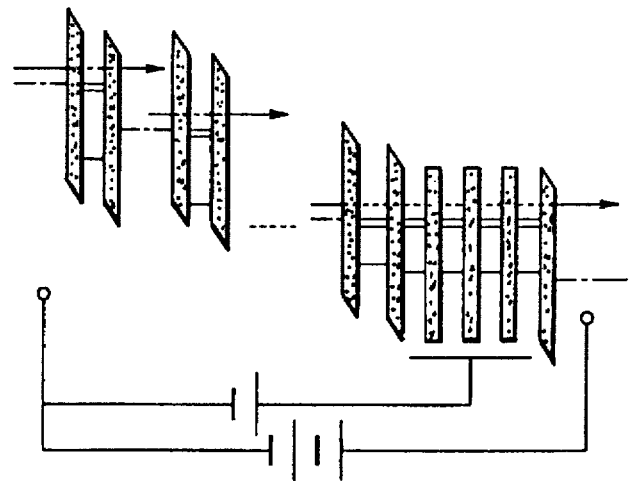
Figure 20:
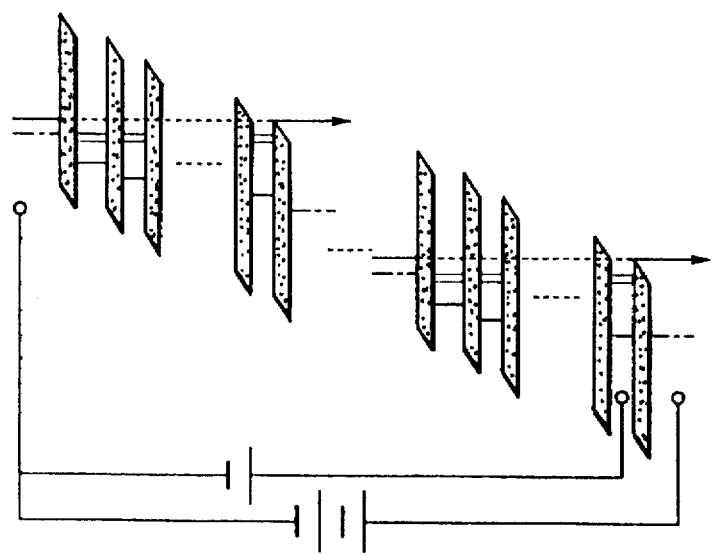
Figure 21:
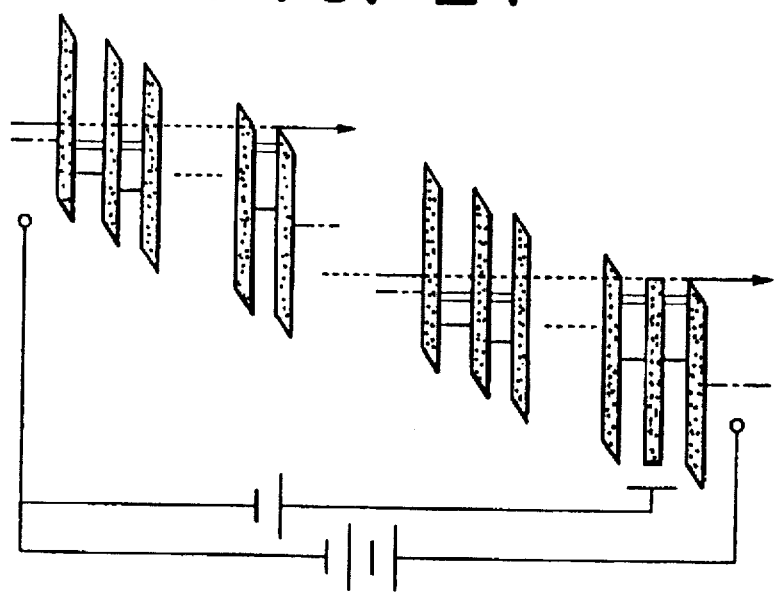
Figure 22:
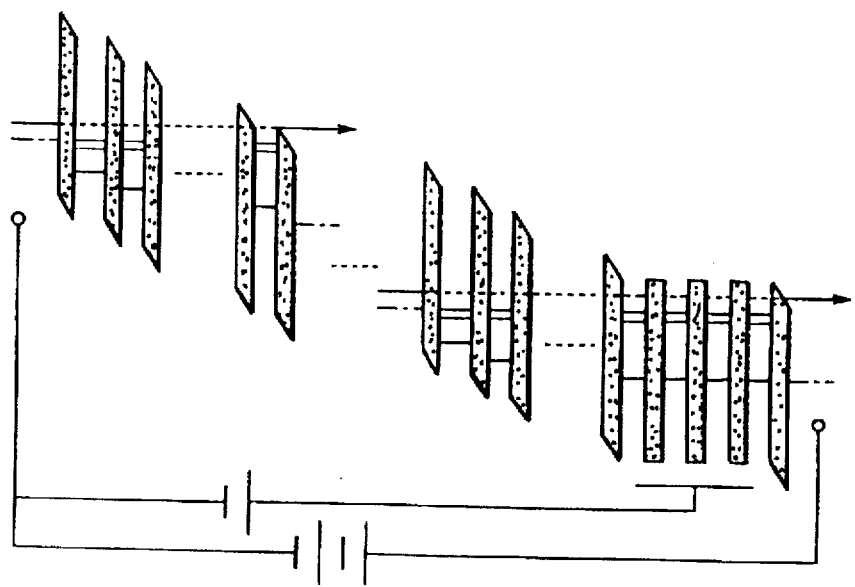
Figures 25A, 25B, 25C:
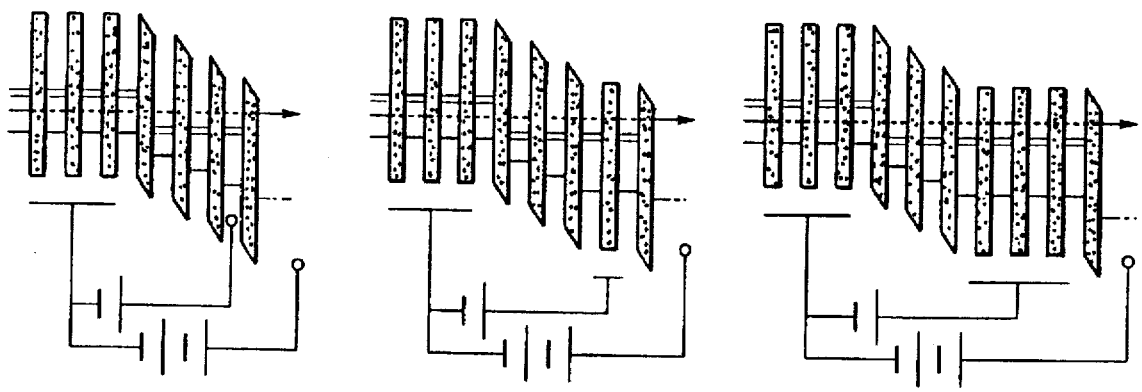
Figure 26:
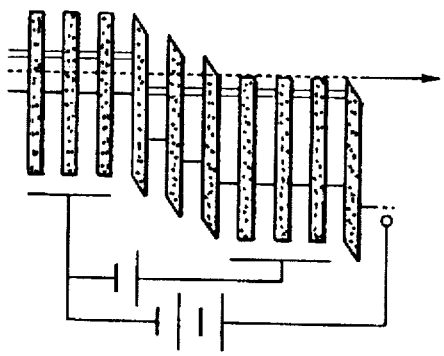
Figure 27A:
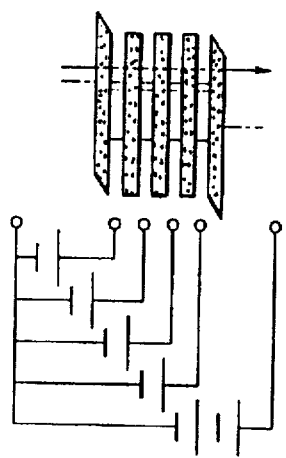
FIGS. 27(a), 27(b), 27(c), 28(a), 28(b), and 28(c) are diagrams illustrating in a potential structure examples of the construction of a resonant tunnelling transistor using a multiple base input and embodying the present invention.
Figure 27B:
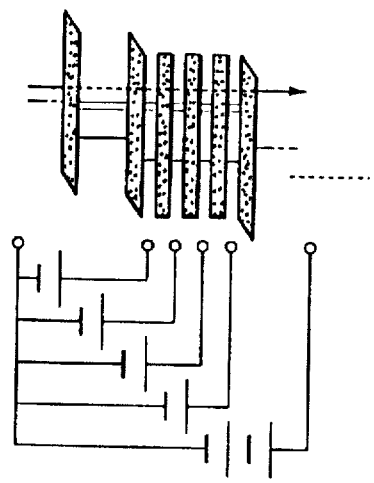
Figure 27C:
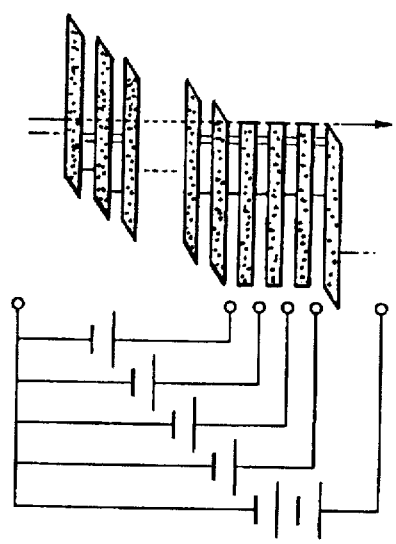
Figure 28A:
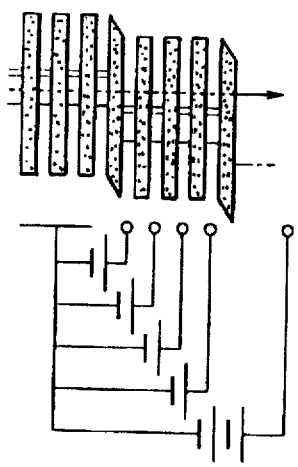
Figure 28B:
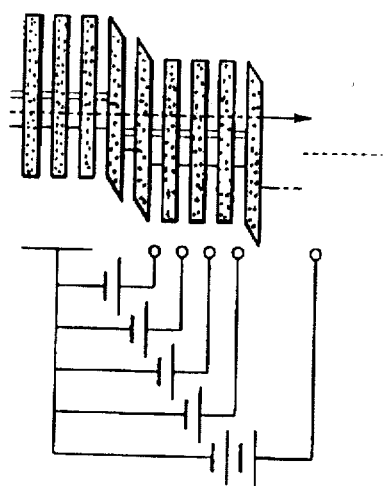
Figure 28C:
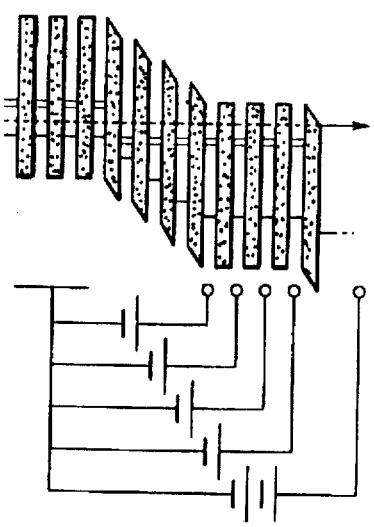
Figure 29:
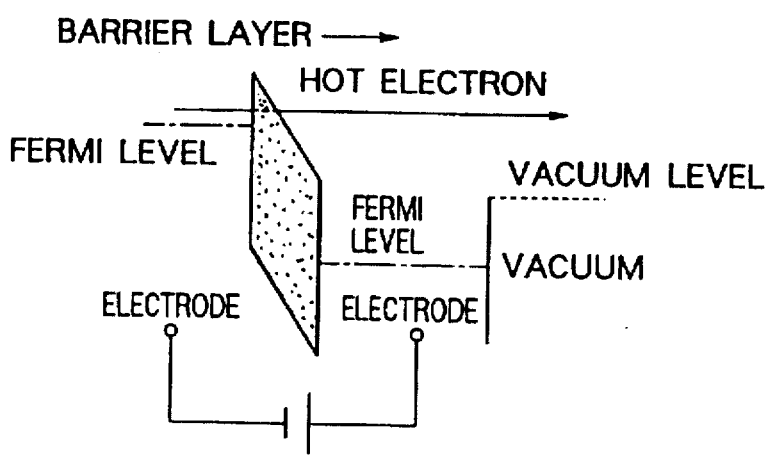
FIG. 29 is a diagram illustrating in a potential structure an example of the construction of a vacuum emitter element using a single barrier and embodying the present invention.
Figures 30A, 30B, 30C:
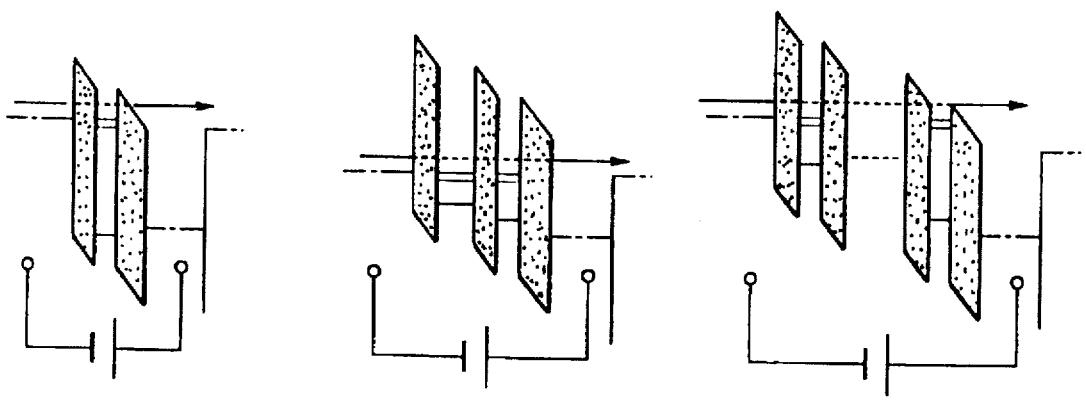
FIGS. 30(a), 30(b), and 30(c) are diagrams illustrating in a potential structure an example of the construction of a vacuum emitter element using a multiple barrier and embodying the present invention.
Figure 31A:
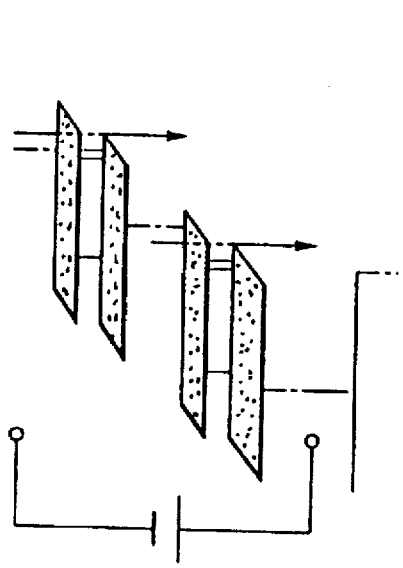
FIGS. 31(a), 31(b) and 32 are diagrams illustrating in a potential structure examples of the construction of a vacuum emitter element using a multiplicity of series of multiple barrier and embodying the present invention.
Figure 31B:
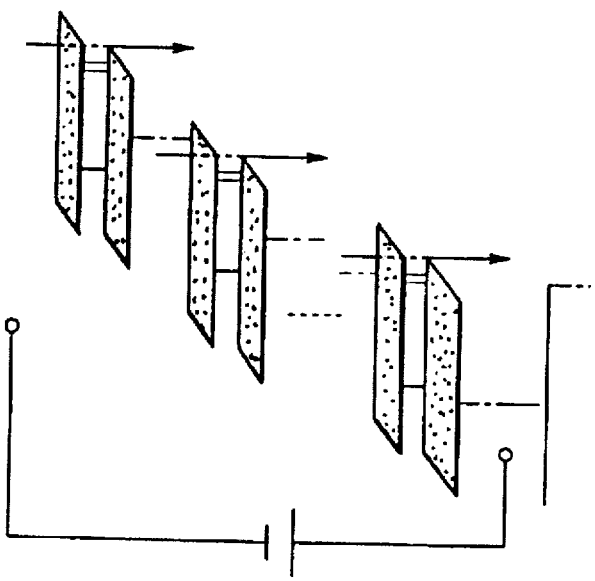
Figure 32:
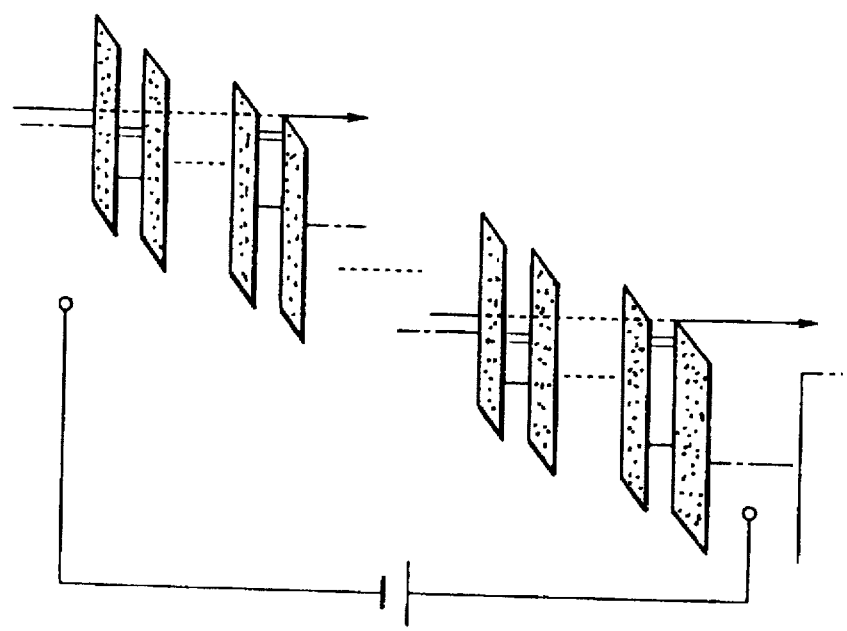
Figures 33A, 33B, 33C:
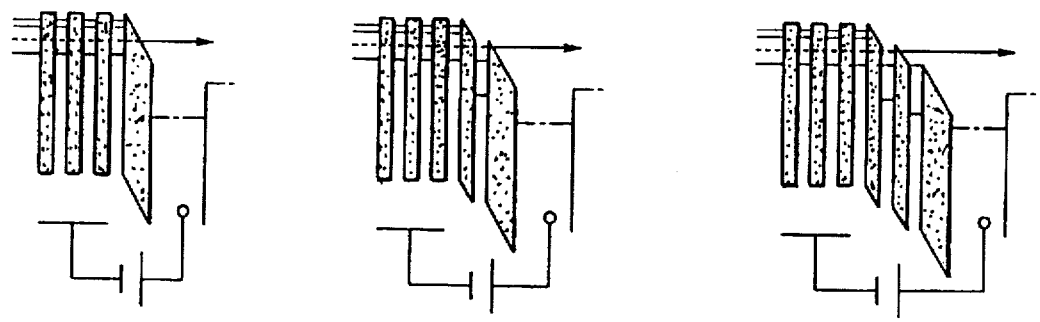
FIGS. 33(a), 33(b) and 33(c) are diagrams structure an example of the construction of a vacuum emitter element using a multiplicity of series of a barrier emitter and embodying the present invention.
Figures 34A, 34B, 34C:
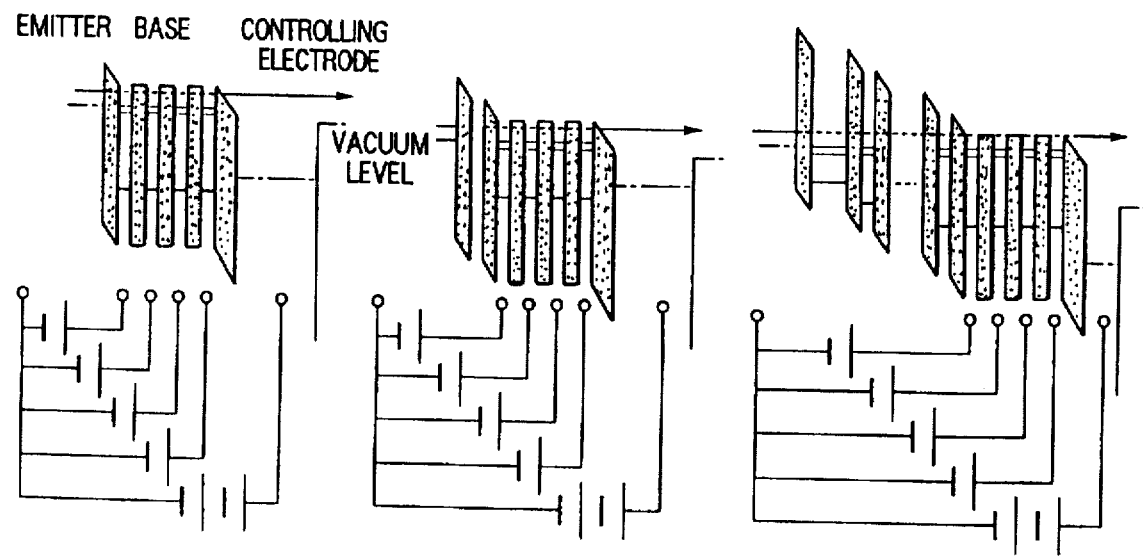
FIGS. 34(a), 34(b), 34(c), 35(a), 35(b) and 36 are diagrams illustrating in a potential structure examples of the construction of a vacuum emitter element using a multiple base input and embodying the present invention.
Figure 35A:
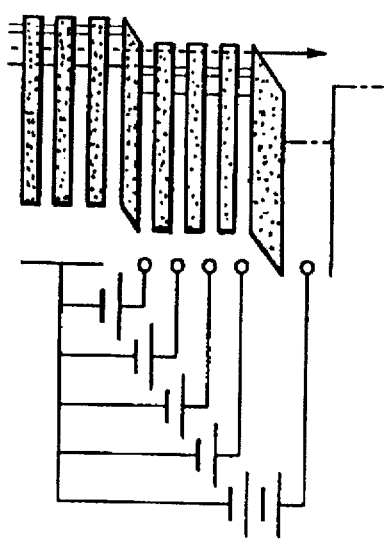
Figure 35B:
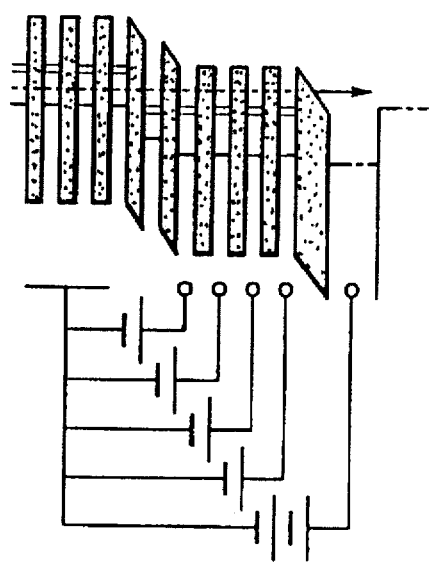
Figure 36:
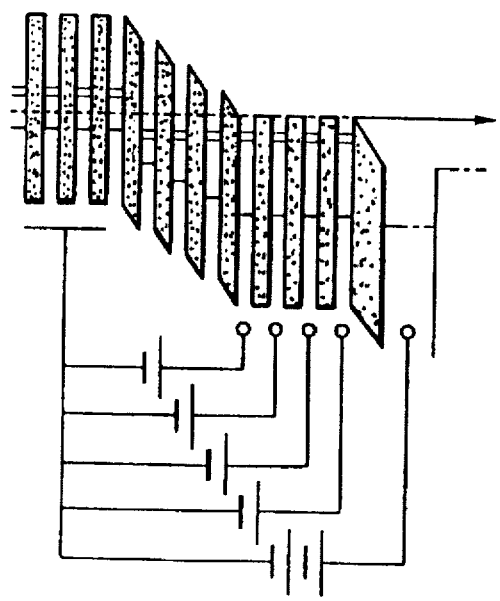
Figure 37:
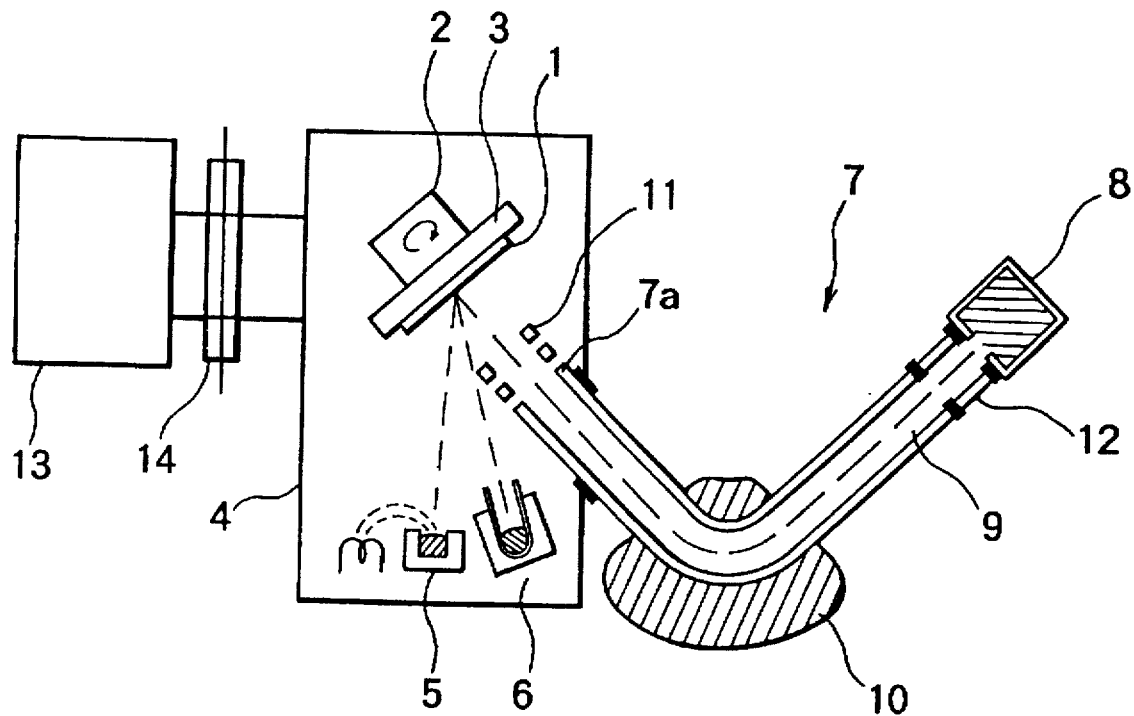
FIG. 37 is a diagram illustrating in the form of a model the construction of a composite beam device used in a working example of the present invention.

An artificial super lattice was manufactured by the use of a composite beam device constructed as schematically illustrated in FIG. 37 and adapted to utilize a low energy ion beam and a molecular beam from a Knudsen cell and an electron beam heating vacuum deposition source under an ultra-high vacuum of not more than $10^{-8}$ Torr. In the composite beam device illustrated in FIG. 37, a substrate 1 is retained by means of a substrate-retaining and -heating mechanism 3 provided with a substrate-rotating mechanism 2 and is set in place inside an ultra-high vacuum film deposition chamber 4. Inside the ultra-high vacuum film deposition chamber 4 are disposed an electron beam heating vacuum deposition source 5 and a Knudsen cell 6. A low energy ion beam irradiation device 7 has an injection port 7a opened in the direction of the substrate 1. An ion beam source 8 is of a plasma filament type adapted to allow mutually independent supply of a cover gas near a filament and a source gas so as to ensure use of such an active source gas as oxygen. An ion beam line 9 has inserted therein a sector magnet type mass separating device 20 adapted to select only the ion aimed at. Directly in front of the substrate is set in place a decelerating electrode 11 for lowering the ion energy to below a level at which the substrate for deposition is not impaired by the ion energy. In the diagram, 12 stands for an extracting electrode, 13 for a sample preparing chamber, and 14 for a gate valve.

Figure 38A:
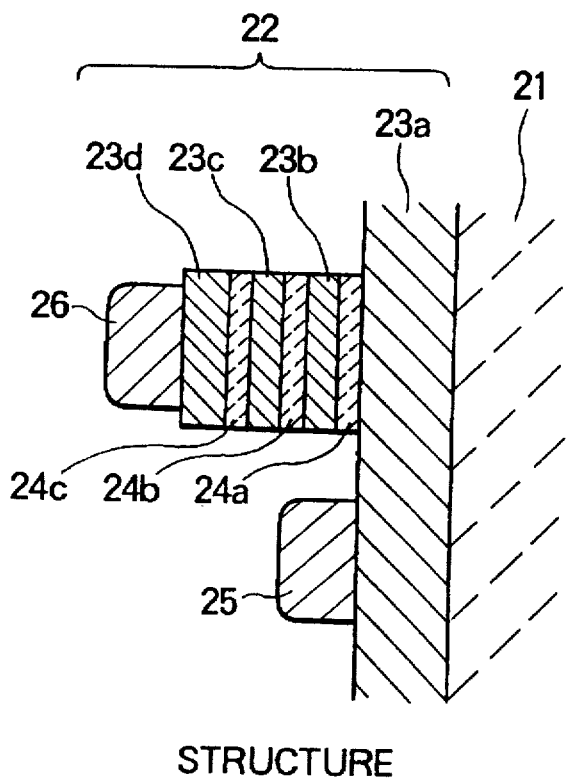
FIG. 38(a) is a structural diagram of a resonant tunneling diode manufactured in a working example of the present invention.

In the composite beam device, the electron beam heating vacuum deposition source 5 was packed with Ti and the Knudsen cell 6 with Al and, at the same time, nitrogen was used as the ion beam source 8 to manufacture a resonant tunnelling diode which was constructed as illustrated in FIG. 38(a). First, on a MgO (111) substrate 21 which had been polished and then moderately etched with phosphoric acid, a TiN/AlN artificial super lattice 22 possessed of a triple barrier structure was formed. Specifically, the structure consisted in MgO 21/TiN 23a (300 nm)/AlN 24a (1.5 nm)/TiN 23b (2.4 nm)/AlN 24b (1.5 nm)/TiN 23c (2.1 nm)/AlN 24c (1.5 nm)/TiN 23d (15 nm). The film deposition conditions for TiN and AlN were as shown in Table 3.

TABLE 3

| Material | Film deposition conditions | | Duration of irradiation |
|---|---|---|---|
| TiN | Substrate temperature: 500° C. | | |
| | Ti: Electron beam heating molecular beam | | |
| | Film deposition speed | 0.02 nm/s | 10 seconds |
| | N: $N_2^+$ ion beam | | |
| | Acceleration energy | 30 eV | |
| | Beam current | 40 µA/cm$^2$ | 15 seconds |
| AlN | Substrate temperature: 500° C. | | |
| | Al: Molecular beam for use in Knudsen cell | | |
| | Film deposition speed | 0.02 nm/s | 10 seconds |
| | N: $N_2^+$ ion beam | | |
| | Acceleration energy | 30 eV | |
| | Beam current | 40 µA/cm$^2$ | 15 seconds |

Figure 38B:
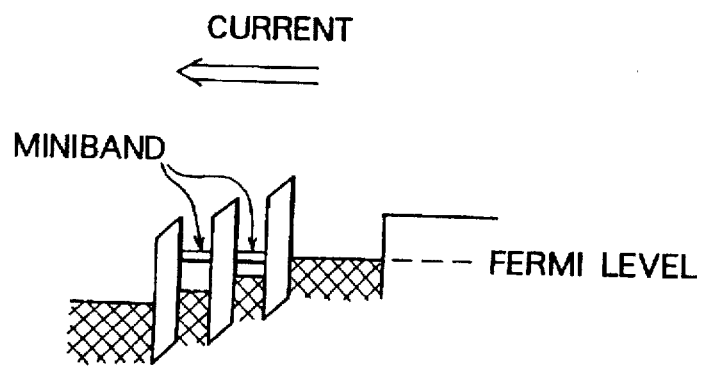
FIG. 38(b) is a potential diagram of the resonant tunneling diode.

During the formation of a TiN film, a process of irradiating the substrate with a Ti molecule beam at a rate of 0.02 nm/s for 10 seconds and then with a nitrogen ion beam at a bean current rate of 40 µA/cm$^2$ for 15 seconds was repeated until the deposited compound reached a prescribed film thickness. The formation of AlN film was carried out by following the same procedure using an Al molecule beam and a nitrogen ion beam. As a sample, a mesa diode 10 µm in diameter was secured by etching. An Al electrode 25 was formed on the TiN electrode 23a and an Al electrode 26 on the TiN 23d on the element side, both on the substrate. The potential structure of the aforementioned resonant tunnelling diode is illustrated in FIG. 38(b).

Figure 39:
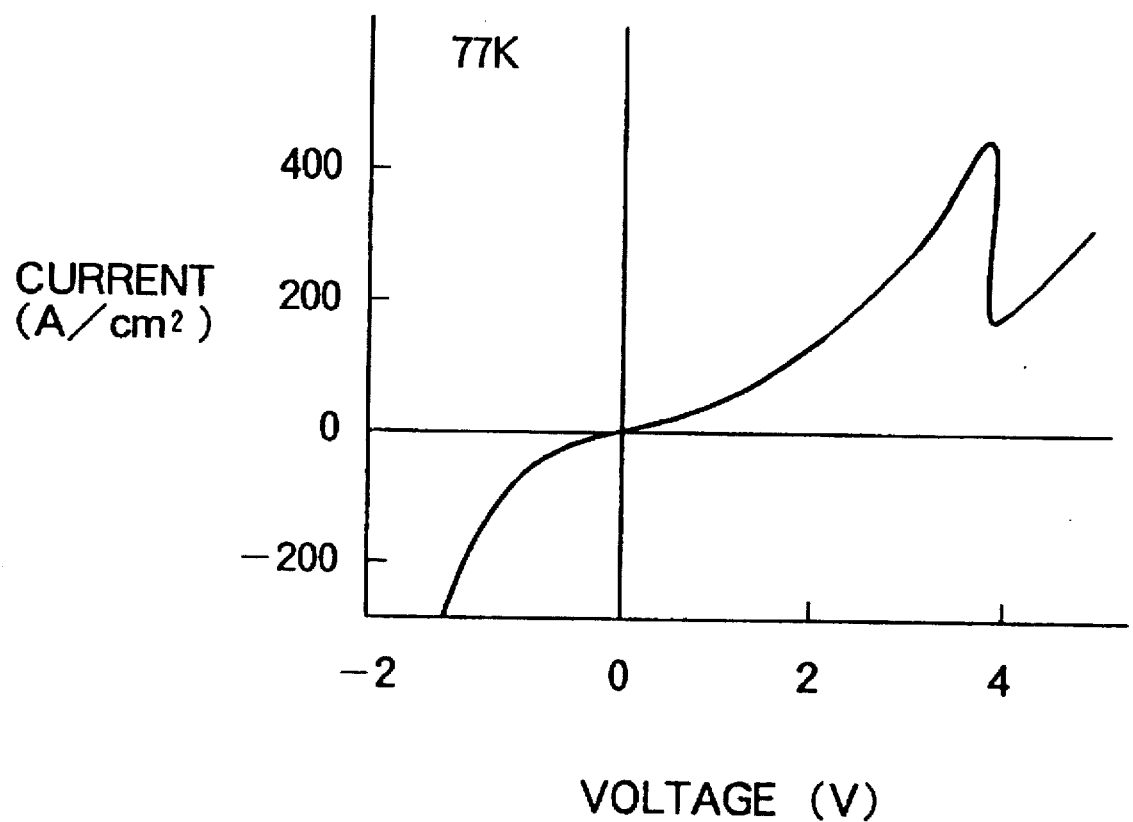
FIG. 39 is a diagram showing the current-voltage characteristics of a resonant tunnelling diode manufactured in a working example of the present invention.

In the reflective high energy electron diffraction analysis performed on the TiN surface and AlN surface of the artificial super lattice in process of formation, the TiN (111) surface and the AlN (001) surface were observed to sustain peculiar reflection spots both in a streaking pattern, indicating that the aforementioned process produced a flat and smooth single crystal film. When the produced diode was tested for electrical properties, the current-voltage characteristics shown in FIG. 39 were obtained. The data indicate that the diode manifested such a conspicuous negative resistance as was evinced by a current peak/valley ratio of 2.5 at 77K. The results support a conclusion that a quantum effect demonstrating two-dimensionality of electrons definitely manifested.

EXAMPLE 2

Figure 40:
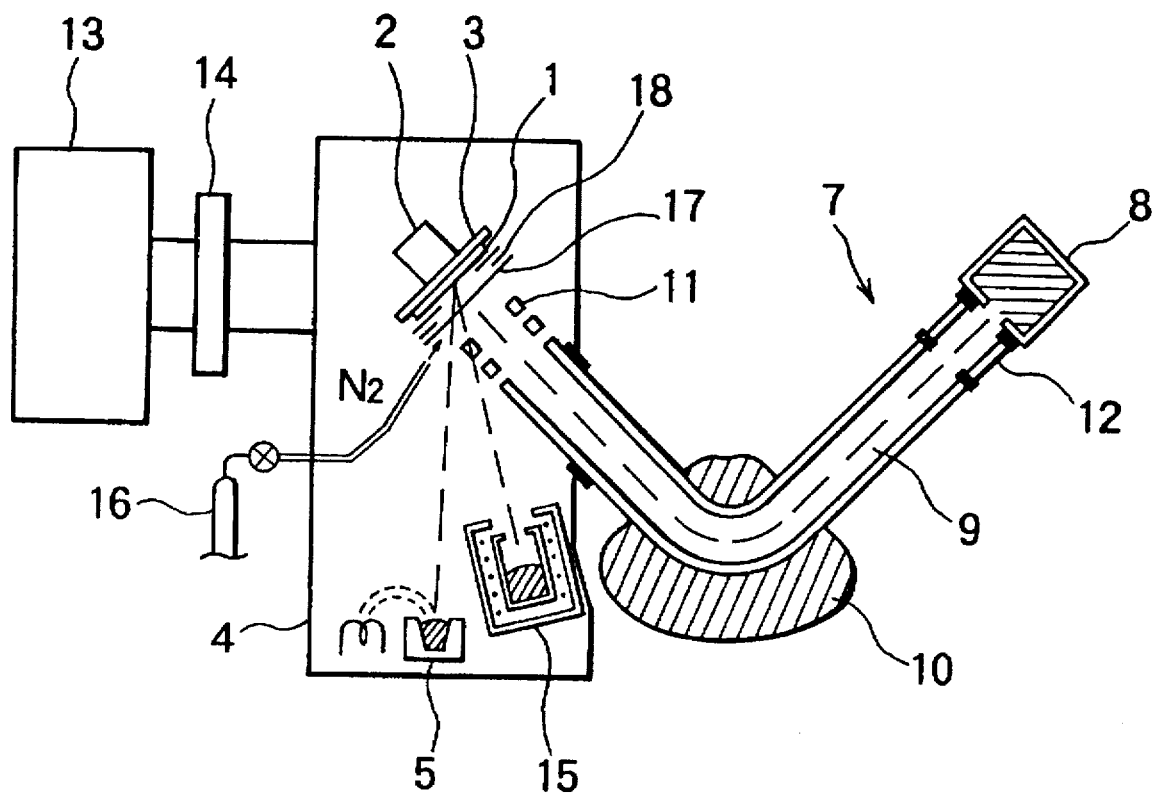
FIG. 40 is a diagram illustrating in the form of a model the construction of a composite beam type film deposition device used in another working example of the present invention.

An artificial super lattice was manufactured by the use of a composite beam type film deposition device constructed as illustrated in FIG. 40 and adapted to use a low energy ion beam, an ionized cluster beam, and a molecule beam from an electron beam heating vaporization source under an ultra-high vacuum of not more than $10^{-8}$ Torr. The composite beam type film deposition device illustrated in FIG. 40 was identical in construction to that of FIG. 37, excepting an ionized cluster beam source 15 using a crucible fitted with a nozzle 1 to 2 mm in diameter was installed in the place of the Knudsen cell. In the diagram, 16 stands for a nitrogen source to be used during the formation of a film by the use of an ionized cluster beam.

First, a MgO substrate 1 was installed inside a film deposition chamber 4, an electron beam heating vaporization source 5 was charged with Ti, and the crucible of the ionized cluster beam source 15 was charged with Al. A vacuum pump omitted from illustration was set operating to evacuate the film deposition chamber 4 to a degree of vacuum on the order of $10^{-11}$ Torr and, at the same time, evacuate an ion beam line 9 and the housing of an ion source 8 to a degree of vacuum on the order of $10^{-9}$ Torr. Then, the substrate 1 was heated to and maintained at 200° C.

Then, the substrate 1 was shielded with a shutter 17, the housing of the ion source 8 was supplied with nitrogen as a source gas, and the filament was energized to form a plasma. From the plasma, a beam was drawn out by an extracting electrode 12 and a $N_2^+$ beam species was exclusively analyzed by a sector magnet type mass separating device 11. The beam species was decelerated just in front of the substrate 1 and left impinging on the shutter 17 and meanwhile the beam orbit was adjusted. The electron beam generated by energizing the filament was deflected by an electromagnetic field, with the result that the Ti held inside the electron beam heating vaporization source 5 was fused and vaporized. The shutter 17 was opened to allow deposition of the Ti vapor on the substrate 1 at a rate of 4 nm/min and, at the same time, the substrate was irradiated with a nitrogen ion beam to permit growth of a thin film of single crystal TiN to a thickness of 2.4 nm thereon.

Then, the substrate 1 was again shielded with the shutter 17 and the filament for bombardment in the ionized cluster beam source 15 was energized and consequently caused to emit heat. The Al in the crucible was heated with the radiant heat and the thermoelectron emanating from the filament. When the temperature of the Al was elevated to a level above 1,500° C. at which the vapor pressure of Al inside the crucible rose to a level in the range of 0.1 to 10 Torrs, the Al vapor spouted out of the nozzle of the crucible. The Al vapor was adiabatically inflated by the pressure difference between the crucible and the film deposition chamber 4 and consequently enabled to form a cluster of atomic groups formed of numerous loosely bound Al atoms. The cluster was drawn out by a grid electrode disposed in the upper part of the crucible. This cluster, on colliding against the thermo-electron discharged from the ionizing filament, had part thereof ionized into a ionized cluster. The ionized cluster was moderately accelerated by an electric field between an accelerating electrode and the grid electrode and deposited together with a neutral cluster which had escaped the ionization and was still retaining the kinetic energy produced during the process of spouting. At this time, it was desirable to set the ionizing electron current of the ionizing filament at a level in the range of 100 to 500 mA and the accelerating voltage between the accelerating electrode and the grid electrode at a level in the range of 3 to 5 kV.

Subsequently, the gas feed pipe of a nitrogen cylinder 1 was opened to supply nitrogen to the substrate 1 and its vicinity. The shutter 17 was then opened to effect deposition of the vapor of Al at a rate of 2 nm/min. At this time, a mask 18 provided with an opening of prescribed dimensions was interposed between the substrate 1 and the substrate shutter 17 to form on the thin film of single crystal TiN crowning the substrate 1 a thin film of single crystal AlN 1.5 nm in thickness in dimensions commensurate with the opening mentioned above.

Thereafter, by closing the valve of the gas feed pipe of the nitrogen cylinder 16, again evacuating the film deposition chamber 4 to a degree of vacuum on the order of $10^{-11}$, and closing the substrate 1 with the shutter 17 again, a thin film of TiN was formed under the same conditions as those used for the formation of the thin film of TiN mentioned above.

Another mask fitted with an opening of dimensions smaller than those of the former mask was interposed between the substrate 1 and the substrate shutter 17 and used to form on the thin film of single crystal AlN crowning the substrate 1 a thin film of single crystal TiN in dimensions commensurate with the opening mentioned above.

As a result, a resonant tunnelling diode provided with an artificial super lattice and constructed similarly to that of Example 1 was produced. In the reflective high speed energy electron diffraction analysis performed on the TiN surface of the artificial lattice membrane in process of formation, the TiN (111) surface and the AlN (001) surface were observed to sustain peculiar reflection spots both in a streaking pattern, indicating that the aforementioned process produced a flat and smooth single crystal film. The produced diode was tested for electrical properties. The results support a conclusion that a quantum effect demonstrating two-dimensionality of electrons manifested definitely.

EXAMPLE 3

Figure 41:
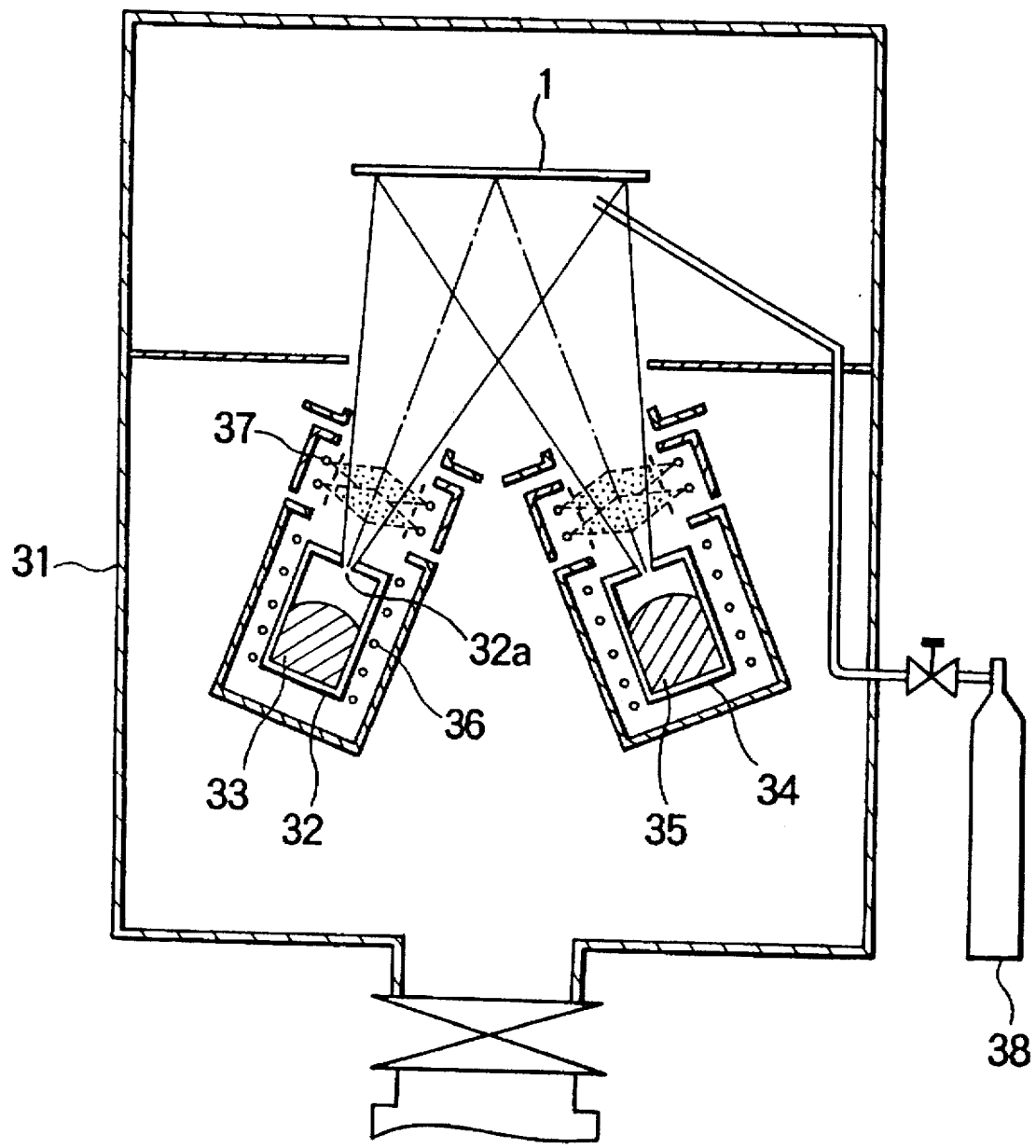
FIG. 41 is a diagram illustrating in the form of a model the construction of an ionized cluster beam film deposition device used in still another working example of the present invention.

An artificial super lattice was produced by the use of an ionized cluster beam film deposition device constructed as illustrated in FIG. 41. First, a MgO substrate 1 was set in place inside a film deposition chamber 31 illustrated in FIG. 41 and, at the same time, a first crucible 32 was charged with a Ti powder 33 having a purity of 99.9% and a second crucible 34 was charged with an Al powder 35 having a purity of 99.9%. Then, a vacuum pump which is omitted from illustration herein was set operating to expel the entrapped air from within the film deposition chamber 31 and evacuate the chamber 31 to a degree of vacuum of $1\times10^{-11}$ Torr and then the MgO substrate was heated to and maintained at 200° C.

Then, a first filament 36 for bombardment was energized and consequently made to emit heat. The Ti powder 33 held inside the first crucible 32 was heated with the radiant heat and thermo-electron emanating from the filament 36. When the temperature of the first crucible 32 was elevated to a level above 2,000° C., the vapor of Ti was spouted out of a nozzle 32a 2 mm in diameter disposed in the upper part of the crucible 32. This Ti vapor was diabatically inflated by the pressure difference between the first crucible 32 and the film deposition chamber 31 to produce a cluster of atomic groups formed of numerous loosely bound Ti atoms. The cluster was drawn out by the grid electrode disposed in the upper part of the first crucible 32. This cluster, on colliding against the thermoelectrons discharged from an ionizing filament 37, had part thereof ionized into an ionized cluster. The ionized cluster was moderately accelerated by an electric field formed between the heating electrode and the grid electrode. The accelerated ionized cluster and a neutral cluster which had escaped the ionization and was still retaining the kinetic energy generated during the spouting together collided against the surface of the substrate 1. The clusters migrated on the surface of the substrate and formed a thin film of Ti thereon. In this case, it was desirable to set the ionizing electron current of the ionizing filament 37 at a level in the range of several mA to 400 mA and the accelerating voltage between the accelerating electrode and the grind electrode at a level in the range of 1 to 6.6 kV.

Then, the gas feed pipe of a nitrogen cylinder 38 was opened to supply nitrogen to the substrate 1 and its vicinity. The partial pressure of nitrogen around the substrate 1 was adjusted to a level in the approximate range of $2\times10^{-4}$ Torr to $1\times10^{-3}$ Torr. Then, by setting the ionizing electron current at 400 mA and the accelerating voltage between the accelerating electrode and the grid electrode at 5 kV, a thin film of single crystal TiN was formed.

Subsequently, a thin film of single crystal AlN was formed in the same manner as in Example 2. By repeating the procedure described above, an artificial super lattice having thin films of TiN and thin films of AlN alternately superposed on the MgO substrate was formed. The artificial super lattice thus obtained exhibited similar properties as those of the product of Example 2.

EXAMPLE 4

Figure 42:
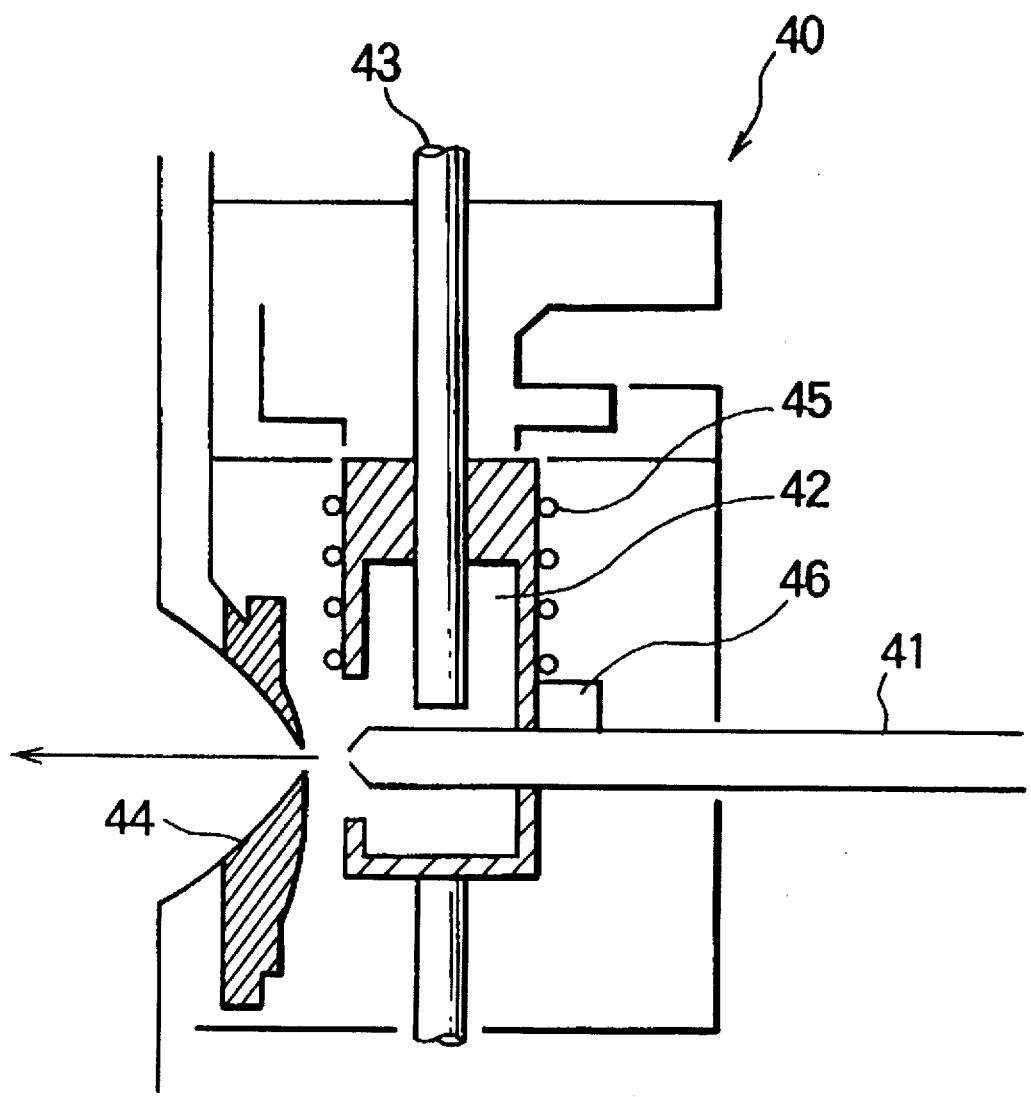
FIG. 42 is a diagram illustrating in the form of a model the construction of a microwave heating beam source used for the manufacture of a radical nitrogen beam in a working example of the present invention.

An artificial super lattice was produced by the use of nitrogen radical. FIG. 42 illustrates a microwave heating beam source 40 which was used for the production of the nitrogen radical. This microwave heating beam source 40 was composed mainly of an Evenson type microwave cavity and a discharge tube provided with a nozzle port.

In FIG. 42, 41 stands for a discharge nozzle tube, 42 for a microwave cavity, 43 for a tuning electrode, 44 for a skimmer, 45 for a water cooling tube, and 46 for a microwave power connector. In order to operate inside the vacuum chamber, the microwave cavity 42 is adapted to be cooled with water and the electrode for adjusting this cavity 42 is adapted to be adjusted from outside the vacuum chamber through the medium of an axial change gear. The microwave is introduced into the microwave cavity 42 by means of a heatproof coaxial cable. The discharge tube 41 is a quartz tube 5 mm in outside diameter. It may be made of an alumina tube which excels in proofness against heat and corrosion. The nitrogen gas supplied to the discharge tube 41 is excited or dissociated within the tube and spouted in the form of a beam out of the nozzle.

The discharge is obtained with high efficiency when the input of microwave reaches a level in the approximate range of 60 to 80 W. If the output exceeds 100 W, however, the tube made of quartz suffers a decrease of service life and sustains deformation due to local breakage and softening. The nitrogen gas is introduced at a fixed volume by a mass flow controller. The flow volume of the nitrogen gas can be adjusted within the range of 0 to 50 CCM. The vacuum chamber as a beam source can be evacuated by means of a booster pump having a capacity of 150 l/s. The orifice of the nozzle has a diameter of 0.3 mm and a skimmer 44 has a diameter of 0.7 mm. The distance between the nozzle and the skimmer, though variable, is basically fixed at 3 mm. The pressure at the stagnation temperature is about 20 Torrs.

When the plasma gas excited by an arc discharge is spouted out of the nozzle as a result, a metastable radical nitrogen is obtained because of the following reaction involving $N_2^+$ or $N_2^*$ which is present in the gas.

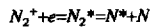

This reaction is just one example. Actually the substance which is spouted out of the discharge plasma contain various excited atoms and molecule. The total amount of these substances is very small. Less than 1% of the substances so spouted out has been converted into relevant radicals.

Figure 43:
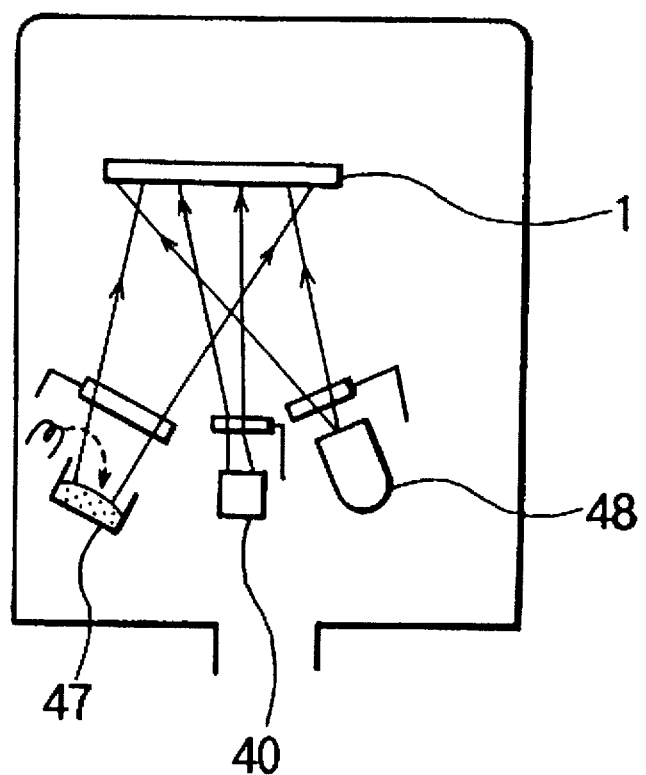
FIG. 43 is a diagram illustrating in the form of a model the construction of a film deposition device using a microwave heating beam source shown in FIG. 42.

Then, TiN films and AlN films were alternately produced by concurrently using a radical nitrogen beam produced by the use of the aforementioned microwave heating beam source 40, a Ti beam originating from an electron beam vacuum deposition source (EB source) 47, and an Al molecular beam emanating from a Knudsen cell 48 as illustrated in FIG. 43. The thicknesses of these films were controlled by the combined use of a film thickness monitor and a shutter. Thus, five cycles each of TiN (2.1 nm)/AlN (1.5 nm) were deposited on the MgO (111) substrate and, in the meantime, the films severally during the progress of their deposition were subjected to a reflective high speed energy electron diffraction analysis. It was consequently found that the vacuum deposition produced flat layers each clearly sustaining a reflection spot trailing a streak. The artificial super lattice consequently obtained exhibited the same characteristics as those of the product of Example 2.

EXAMPLE 5

An artificial super lattice was produced with VN as a compound of good conductivity and AlN as an insulating compound. As raw material gases, $V(C_5H_5)_2$ and $Al(CH_3)_3$ were used. To a MgO (111) substrate which had been polished and etched in an aqueous 85% $H_3PO_4$ solution for 30 seconds and was being heated at 200° C., the two gases mentioned above and $NH_3$ gas were introduced to effect deposition of relevant films.

Figure 44:
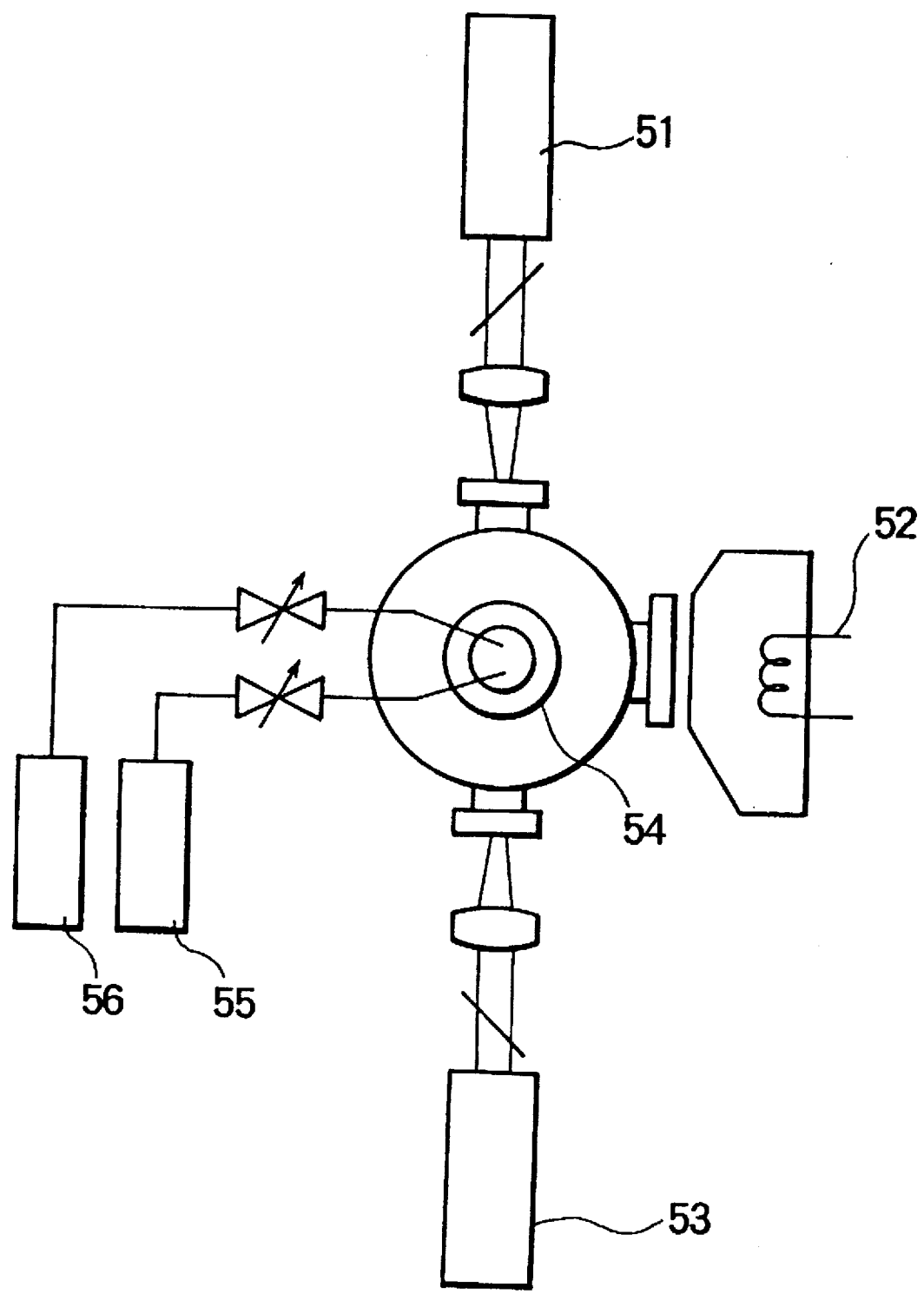
FIG. 44 is a diagram illustrating in the form of a model the construction of a MOCVD film deposition device operated by light excitation and used in a working example of the present invention.

FIG. 44 is a schematic drawing of a film deposition device. In FIG. 44, 51 stands for a XeBr excimer laser oscillating device, 52 for an infrared lamp, 53 for a $Kr_2F$ excimer laser oscillating device, 53 for a substrate holder, 54 for a substrate, 55 for a $V(C_5H_5)_2$ gas line, and 56 for an $Al(CH_3)_3$ supply line. First, the $V(C_5H_5)_2$ gas was blown against the substrate 54 for 30 seconds and then the infrared ray was projected thereon for one minute. Subsequently, the XeBr excimer laser of a wave-length of 282 nm was projected (average output 5 mW) for two minutes to decompose the deposited $V(C_5H_5)_2$ layer. The wavelength is equivalent to an average V-C bond dissociation energy of 410±6 kJ/mol (light wavelength of 292 nm). Then, the $NH_3$ gas was blown at a rate of 15 sccm against the substrate 54 for one minute and the infrared ray was projected thereon to nitride the nascent layer. By repeating this operation, a VN film was deposited to a thickness of 200 nm on the substrate. When this film was subjected to a high-speed reflection electron diffraction analysis, it was found to sustain VN (111) spots. When the film was extracted into the atmosphere and observed under an atomic interaction microscope (AFM), it was confirmed to be a film flat on the atomic level.

Thereafter, the $Al(CH_3)_3$ gas was blown at a rate of 30 sccm against the substrate 54 for 30 seconds, the infrared ray was projected thereon, and the $Kr_2F$ excimer laser of a wavelength of 430 nm was projected thereon (average output 35 W) for one minute to effect decomposition of the nascent $Al(CH_3)_3$ layer. Since the average Al-C bond dissociation energy is 279±5 kJ/mol (light wavelength of 429 nm), it is believed that the $Kr_2F$ excimer laser of a wavelength of 430 nm sufficed for thorough decomposition of the layer. In fact, when the stagnant gas occurring during the operation described above was thoroughly removed, the residual gas was decomposed, and the discharged gas was analyzed for chemical composition with a quadrupole mass analyzer, the gas analyzed was found to consist mainly of such hydrocarbons as $C_5H_{12}^+$ and $CH_2$ and contain virtually no Al-containing gas. Then, the layer was nitride by introducing $NH_3$ gas thereto at a rate of 15 sccm for one minute and projecting the infrared ray thereon. When the nitrided layer was subjected to a high-speed reflection electron diffraction analysis, it was found to sustain AlN (001) spots in a streaking pattern. The results indicate that the deposition gave rise to a very flat film.

Figure 45:
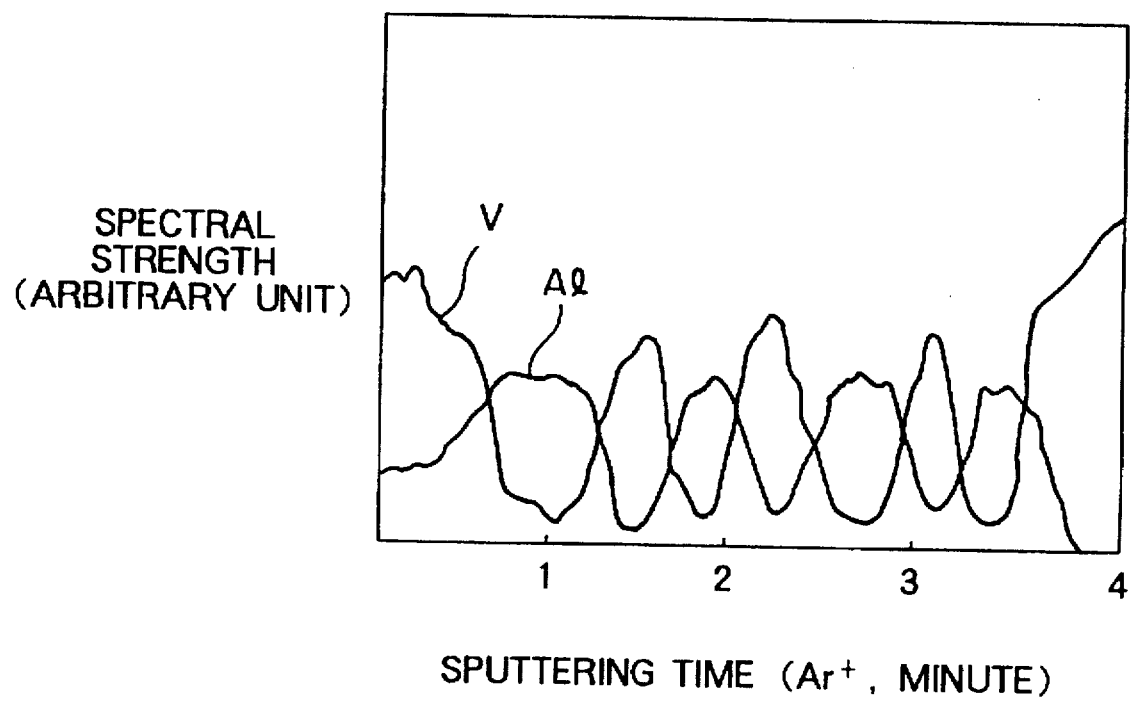
FIG. 45 is a diagram illustrating an Auger profile in the direction of depth of an artificial super lattice manufactured with the MOCVD film deposition device shown in FIG. 44.

By performing the operation described above three times, there was produced a resonant tunnelling diode possessed of a VN/Aln artificial super lattice of a triple barrier structure. This structure consisted in MgO/VN (300 nm)/AlN (1.5 nm)/VN (2.4 nm)/AlN (1.5 nm)/VN (2.1 nm)/AlN (1.5 nm)/VN (15 nm). The specific structure and potential structure were similar to those illustrated in FIGS. 38(a) and 38(b). FIG. 45 illustrates an Auger profile in the direction of depth of the artificial super lattice produced in the present working example. It is clearly noted from FIG. 45 that the membrane consisted of three TiN/AlN layers having sharp interfaces.

As a sample, a mesa diode 10 μm in diameter was secured by etching. An Al electrode was formed on the VN electrode and another Al electrode was formed on the VN layer on the element side, both on the substrate. When the produced diode was tested for electrical properties, the current-voltage characteristics consequently obtained showed such conspicuous negative resistance as evinced by a current peak-valley ratio of 2.8 at 77K. The data support a conclusion that a quantum effect manifesting two-dimensionality of electrons appeared definitely.

EXAMPLE 6

An artificial super lattice using an amorphous metal and an amorphous insulator was produced by the reactive spattering method. First, a resonant tunnelling diode possessed of a WC/SiC artificial super lattice of a triple barrier structure was produced by alternately spattering two kinds of target on a MgO (111) substrate which had been polished and slightly etched with phosphoric acid.

The film deposition conditions used herein for WC comprised a vacuum degree of $1 \times 10^{-3}$ Torr for an argon atmosphere, 500 W for high frequency (13.56 MHz) output, 150° C. as the temperature of the substrate, and 10 nm/min as the deposition rate. The film deposition conditions for SiC were a vacuum degree of $1 \times 10^{-3}$ Torr for an argon atmosphere, 400 W for high frequency (13.356 MHz) output, 100° C. as the temperature of the substrate, and 5 nm/min as the deposition rate. The specific structure of the resonant tunnelling diode was similar to that of the resonant tunnelling diode illustrated in FIG. 38(a).

In the high-speed reflection electron diffraction analysis performed on the WC surface and the SiC surface of the relevant films of the artificial super lattice in process of formation, the surfaces were observed to sustain blurry halo patterns peculiar to amorphous structure, indicating that amorphous films were formed. When the produced diode was tested for electrical properties, the current-voltage characteristics consequently obtained showed such negative resistance as evinced by a current peak-valley ratio of 1.2 at 77K. The data support a conclusion that a quantum effect manifesting two-dimensionality of electrons appeared definitely.

Now, working examples of applying the electronic part of the present invention to resonant tunnelling transistors will be cited below.

EXAMPLE 7

Figure 46:
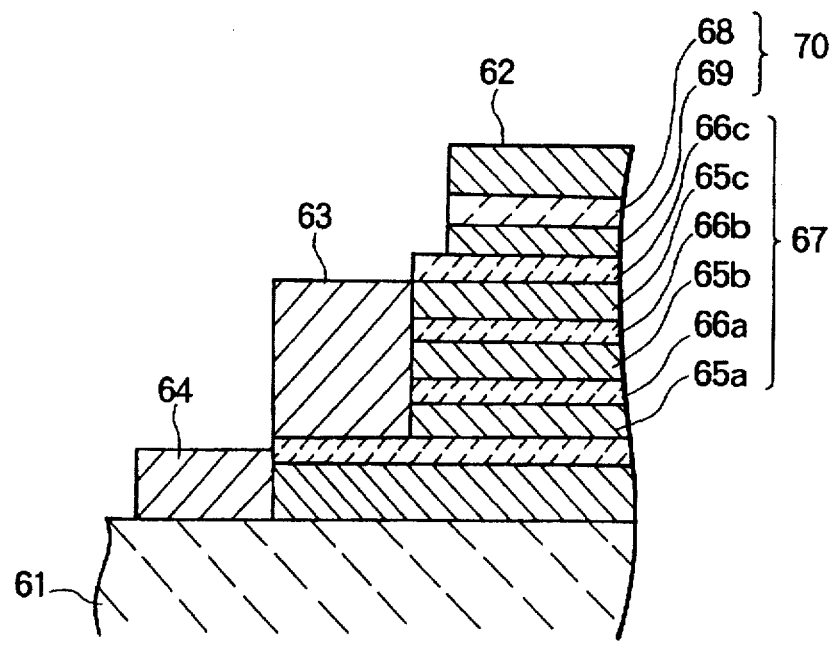
FIG. 46 is a cross section illustrating in the form of a model the construction of a resonant tunnelling transistor produced in a working example of the present invention.

FIG. 46 illustrates the construction of a resonant tunnelling transistor as one example of the use of the artificial super lattice of this invention. In this diagram, 61 stands for an insulating substrate made of such substance as MgO. On this insulating substrate 61, there are formed an emitter 61, a base 63, and a collector 64 which will be described more specifically below. The emitter 62 is a metallic electrode having a thickness of 100 nm, for example. The base 63 is possessed of an artificial super lattice 67 which has three cycles each of a well 65 made of a compound of good conductivity and a barrier 66 made of an insulating compound superposed. For example, a TiN (111) layer 2.1 nm in thickness is used as the well 65 and an AlN (001) layer 1.5 nm in thickness is used as the barrier 66. The emitter 62 is underlain by an artificial super lattice 70 which is formed by superposing a barrier 68 made of an insulating compound and a well 69 made of a compound of good conductivity. An AlN (0001) layer 1.5 nm in thickness is used as the barrier 68 and a TiN (111) layer 2.4 nm in thickness is used as the well 69, for example.

Incidentally, in a quantum device which is based on the conventional semiconductor, differential negative resistance exists in not only the emitter current but also the base current. The negative resistance manifests itself in the base current because the injection of positive holes from the base to the emitter is effected via the resonance level. This fact entails a problem of smallness of the peak-valley ratio.

Figure 47:
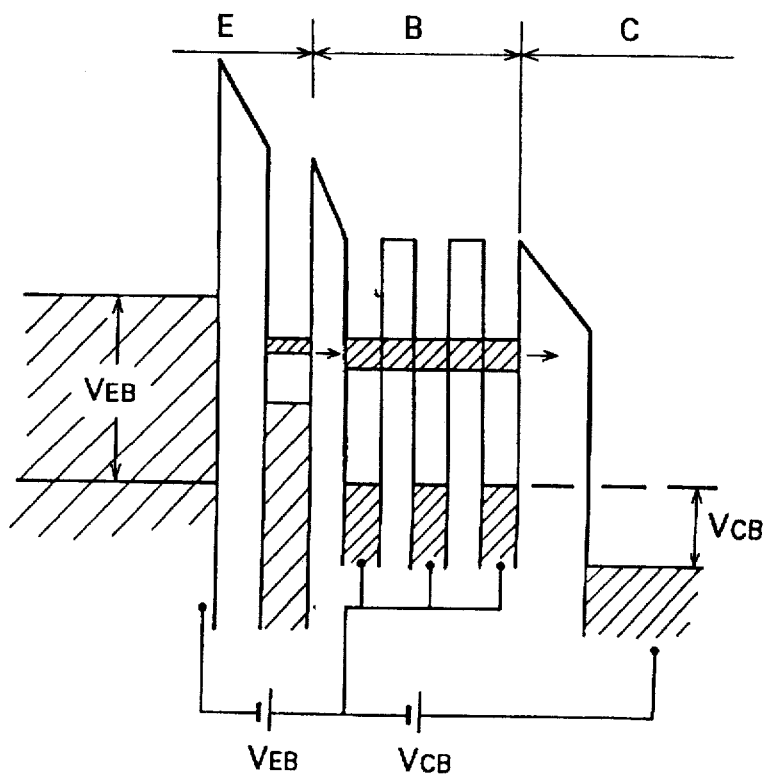
FIG. 47 is an energy diagram of the resonant tunnelling transistor shown in FIG. 46.

In contrast thereto, in the resonant tunnelling transistor of the present working example, a superlattice formed of a compound of good conductivity and an insulating compound (such as, for example, TiN/AlN) is interposed between the base 63 and the base 63 and the emitter 62 for the sake of interconnection. Only the electrons, therefore, serve as a carrier and the manifestation of negative resistance belongs to the electrons as illustrated in FIG. 47. As a result, the decrease of the peak-valley (P/V) ratio due to positive holes is small as in the conventional device. FIG. 47 represents an energy diagram of the resonant tunnelling transistor involved in the present working example.

Specifically by forming at least one of the emitter, base, and collector of the resonant tunnelling transistor with an artificial super lattice composed of a compound of good conductivity and an insulating compound as contemplated by this invention, the base current is prevented from exhibiting a differential negative resistance characteristic and this negative resistance is sharply decreased proportionately as the voltage between the base and the emitter is increased. In the voltage characteristic diagram, therefore, the collector current corresponding to the valley area assumes an extremely small magnitude. As the result of this phenomenon, the P/V ratio is notably improved and the noise margin is enlarged to the extent of facilitating the handling. This advantage is accounted for by the fact that a tunnel layer formed of the metal/insulator combination is used as the base. Since electrons serve as a carrier in a metal, the phenomenon that the positive holes flowing from the base to the emitter in a semiconductor degrade the effective negative characteristics of the emitter-collector current can never occur. In the tunnel element which uses a semiconductor as a base or which is formed by combining a semiconductor with an insulator, for example, the resonant tunnelling phenomenon of positive holes occurs in addition to the resonant tunnelling phenomenon of electrons when the voltage between the base and the emitter increases. As a result, ample derivation of characteristics is not accomplished owing to the resonance phenomenon which occurs on the positive holes migrating from the base to the emitter. No problem of this sort occurs on the artificial super lattice of this invention because only the electrons serve as a carrier in the construction of this artificial super lattice. Further, the artificial super lattice of this invention is at an advantage in having such a large metal/insulator barrier height, namely an AlN/TiN barrier height, as not less than 1 eV and, as a result, repressing the leak due to thermal scattering and the leak due to high-order resonance.

Moreover, the use of a superlattice membrane produced by combining a metal with an insulator permits a large increase of the differential conductance and accordingly enables the element to enjoy a conspicuous increase of the speed of response. The speed of response generally is governed by the duration of the charging time between the emitter and the base or the collector.

This fact can be expressed by the formula C/g, wherein C stands for the capacitance of the emitter or collector and g for the differential conductance. It follows that the speed of response is heightened in accordance as the capacitance is decreased or the differential conductance is increased. The differential conductance is the ratio of the tunnel current to the bias voltage. It is, therefore, wise to use an insulator which has a small dielectric constant. When the combination of a metal with an insulator is employed, therefore, since the density of a tunnel current is large enough to obviate the necessity for particularly selecting an insulator having an exceptionally small dielectric current, a device which is based on a semiconductor suffices for ample exaltation of the speed of response.

In the resonant tunnelling transistor which uses the artificial super lattice described above, such conditions as the thickness of each of the component layers are desired to be set as follows. In the combination of TiN with AlN, for example, it is necessary for the sake of realizing the resonant tunnelling phenomenon to construct the resonant tunnelling transistor so that the component films will have an amply small thickness and, more importantly, the scattering of an electron wave in the interface will avoid affecting the propagation of the wave. It is known very well that when amply deep box potential wells are arranged, the electron wave behaves in the form of free particles called a two-dimensional electron gas in the direction of thickness of a film. The energy possessed by the electrons is expressed by the sum of an energy entailed by the two-dimensional free motion and an energy on the quantum level relative to the standing wave. The tunnel probability is maximized when the electron wavelength $\lambda_e$ (=h/(2 m*E)$^{1/2}$) relative to the latter energy equals two multiples of the quantum well width $L_W$ ($\lambda_e$=2 $L_W$) (J. Appl. Phys., Vol. 34, No. 4 (Part 1), April 1963, p 864). In view of the relations described above, the thickness of TiN films and that of AlN films are desired to be not more than 5.0 nm. When these thicknesses are not more than 2.0 nm, it is allowed to set the energy of a standing wave at an amply large magnitude with respect to the thermal energy at normal room temperature and the uncertainty of the level due to scattering.

Further, the tunnel probability is maximized by optimizing the thickness of each of the component films so as to satisfy the following formula.

$$L_n(E_n-E_0)^{1/2}=L_{n+1}(E_{n+1}-E_0)^{1/2}$$

wherein $L_n$ stands for the thickness of a n'th AlN film, $L_{n+1}$ for the thickness of a n+1'th AlN film, $E_n$ and $E_{n+1}$ respectively stand for the upper end potentials of the relevant barriers, and $E_0$ stands for the energy of a tunnel electron.

In the resonant tunnelling transistor of this working example, since the artificial super lattices severally have a plurality of minibands, this element is enabled to acquire such new functions as shown below.

Figure 48:
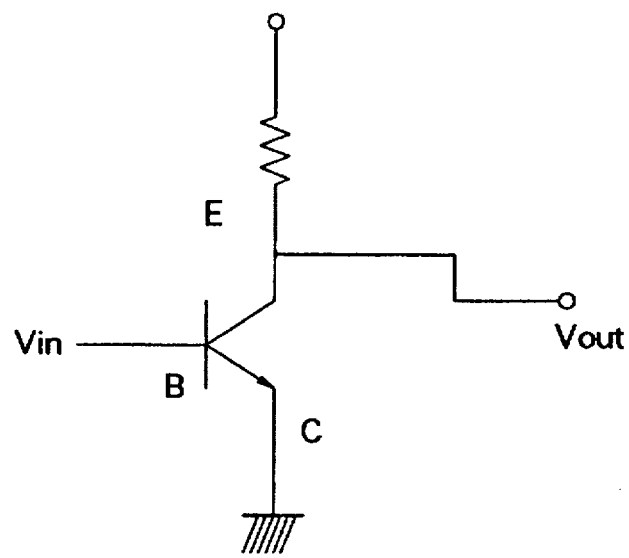
FIG. 48 is a diagram illustrating the construction of a circuit using the resonant tunnelling transistor shown in FIG. 46.
Figure 49:
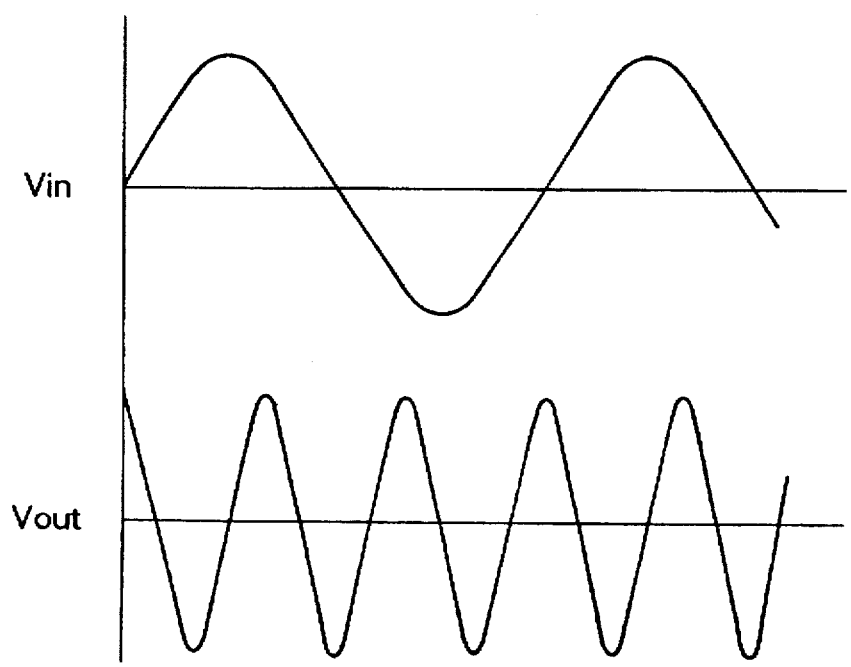
FIG. 49 is a diagram illustrating the operating characteristics of an element incorporating the circuit structure shown in FIG. 48.

The resonant tunnelling transistor of this working example is adapted to form such a circuit structure as illustrated in FIG. 48. With reference to FIG. 48, when the energies of the mini-bands of the emitter and the collector are preparatorily made to agree and the base voltage is increased, the element assumes an ON state and the magnitude of $V_{out}$ is minimized at the time that the energy of the miniband of the emitter and collector and that of the miniband of the base concur. The element assumes an OFF state and the magnitude of $V_{out}$ increases when the base voltage is further increased. The element assumes the ON state again and the magnitude of $V_{out}$ is minimized at the time that the second miniband of the base again agrees the energy of the emitter-collector. Thus, four cycles of output are obtained per cycle of the base input voltage as illustrated in FIG. 49. In other words, this element acquires the function of a frequency divider and can be utilized as a compact functional element having a decisively small number of components as compared with the conventional element.

Figure 50:
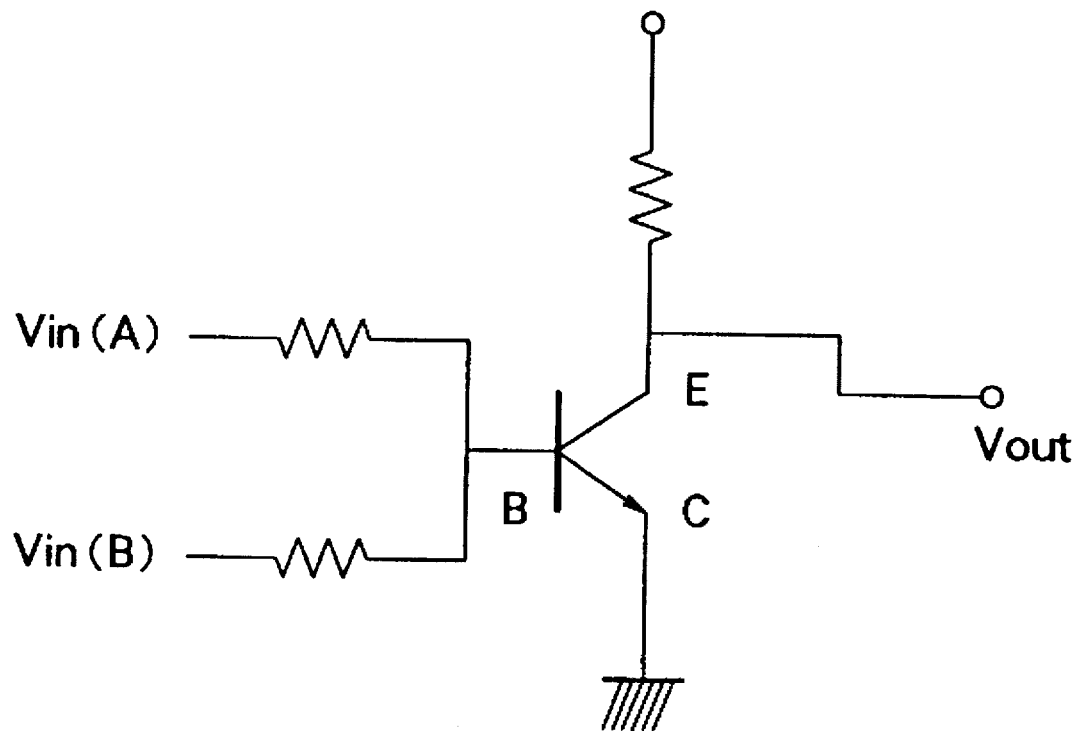
FIG. 50 is a diagram illustrating the construction of another circuit using the resonant tunnelling transistor shown in FIG. 46.

FIG. 50 illustrates an example of application of the element of the present example, depicting the case of adapting the element so that the element is turned ON when only either of $V_{in}$(A) and $_{in}$(B) having equal DC input voltages is turned ON. The inputs A and B to this element yield such outputs as shown below in Table 4. Thus, the element acquires the function of exclusive OR. None of the existing elements has acquired such functions as described above. Thus, the resonant tunnelling transistor of this working example functions as a digital element operating at an exceptionally high speed and enjoying a high degree of integration.

TABLE 4

| $V_{in}$ (A) | $V_{in}$ (B) | $V_{out}$ |
|---|---|---|
| 1 | 1 | 1 |
| 1 | 0 | 0 |
| 0 | 1 | 0 |
| 0 | 0 | 1 |

EXAMPLE 8

On a MgO (111) substrate which had been polished by the use of a composite beam device adapted to operate with a low energy ion beam and a molecular beam and constructed as schematically illustrated in FIG. 37 and then etched lightly with phosphoric acid, an emitter of TiN (40 nm), a first barrier layer of AlN (1.5 nm), a base of TiN (2.4 nm), a second barrier layer of AlN (1.5 nm), and a collector of TiN (30 nm) were sequentially formed in the order mentioned. The films of TiN and AlN were formed under the same conditions as those (shown in Table 3) used in Example 1. As a sample, a mesa transistor 10 μm in diameter was secured by etching. An Al electrode was formed on the TiN electrode and another Al electrode was formed on TiN on the element side.

Figure 51:
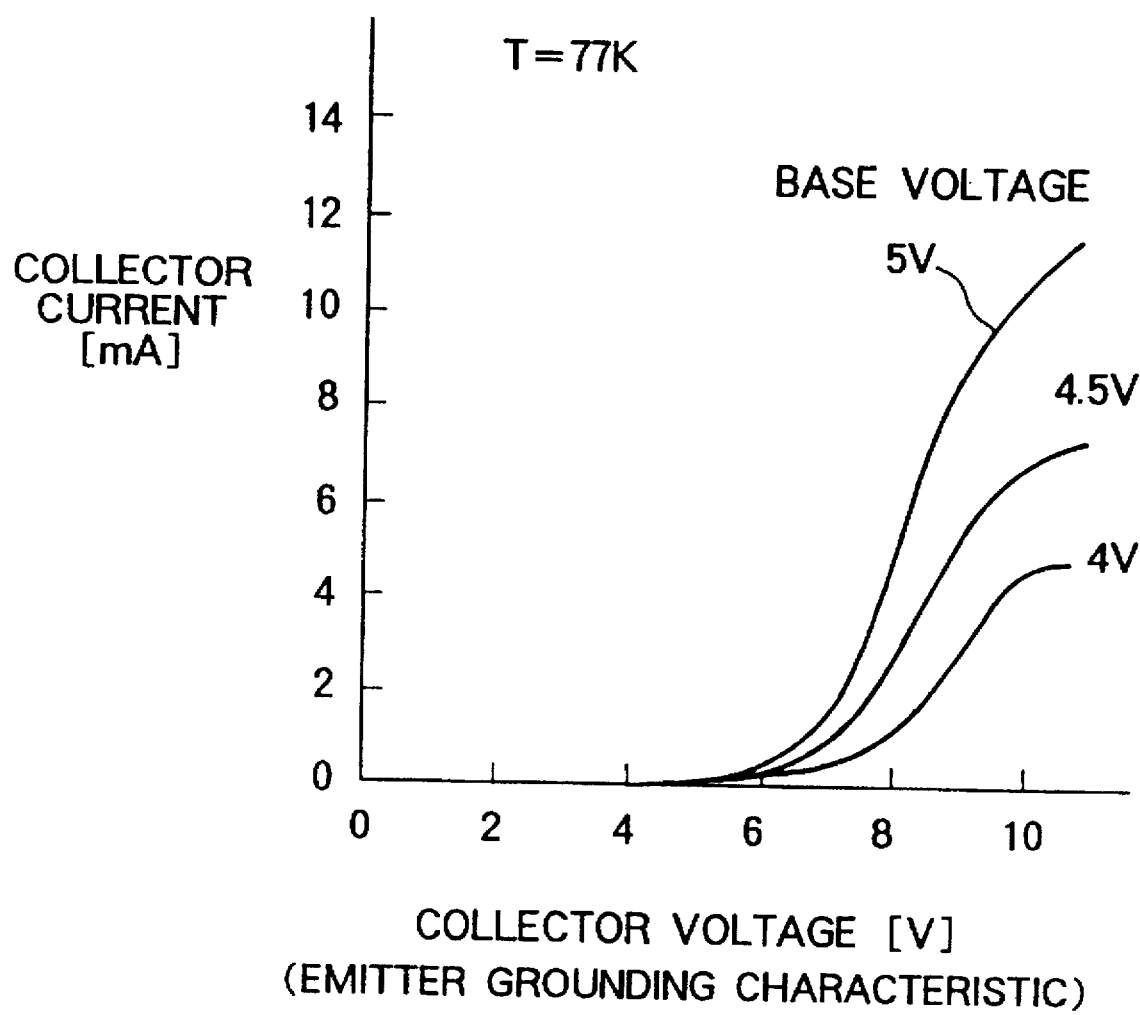
FIGS. 51 is a diagram showing the current-voltage characteristics of a resonant tunnelling transistor produced in another working example of the present invention.
Figure 52:
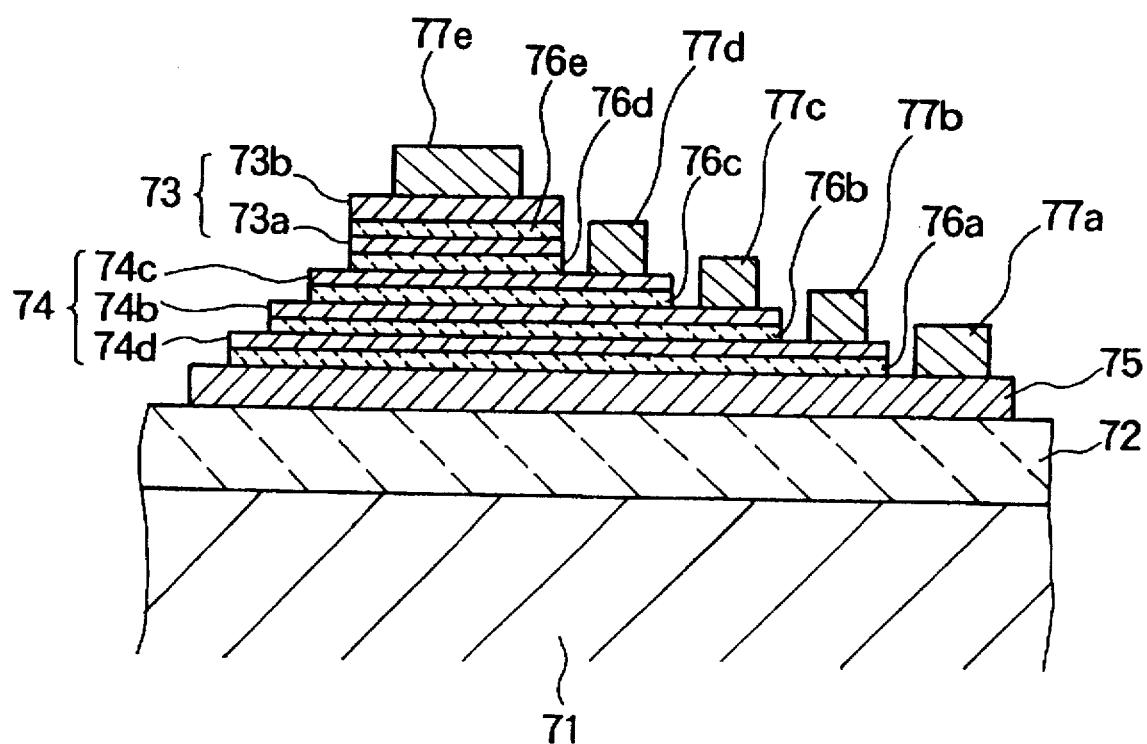
FIG. 52 is a cross section illustrating in form of a model the construction of a multiple-input resonant tunnelling transistor produced in a working example of the present invention.

In the high-speed reflection electron diffraction analysis (RHEED) performed on the TiN surface and the AlN surface of the relevant films in process of formation, the TiN (111) surface and the AlN (001) surface were observed to sustain peculiar reflection spots both in a streaking pattern, indicating that the process produced flat and smooth single crystal films. When the transistor consequently obtained was tested for electrical properties (emitter grounding characteristic), it was found to give a large current transfer ratio as shown in FIG. 51.

EXAMPLE 9

A multi-input resonant tunnelling transistor was produced by the use of a composite beam film deposition device which was adapted to use a low energy ion beam and molecular beams from a Knudsen cell and an electron beam heating vacuum deposition source under an ultra-high degree of vacuum of not more than $10^{-8}$ Torr and is constructed similarly to the product of FIG. 37. On a Si (111) substrate 71 which had been lightly etched with dilute hydrofluoric acid, washed in very pure deaerated and deionized water, and undergone a hydrogen termination treatment, an AlN epitaxial buffer layer 72 was formed in a thickness of 30 nm. On the buffer layer 72 now crowning the substrate, a multi-input resonant tunnelling transistor incorporating therein a double emitter barrier 73 and a triple base input 74 was produced by the conventional lift-off process. Specifically, a TiN collector 75 (40 nm), an AlN barrier layer 76a (1.5 nm), a third TiN base layer 74a (2.4 nm), an AlN barrier layer 76b (1.5 nm), a second TiN base layer 74b (2.4 nm), an AlN barrier layer 76c (1.5 nm), a first TiN base layer 74c (2.4 nm), an AlN barrier layer 76d (1.5 nm), a TiN layer 73a (3.1 nm), an AlN barrier layer 76e (1.5 nm), and a TiN emitter 73b (30 nm) were formed sequentially in the order mentioned by the use of the composite beam film deposition device. Then, Al electrodes 77a, 77b, 77c, 77d, and 77e were formed by vacuum deposition respectively on the TiN collector 75, the TiN base layers 74a, 74b, and 74c, and the TiN emitter 73b.

The multi-input resonant tunnelling transistor produced as described above was tested for electrical properties. The test consisted in measuring the emitter-collector current (logical value "0" assigned to any magnitude of not more than 1 mA and logical value "1" to any magnitude of not less than 5 mA) with the emitter-collector voltage $V_{EC}$ fixed at 5 V and the emitter-base voltage $V_{EB}$ of the first to third bases fixed at 0 V (logical value 0) or 3 V (logical value 1). The results of the test are shown in Table 5.

TABLE 5

| | | | | | | | | |
|---|---|---|---|---|---|---|---|---|
| $V_{EB}1$ | 0 | 1 | 0 | 0 | 1 | 0 | 1 | 1 |
| $V_{EB}2$ | 0 | 0 | 1 | 0 | 1 | 1 | 0 | 1 |
| $V_{EB}3$ | 0 | 0 | 0 | 1 | 0 | 1 | 1 | 1 |
| $I_{BC}$ | 0 | 0 | 0 | 0 | 0 | 0 | 0 | 1 |

The data given in Table 5 indicate that the transistor manifested an AND characteristic of producing 1 as an out only when all the input voltages $V_{EB}$ were invariably 1.

Now, working examples of the quantum interference transistor using the artificial super lattice of this invention will be described below.

EXAMPLE 10

Figure 53:
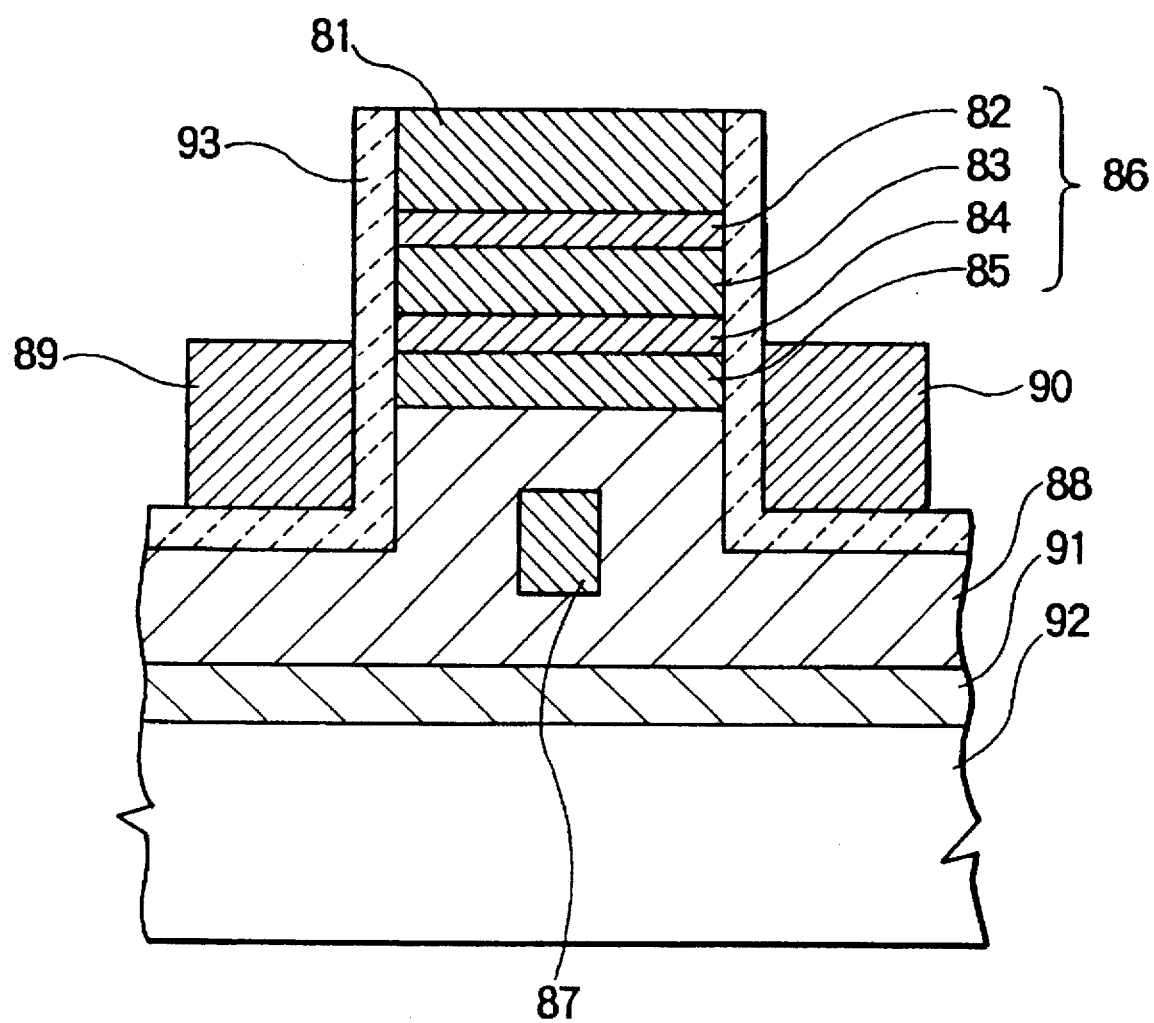
FIG. 53 is a cross section illustrating in the form of a model the construction of a quantum interference transistor produced in a working example of the present invention.

FIG. 53 illustrates an example of the construction of a quantum interference transistor using the artificial super lattice of this invention as means for controlling the energy of electrons at a specific value. In the diagram, 81 stands for an Al layer destined to serve as a source electrode. This source electrode 81 is underlain by an artificial super lattice 86 consisting of an AlN layer 82 (1.5 nm), a TiN layer 83 (2.1 nm), an AlN layer 84 (1.5 nm), and a TiN layer 85 (2.1 nm). This artificial super lattice 86 functions as means for controlling the energy of electrons at a specific magnitude. The artificial super lattice 86 is underlain by a vacuum deposited layer of Si (111) which is a channel layer 88 incorporating therein a separation layer 87. As means for imparting different potentials to two paths for electrons (second electron paths) divided by the separation layer 87, two gate electrodes 89 and 90 are disposed one each on the opposite sides of the channel layer 88. The channel layer 88 is underlaid by a n⁺-Si layer 91 which is intended as a third electron path for causing the electrons which have passed through the two second electron paths to overlap and interfere. In the diagram, 92 stands for a n type Si (111) substrate and 93 for an AlN layer.

In the quantum interference transistor constructed as described above, when the electrons departing from the source electrode 81 are caused to flow downwardly from above, only the electrons that have a specific energy penetrate the artificial super lattice 86 and, while passing through the Si channel layer 88 intervening between the two gate electrodes 89 and 90, induce modulation of the phase. Mutually different negative bias voltages are applied to the two gate electrodes 89 and 90 to enlarge depletion layer areas on both sides of the channel layer 78 underlying the gates and decrease the effective widths of channel. The electron wave which has passed through the narrow execution channel induces an interference effect in the n⁺-Si layer 91 on the substrate 92 side.

To be specific, the quantum interference transistor of the working example described above is what is produced by providing a quantum well enclosed with at least two potential barriers and adapted to induce a resonant tunnelling phenomenon, as means for limiting the energy of electrons to a specific value, for a quantum interference transistor which is provided with a first electron path for allowing passage therethrough of electrons having one and the same phase, a plurality of second electron paths for dividing the electrons and passing therethrough the divided electrons, means for imparting mutually different potentials to the plurality of second electron paths, and a third electron path for causing the electrons which have passed through the second electron paths to overlap and interfere.

Figure 54:
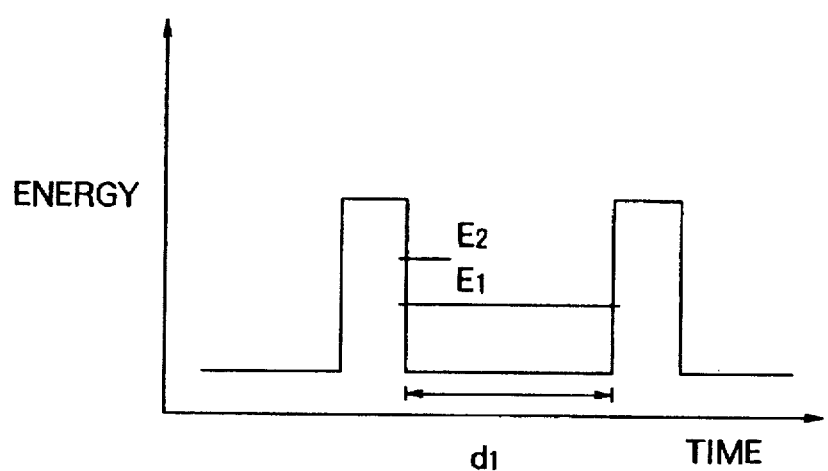
FIGS. 54(a) and 54(b) are diagrams for aiding in the description of the resonant tunnelling phenomenon.
Figure 54:
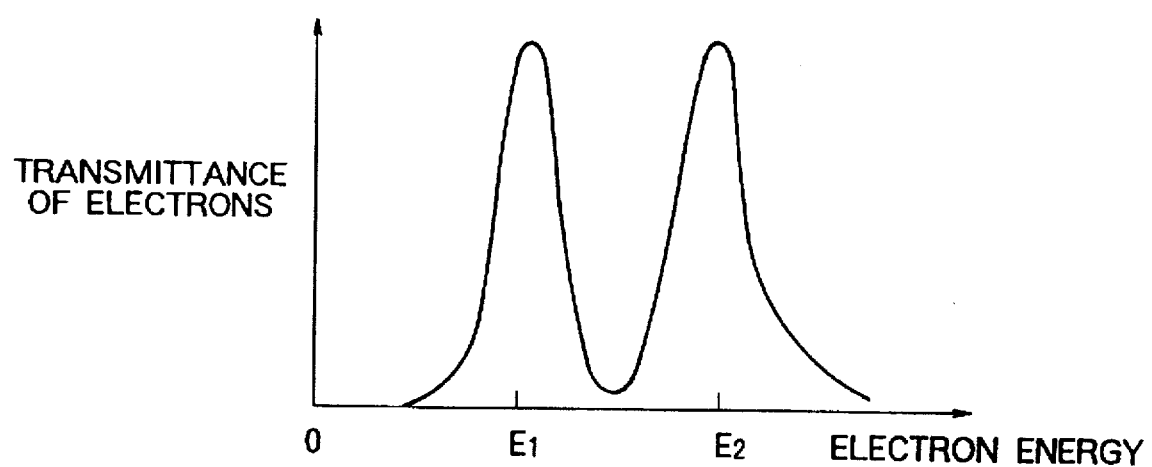

For the sake of effectively inducing the interference effect of electrons, the transistor of the working example described above has formed therein means for limiting the energy of electrons to a specific magnitude. As means for controlling the energy of electrons, the resonant tunnelling phenomenon can be utilized, for example. FIGS. 54(a) and 54(b) are digrams for aiding in the description of the resonant tunnelling phenomenon. As illustrated in FIG. 54(a), an area enclosed with two potential barriers is formed. When the width of the quantum well is amply narrow, the intrinsic energy which occurs in the state of bundling electrons inside the quantum well is disperse and the number of such states is small. The intrinsic energy of the quantum well is expressed roughly by the following formula.

$$E = h^2 \pi^2 n^2 / (2md^2)$$

wherein n stands for an integer of the value of at least 1 and d for the width of the quantum well. When electrons are injected into this quantum well from outside, they are reflected by virtually all the energy. The electrons identical in energy to the intrinsic energy E are not reflected by the resonance phenomenon and the transmittance increases close to 1 as shown in FIG. 54(b). The transmission of only the electrons that possess a desired energy is realized by suitably designing the width d of the quantum well by virtue of the resonance phenomenon obtainable by the combination of a metal and an insulator as described above. Thus, only the electrons what possess a specific energy can be selected.

When the energy of electrons is dispersed, the interference effect is averaged. In the conventional quantum interference device, the electrons injected from the source have a virtually uniform energy because they are in a state of thermal equilibrium. Thus, the interference effect due to the wave motion of electrons is conspicuously enervated and the control of a drain current with a gate potential is virtually infeasible.

The quantum interference transistor contemplated by the present working example can eliminate the drawbacks due to the averaging mentioned above because it is enabled to select only the electrons that have a specific energy as described above. As a result, the phase modulation with the gate potential and the interference effect due to the phase modulation can be harnessed to the fullest possible extent. The number of potential differences between the individual paths, therefore, can be increased by appropriately devising the layout of sources, drains, and gates. Thus, only a small input potential difference suffices to vary greatly output currents and improve conspicuously the ratio of amplification of transistor. The element of this working example, therefore, permits production of devices which operate at a high speed.

The quantum interference transistor is constructed on the basis of the rule that the direction of emitter current should be perpendicular to the surface of the substrate used for the formation of elements. The perpendicularity, however, is not critical to the construction. The construction is attained basically by having the resonant tunnelling layer incorporated in the electron supplying layer. When the perpendicularity exists, the distance between the emitter and the collector can be easily designed in such an amply small size as some tens of nm, for example. By decreasing the distance between the emitter and the collector and consequently shortening the channel, the probability of electrons succumbing inelastic scattering can be decreased and the electron wave of the electrons passing through the first one of the two branched paths and the electron wave of electrons passing through the second path can be made to interfere sharply.

When the emitter and the resonant tunnelling barrier are so shaped as to be projected in the direction of the separation layer, the electric field which is applied between the emitter and the collector can be concentrated at the projecting parts. By the same token, the electric field applied to the collector is concentrated at the tips of the projecting parts and the electron wave discharged from the emitter is concentrated at the tip of the projecting part of the collector. This electronic system corresponding to the dot light source in an optical system and the interference pattern of the electron wave is sharpened.

EXAMPLE 11

Figure 55:
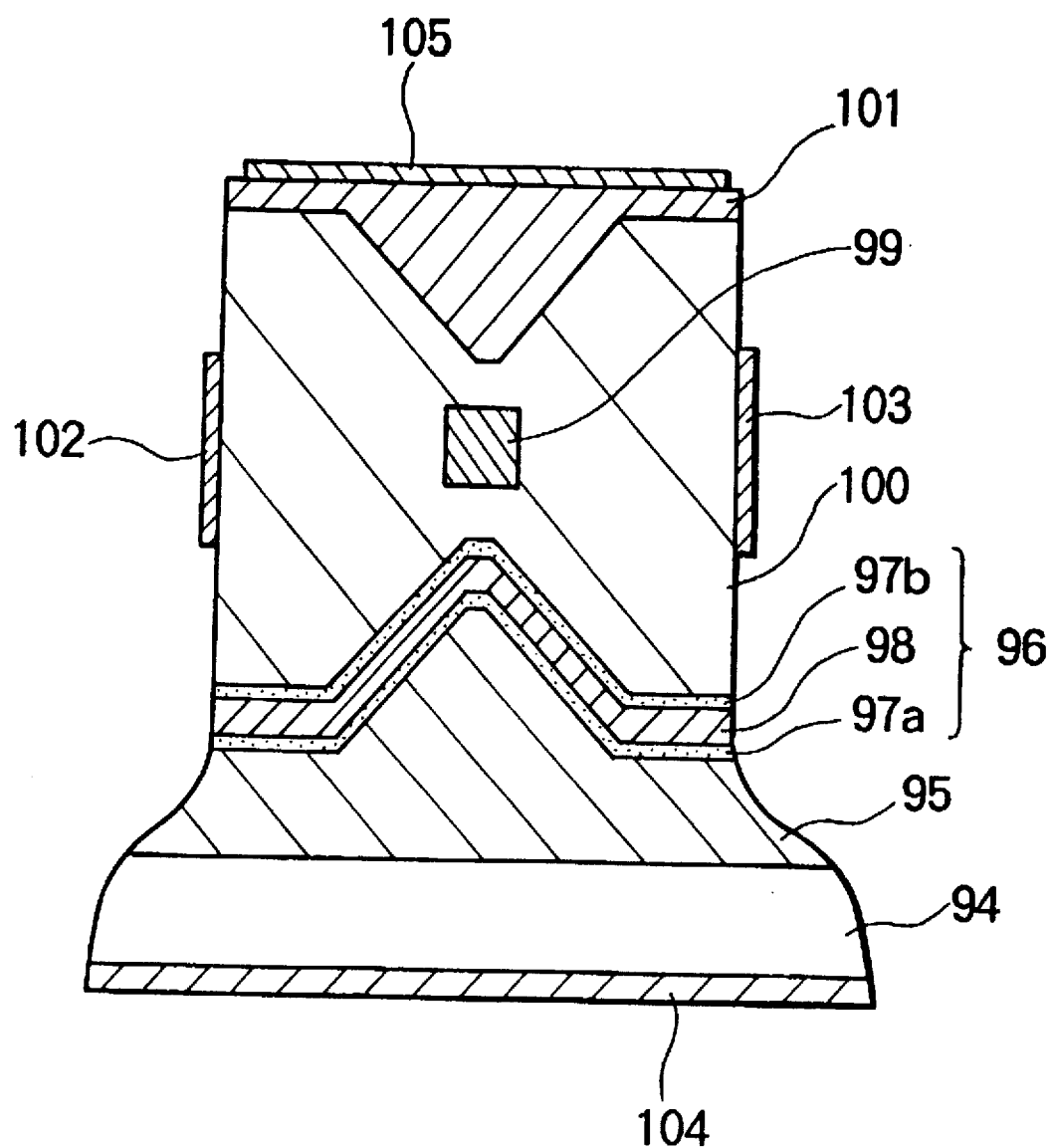
FIG. 55 is a cross section illustrating in the form of a model the construction of a quantum interference transistor produced in another working example of the present invention.

FIG. 55 illustrates another example of the construction of a quantum interference transistor. In FIG. 55, 94 stands for a Si semiconductor substrate, 95 for an emitter layer, and 96 for a resonant tunnelling barrier. The resonant tunnelling barrier 96 comprises a first barrier layer 97a, a quantum well layer 98, and a second barrier layer 97b. The barrier layer 97 is formed of AlN and the quantum well layer 98 of TiN. The thickness of the TiN layer is 2.4 nm and that of the AlN layer 1.5 nm. On the resonant tunnelling barrier 96, a channel layer 100 provided with a channel separation zone 99 and a collector layer 101 are formed sequentially in the order mentioned. Gate electrodes 102 and 103 are formed one each on the opposite lateral surfaces of the channel layer 100. In the diagram, 104 stands for an emitter electrode and 105 for a collector electrode. As described above, the emitter 95, the resonant tunnelling barrier 96, the channel 100, and the collector 101 are superposed sequentially in the order mentioned on the semiconductor substrate 94. The gate electrodes 102 and 103 are formed respectively on the lateral surfaces of the two paths branched within the channel 100.

The quantum interference transistor constructed as described above is manufactured, for example, as follows.

First, as the semiconductor substrate 94, a Si (111) substrate having a thickness of about 300 μm is used. On this Si substrate, n$^+$-Si destined to form the emitter layer 95 is grown epitaxially to a thickness of about 50 nm. Then, under the selected conditions of masking and sandwiching, a triangular projection having (100) as a lateral surface is formed and the apex of the triangular projection and its vicinity are fabricated to form a flat (111) surface. The resonant tunnelling barrier 96 is formed on the top of the projection. This resonant tunnelling barrier 96 is formed by epitaxial growth in accordance with any of the known film deposition methods such as, for example, the ion beam film deposition method and the ionized cluster beam method.

Then, as the channel layer 100, a n-Si (111) is grown in a thickness of about 200 nm. In the central part of the channel layer 100, the separation zone 100 nm in width and 100 nm in depth is formed by injecting oxygen therein. Subsequently, n-Si (111) is epitaxially grown to a thickness of 500 nm and, by having the central part of the grown layer etched, a triangular groove having (100) as a lateral surface is produced. By burying this triangular groove, the collector layer 101 of n$^+$-Si (111) is formed.

The superposed layers thus far formed are wholly subjected to mesa etching in a size of about 1 μm in width. The Al gate electrodes 102 and 103 having a thickness of about 200 nm are disposed one each on the lateral surfaces of the branched paths of the channel 100 and, at the same time, the semiconductor substrate 94 is underlain by the In emitter electrode 104 having a thickness of about 200 nm and the collector layer 101 is overlain by the collector electrode 105.

In the quantum interference transistor of the working example described thus far, the emitter 95 and the resonant tunnelling barrier 96 are each provided in the central part thereof with a triangular projection. Since these projections thrust out into the channel 100, the electric fields can be concentrated at the leading ends of the projections and the state of resonant tunnelling can be generated exclusively in the leading terminals. Since the collector 101 is provided in the central part thereof with a triangular projection and this projection thrusts into the channel, the electron wave discharged from the emitter 95 side is concentrated at the leading end of the projection on the collector side. Further, by applying negative bias voltages to the gate electrodes 102 and 103 on the lateral surfaces, the available width of the channel 100 is limited and the effect of this concentration is exalted.

The quantum interference transistor by nature operates in conformity with the interference pattern of the electron wave. Thus, the interference pattern gains in sharpness and the quantum interference transistor gains in performance in proportion as the site for discharge of electrons and the site for capture thereof are decreased.

The quantum interference transistor of the kind described above is capable of enhancing the ratio of the phase modulation of electrons due to an external potential. It, therefore, allows provision of quantum interference elements which have decreased amplitudes of switching.

Now, working examples of the resonant tunnelling vacuum emitter element using the artificial super lattice according with this invention will be described below.

EXAMPLE 12

On a MgO (111) substrate which had been polished by the use of a composite beam device adapted to operate with a low energy ion beam and a molecular beam and constructed as schematically illustrated in FIG. 37 and then lightly etched with phosphoric acid, an emitter TiN layer (40 nm), an AlN barrier layer (1.5 nm), a TiN gate layer (2.4 nm) were sequentially superposed in the order mentioned. The film deposition conditions for TiN and AlN were the same as those (shown in Table 3) used in Example 1. As an example, a mesa emitter 10 μm in diameter was secured by etching. An Al electrode was formed on the TiN and another Al electrode was formed on the TiN electrode on the element side, both on the substrate.

Figure 56:
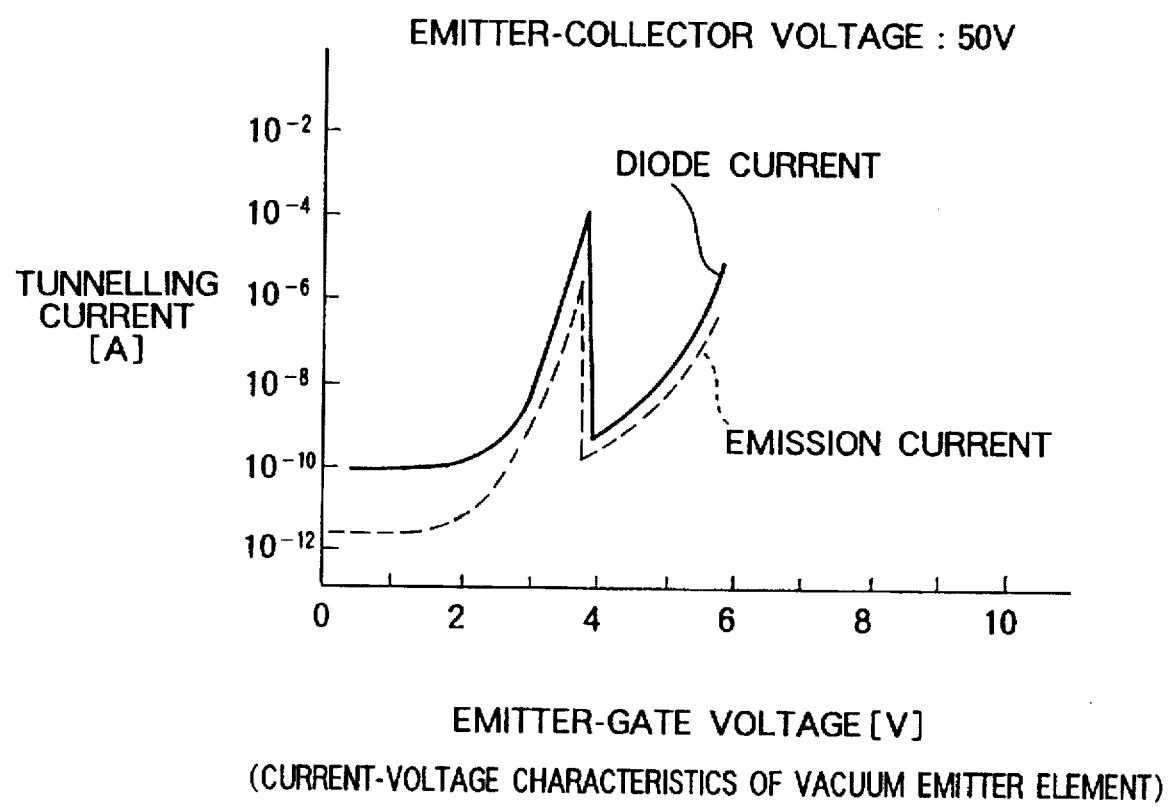
FIG. 56 is a diagram showing the current-voltage characteristics of a volume emitter element produced in a working example of the present invention.
Figure 57:
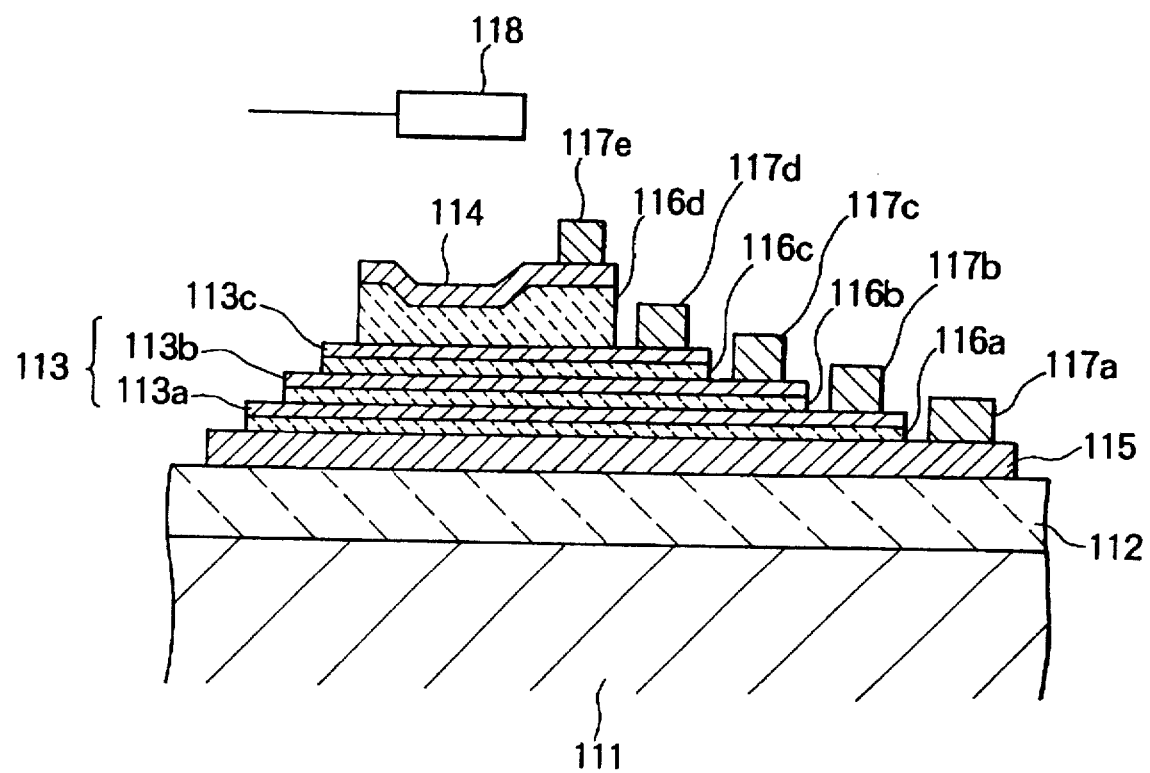
FIG. 57 is a cross section illustrating in the form of a model the construction of a multiple-input vacuum emitter element produced in a working example of the present invention.

In the high-speed reflection electron diffraction analysis (RHEED) performed on the TiN surface and the AlN surface of the pertinent layers in process of formation, the TiN (111) surface and the AlN (001) surface were observed to sustain peculiar reflection spots both in a streaking pattern, indicating that the aforementioned process produced flat and smooth single crystal films. When the produced vacuum emitter element was tested for electrical properties, it showed a large current discharge ratio as shown in FIG. 56.

EXAMPLE 13

A multi-input resonant tunnelling vacuum emitter element was produced by the use of a composite beam film deposition device similar to the device illustrated in FIG. 37 and capable of using a low-ion beam and molecular beams from a Knudsen cell and an electron beam heating vacuum deposition source under such an ultra-high degree of vacuum as not more than $10^{-8}$ Torr.

On a Si (111) substrate 111 which had been lightly etched with dilute hydrofluoric acid, washed with deaerated and very highly deionized water, and subjected to final terminal treatment with hydrogen, an AlN epitaxial buffer layer 112 was formed in a thickness of 30 nm. On the buffer layer 112, a multi-input resonant tunnelling vacuum emitter possessed of a triple base input electrode 113 and a control electrode 114 was formed by the ordinary liftoff process.

To be more specific, a TiN emitter 115 (40 nm), an AlN barrier layer 116a (1.5 nm), a first TiN base layer 113a (2.1 nm), an AlN barrier layer 116b (1.5 nm), a second TiN base layer 113b (2.1 nm), an AlN barrier layer 116c (1.5 nm), a third TiN base layer 113c (2.1 nm), an AlN barrier layer 116d (3.0 nm), and a TiN control electrode 114 (2.7 nm) were formed sequentially in the order mentioned by the use of the composite beam film deposition device. Then, Al electrodes 117a, 117b, 117c, 117d, and 117e were vacuum deposited respectively on the TiN emitter 115, the TiN base layers 113a, 113b, and 113c, and the TiN control electrode 114. In the diagram, 118 stands for a collector disposed opposite the control electrode 114 across a vacuum area.

The multi-input resonant tunnelling vacuum emitter produced as described above was tested for electrical characteristics. The test consisted in measuring the current $I_{EC}$ between the emitter and the collector (logical value 0 assigned to any magnitude of not more than 5 mA and logical value 1 to any magnitude of not less than 15 mA) with the voltage between the emitter and the control electrode fixed at 9 V and the emitter base voltage $V_{EB}$ between the first through third bases fixed at 0 V (logical value 0) or 3 V (logical value 1). The results are shown in Table 6.

TABLE 6

| $V_{EB}1$ | 0 | 1 | 0 | 0 | 1 | 0 | 1 | 1 |
|---|---|---|---|---|---|---|---|---|
| $V_{EB}2$ | 0 | 0 | 1 | 0 | 1 | 1 | 0 | 1 |
| $V_{EB}3$ | 0 | 0 | 0 | 1 | 0 | 1 | 1 | 1 |
| $I_{BC}$ | 0 | 0 | 0 | 0 | 0 | 0 | 0 | 1 |

It is noted from Table 6 that the AND characteristics having 1 as the emission current $I_{EC}$ only when all the input voltages $V_{EB}$ invariably assume the magnitude of 1.

Now, a working example of the application of the electronic part of this invention to a quantum effect memory element will be described below.

EXAMPLE 14

Figure 58:
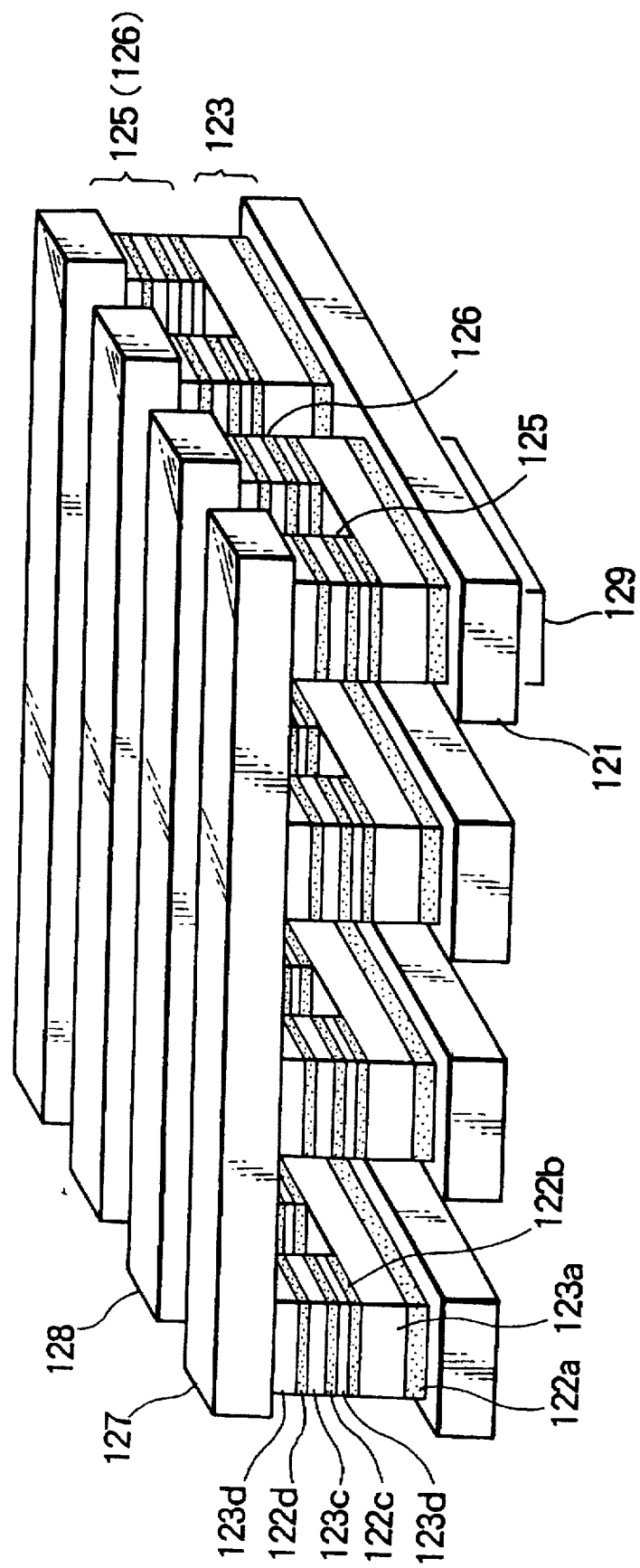
FIG. 58 is a perspective view illustrating an example of the construction of a quantum effect memory embodying the present invention.

FIG. 58 is a diagram illustrating an example of the construction of a static memory provided with the artificial super lattice according with this invention. In the diagram, 121 stands for a bit wiring formed of TiN. On this bit wiring 121, a tunnel diode 124 made of AlN (122a)/TiN (123a). On the tunnel diode 124, two triple barrier resonant tunnelling diodes 125 and 126 made of AlN (122b, 122c, 122d)/Tin (123a, 123b, 123c, 123d) were formed. Word lines 127 and 128 made of TiN were respectively formed on the triple barrier resonant tunnelling diodes 125 and 126. The two triple barrier resonant tunnelling diodes 125 and 126 and one tunnel diode 124 make up a memory cell 129.

Figure 59A:
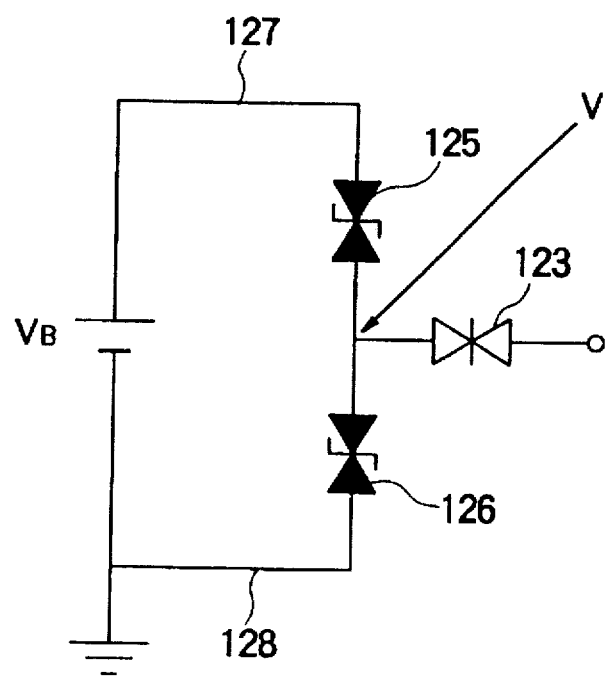
FIGS. 59(a) and 59(b) are diagrams depicting the circuit configuration and operating principle of the quantum effect memory shown in FIG. 58.
Figure 59B:
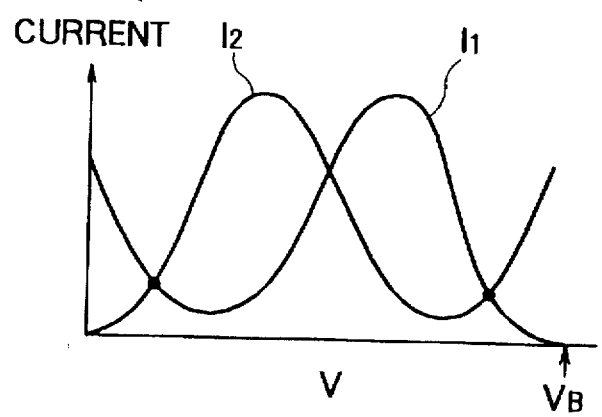

The circuit diagram of this static memory is illustrated in FIG. 59(a) and the operating principle thereof in FIG. 59(b). The resonant tunnelling diodes 125 and 126 exhibit such negative resistance characteristics that the current-voltage characteristic thereof graphically describes an N-shaped curve and the terminal voltage generated in a certain range of current is high at some times and low at other times. When the two resonant tunnelling diodes 125 and 126 are connected in series and the current supplied thereto is duly selected, either of the two resonant tunnelling diodes 125 and 126 assumes a high voltage and the other a low voltage. The static memory, therefore, is enabled to store information by using one of these two states (bistable state) as the logical value 0 and the other state as the logical value 1.

The third tunnel diode 124 is used for reading information out of and writing information into the memory cell 129. By the accumulated electric charge, the potential at the node of the three tunnel diodes assumes either a high level or a low level. By giving a selective potential to the word lines 127 and 128 and causing an ample current to flow through the write-read diode 124 to specific cells, the current writes 0 or 1 in the cell. This cell possesses the function of SRAM to store information and allow writing-reading of information and permits nondestructive reading of information to be attained without requiring such refresh as is indispensable for DRAM.

As respects the quantum effect memory element using the conventional compound semiconductor, an element using a memory cell composed of two double barrier resonant tunnelling junction and one tunnel junction has been proposed (Yokoyama et al., Solid State Technology/Japanese Edition, October 1992 issue, p 18). For the purpose of manufacturing this memory cell with a compound semiconductor, however, it is necessary to fabricate bit lines similarly with a compound semiconductor because a tunnel junction must be incorporated in the bit lines by means of epitaxial growth. As an inevitable result, the element allows high-speed operation only with difficulty because the resistance offered by the bit lines reaches a level exceeding some hundreds of μΩcm. The problem of wiring resistance gains all the more in seriousness proportionately as the degree of integration increases. In contrast to this element, the aforementioned memory cell produced with the artificial super lattice of this invention is free perfectly from the problem just mentioned because it permits use of a metallic wiring of low resistance (the resistance of TiN is about 20 μΩcm) for bit lines.

Now, a concrete example of the production of the quantum effect memory element mentioned above and the results of evaluation of the produced element will be described below. This quantum effect memory element was manufactured by the use of a composite beam film deposition device similar to the device illustrated in FIG. 37 and capable of using a low energy beam and molecular beams from a Knudsen cell and an electron beam heating vacuum deposition source under an extremely high degree of vacuum of not more than $10^{-8}$ Torr.

Figure 60:
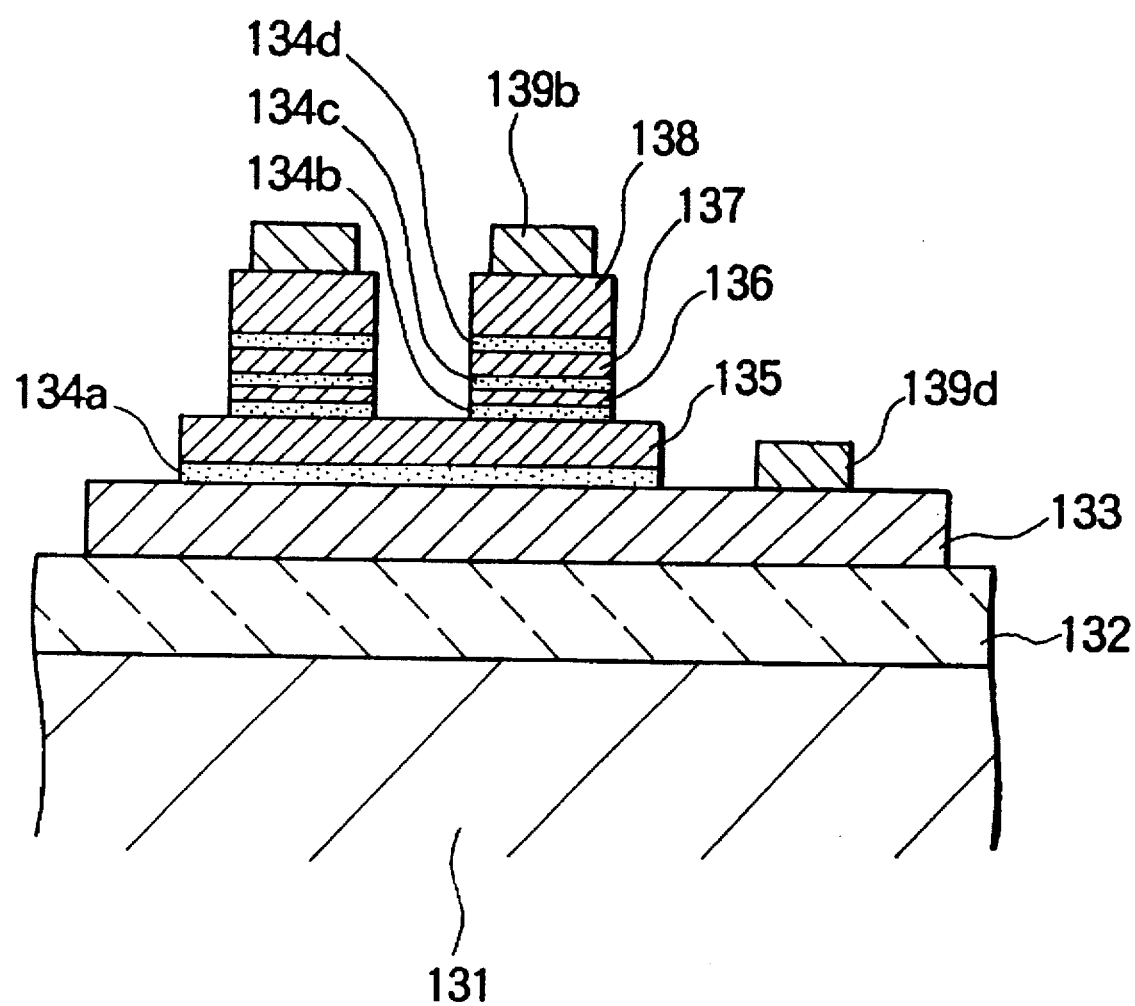
FIG. 60 is a cross section illustrating in the form of a model the construction of a quantum effect memory produced in a working example of the present invention.
Figure 61:
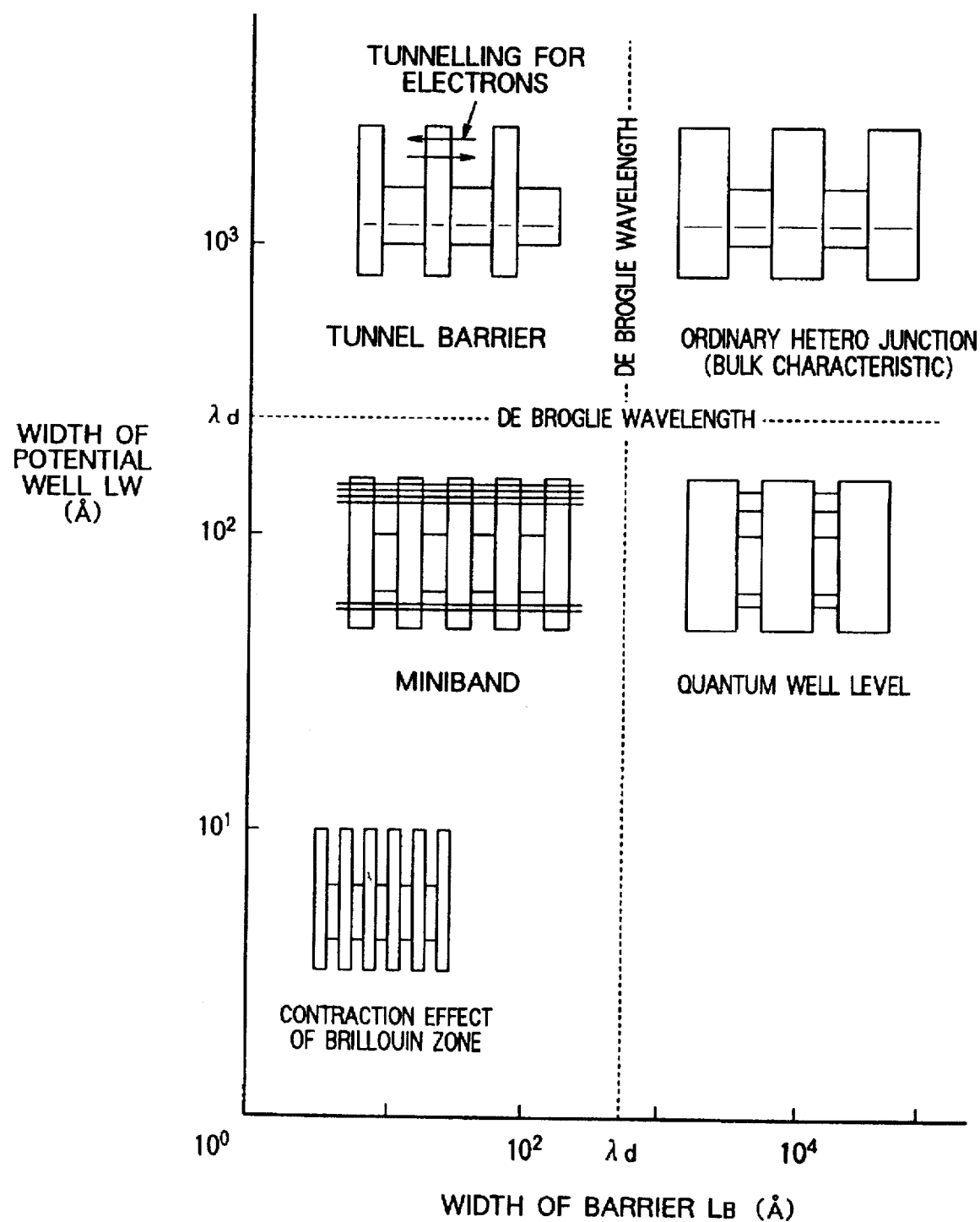
FIG. 61 is a diagram illustrating in the form of a model the quantum effect which is manifested when substances differing in energy barrier height are subjected to hereto junction.

On a Si (111) substrate 131 which had been lightly etched with dilute hydrofluoric acid, washed in deaerated and very highly deionized water, and subjected to a terminal treatment with hydrogen,an AlN epitaxial buffer layer 132 was formed in a thickness of 30 nm as illustrated in FIG. 60. On this buffer layer 132, a TiN bit line 133 (40 nm), an AlN tunnel barrier layer 134a (3.0 nm), a TiN layer 135 (50 nm), an AlN barrier layer 134b (1.5 nm), a TiN quantum well layer 136 (2.4 nm), an AlN barrier layer 134c (1.5 nm), a TiN quantum well layer 137 (2.1 nm), an AlN barrier layer 134d (1.5 nm), and a TiN word line 138 (30 nm) were formed sequentially in the order mentioned by the use of the composite beam film deposition device. Further, Al electrodes 139a and 139b were formed by vacuum deposition respectively on the bit line 133 and the word line 138.

The quantum effect memory element manufactured as described above was tested for electrical properties. In the test, a fixed voltage of 5.6 V was constantly retained between the first and second word lines and the writing of information for the logical value 1 was effected by giving a variation of +8 V to the voltage between the first word line and the bit line and the voltage between the second word line and the bit line. Similarly, the writing for the logical value 0 was effected by giving a variation of −8 V to the voltage between the first word line and the bit line and the voltage between the second word line and the bit line. For the reading of information, a variation of +4.5 V was given to the voltage between the first word line and the bit line and the voltage between the second word line and the bit line and, in the meantime, the logical value 1 was discerned when the current flowing in the bit line was not more than 5 mA and the logical value 0 when the same current was not less than 5 mA. As a result, it was confirmed that the read value was invariably 1 when the writing was made for the logical value 1 and the read value was invariably 0 when the writing was made for the logical value 0.

It is clearly noted from the working examples cited thus far that the use of an artificial super lattice where a compound of good conductivity and an insulating compound are alternately superposed on the order of a thickness of several atoms and thereby various elements such as diodes, transistors, and vacuum emitter elements which are capable of utilizing such quantum size effects as resonant tunnelling effect and electronic parts using such various elements can be realized with a wide variety of materials.

What is claimed is:

1. An electronic device comprising an artificial super lattice, said artificial super lattice having:
    a conductive substance having an electric resistance of not more than 1000 μΩcm and formed of
    either a compound between at least one element selected from the group consisting of transition metal elements belonging to Group 3A, Group 4A, Group 5A and Group 6A in the Periodic Table and rare earth elements and at least one element selected from the group consisting of boron, carbon, nitrogen, phosphorous, sulfur, selenium, and tellurium or
    a compound between at least one element selected from the group consisting of the transition metal elements belonging to Group 7A and Group 8 and oxygen and
    an insulating substance formed of
    a compound between at least one element selected from the group consisting of metal elements belonging to Group 1A, Group 2A, Group 1B, Group 2B, Group 3B and Group 4B and at least one element selected from the group consisting of carbon, nitrogen, oxygen, phosphorous, sulfur, selenium, tellurium, and halogen elements,
    wherein said artificial super lattice being formed by alternately superposing a layer of said conductive substance and a layer of said insulating substance in thickness fit for producing a quantum size effect, and is provided with a single or multiple barrier layers formed of said insulating substance and an electrode layer formed of said conductive substance and disposed in contact with said barrier layers, and
    said conductive substance and said insulating substance are compounds possessing an identical negative element.

2. An electronic device according to claim 1, wherein said artificial super lattice is possessed of a crystalline film of said substance of good conductivity and crystalline film of said insulating substance.

3. An electronic device according to claim 1, wherein the difference between the ionicity of said conductive substance and the ionicity of said insulating substance is not more than 0.3.

4. An electronic device according to claim 1, wherein said insulating substance possesses a compound whose energy gap is not less than 1 eV.

5. An electronic device according to claim 1, wherein said conductive substance possesses a compound whose electric resistance is not more than 100 μΩcm and said insulating substance possesses a compound whose energy gap is not less than 3 eV.

6. An electronic device according to claim 1, wherein said artificial super lattice possesses two or more barrier layers and a quantum well layer disposed between said barrier layers and made of said conductive substance.

7. An electronic device according to claim 1, wherein said artificial super lattice possesses at least two barrier layers and a quantum well electrode layer interposed between said barrier layers and made of said conductive substance.

8. An electronic device comprising an artificial super lattice, said artificial super lattice having:
    a conductive crystal having an electric resistance of not more than 1000 μΩcm and formed of
    either a compound between at least one element selected from the group consisting of the transition metal elements belonging to Group 3A, Group 4A, Group 5A and Group 6A in the Periodic Table and the rare earth elements and at least one element selected from the group consisting of boron, carbon, nitrogen, phosphorous, sulfur, selenium, and tellurium or
    a compound between at least one element selected from the group consisting of the transition metal elements belonging to Group 7A and Group 8 and oxygen and
    an insulating crystal formed of
    a compound between at least one element selected from the group consisting of metal elements belonging to Group 1A, Group 2A, Group 1B, Group 2B, Group 3B and Group 4B and at least one element selected from the group consisting of carbon, nitrogen, oxygen, phosphorous, sulfur, selenium, tellurium, and halogen elements,
    wherein said artificial super lattice is formed by alternately superposing a layer of said conductive crystal and a layer of said insulating substance in coinciding crystal orientations in thickness fit for producing a quantum size effect, and is provided with a single or multiple barrier layers formed of said insulating substance and an electrode layer formed of said conductive crystal and disposed in contact with said barrier layers, and said conductive crystal and said insulating crystal are compounds possessing an identical negative element.

9. An electric device according to claim 11, wherein the difference between the ionicity of said conductive crystal and the ionicity of said insulating crystal is not more than 0.3.

10. An electronic device according to claim 8, wherein the lattice shapes in the surface of hetero growth of said conductive crystal and said insulating crystal agree at a low order and the lattice intervals thereof agree with the amount of misfit strain at or below about 5%.

11. An electronic part according to claim 8, wherein a substrate on which said artificial super lattice is formed is provided on the surface thereof with a buffer layer capable of alleviating the lattice strain between said artificial super lattice and said substrate.

12. An electronic part according to claim 8, wherein said insulating crystal possess a compound whose energy gap is not less than 1 eV.

13. An electronic device according to claim 8, wherein said conductive crystal possess a compound whose electric conductivity is not more than 100 $\mu\Omega$cm and said insulating crystal possess a compound whose energy gap is not less than 3 eV.

14. An electronic device according to claim 8, wherein said artificial super lattice possesses at least two barrier layers and a quantum well layer interposed between said barrier layers and made of said conductive crystal.

15. An electronic device according to claim 8, wherein said artificial super lattice possesses at least two barrier layers and a quantum well electrode layer interposed between said barrier layers and made of said conductive crystal.

16. An electronic device according to claim 1, wherein the compound forming the conductive substance is a compound selected from the group consisting of TiC, ZrC, HfC and NbC, and the compound forming the insulating substance is SiC.

17. An electronic device comprising an artificial super lattice, said artificial super lattice having:

a conductive substance having an electric resistance of not more than 1000 $\mu\Omega$m and formed of a compound between at least one element selected from the group consisting of Ti and V, and nitrogen; and an insulating substance formed of a compound between at least one element selected from the group consisting of Al and Ga, and nitrogen, wherein said artificial super lattice is formed by alternately superposing a layer of said conductive crystal and a layer of said insulating substance in coinciding crystal orientations in thickness fit for producing a quantum size effect, and is provided with a single or multiple barrier layers formed of said insulating crystal and an electrode layer formed of said conductive crystal and disposed in contact with said barrier layers.

18. An electronic device comprising an artificial super lattice, said artificial super lattice having:

a conductive substance having an electric resistance of not more than 100 $\mu\Omega$ and formed of at least one compound selected from the group consisting of oxides of Re, Ru, Os, Rh, Ir, Pd, and Pt, chalcogenides of Sc, Y, Ti, Zr, Hf, V, Nb, Ta, Cr, Mo, W, Mn, Tc, Re, Fe, Ru, Os, Co, Rh, Ir, Ni, Pd, Pt, Lanthanoid series elements, and Actinium series elements, nitrides of Sc, Y, Ti, Zr, Hf, V, Nb, Ta, Cr, Mo, W, Mn, Tc, Re, Fe, Ru, Os, Co, Rh, Ir, Ni, Pd, Pt, Lanthanoid series elements, and Actinium series elements, carbides of Sc, Y, Ti, Zr, Hf, V, Nb, Ta, Cr, Mo, W, Mn, Tc, Re, Fe, Ru, Os, Co, Rh, Ir, Ni, Pd, Pt, Lanthanoid series elements, and Actinium series elements, borides of Sc, Y, La, Ce, Pr, Nd, Eu, Gd, Tb, Yb, Th, Ti, Zr, Hf, V, Nb, Ta, Cr, Mo, and W, and an insulating substance having an energy gap of not less than 3 eV and formed of at least one compound selected from the group consisting of oxides of Li, Na, K, Rb, Cs, Fr, Be, Mg, Ca, Sr, Ba, Ra, Cu, Ag, Au, Zn, Cd, Hg, Al, Ga, In, Tl, Si, Ge, Sn, and Pb, chalcogenides of Li, Na, K, Rb, Cs, Fr, Be, Mg, Ca, Sr, Ba, Ra, Cu, Ag, Au, Zn, Cd, Hg, B, Al, Ga, In, Tl, Si, Ge, Sn, and Pb, nitrides of Li, Na, K, Rb, Cs, Fr, Be, Mg, Ca, Sr, Ba, Ra, Cu, Ag, Au, Zn, Cd, Hg, B, Al, Ga, In, Tl, Si, Ge, Sn, and Pb, and carbides of Li, Na, K, Rb, Cs, Fr, Be, Mg, Ca, Sr, Ba, Ra, Cu, Ag, Au, Zn, Cd, Hg, B, Al, Ga, In, Tl, Si, Ge, Sn, and Pb, wherein said artificial super lattice is formed by alternately superposing a layer of said conductive substance and a layer of said insulating substance in thickness fit for producing a quantum size effect, and is provided with a single or multiple barrier layers formed of said insulating substance and an electrode layer formed of said conductive substance and disposed in contact with said barrier layers.

19. The electronic device according to claim 18, wherein said conductive substance is at least one compound selected from the group consisting of nitrides of Ti, V, and Nb, and wherein said insulating substance is at least one compound selected from the group consisting of nitrides of B, Al, Ga, and Si.

20. The electronic device according to claim 18, wherein said conductive substance is at least one compound selected from the group consisting of carbides of Ti, Zr, Hf, Nb, Ta, and W, and wherein said insulating substance is a carbide of Si.

21. The electronic device according to claim 1, wherein said conductive substance is at least one compound selected from the group consisting of oxides of Re, Ru, Os, Rh, and Ir, and wherein said insulating substance is at least one compound selected from the group consisting of oxides of Be, Mg, Ba, Al, and Si.

22. The electronic device according to claim 1, wherein said conductive substance is at least one compound selected from the group consisting of chalcogenides of La and Pr, and wherein said insulating substance is chalcogenides of Zn.

* * * * *

UNITED STATES PATENT AND TRADEMARK OFFICE
CERTIFICATE OF CORRECTION

PATENT NO. : 5,682,041
DATED : October 28, 1997
INVENTOR(S) : Takashi KAWAKUBO et al.

It is certified that error appears in the above-identified patent and that said Letters Patent is hereby corrected as shown below:

Claim 9, column 37, line 10, "claim 11" should read --claim 8--.

Claim 11, column 37, line 19, "part" should read --device--.

Claim 12, column 37, line 24, "part" should read --device--.

Signed and Sealed this

Seventeenth Day of November, 1998

Attest:

BRUCE LEHMAN

*Attesting Officer*    *Commissioner of Patents and Trademarks*